United States Patent
Tsunoda et al.

(10) Patent No.: US 6,740,938 B2
(45) Date of Patent: May 25, 2004

(54) TRANSISTOR PROVIDED WITH FIRST AND SECOND GATE ELECTRODES WITH CHANNEL REGION THEREBETWEEN

(75) Inventors: Akira Tsunoda, Atsugi (JP); Shunpei Yamazaki, Atsugi (JP); Jun Koyama, Atsugi (JP); Mai Osada, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/119,038

(22) Filed: Apr. 10, 2002

(65) Prior Publication Data

US 2002/0149053 A1 Oct. 17, 2002

(30) Foreign Application Priority Data

Apr. 16, 2001 (JP) .................. 2001-116307

(51) Int. Cl.[7] .................. H01L 29/76; H01L 29/94; H01L 31/062; H01L 31/113; H01L 31/119

(52) U.S. Cl. .................. 257/365; 257/352; 257/353; 257/366

(58) Field of Search .................. 257/347, 352, 257/353, 365, 366

(56) References Cited

U.S. PATENT DOCUMENTS

| | | | | |
|---|---|---|---|---|
| 4,748,485 A | * | 5/1988 | Vasudev | 257/353 |
| 5,079,606 A | * | 1/1992 | Yamamura et al. | 257/365 |
| 5,140,391 A | * | 8/1992 | Hayashi et al. | 257/365 |
| 5,188,973 A | * | 2/1993 | Omura et al. | 438/157 |
| 5,616,944 A | * | 4/1997 | Mizutani et al. | 257/365 |
| 5,643,826 A | | 7/1997 | Ohtani et al. | |
| 5,644,147 A | | 7/1997 | Yamazaki et al. | |
| 5,801,397 A | * | 9/1998 | Cunningham | 257/66 |
| 5,808,595 A | * | 9/1998 | Kubota et al. | 345/92 |
| 5,818,070 A | | 10/1998 | Yamazaki et al. | |
| 5,923,962 A | | 7/1999 | Ohtani et al. | |
| 6,198,133 B1 | * | 3/2001 | Yamazaki et al. | 257/347 |
| 6,252,248 B1 | | 6/2001 | Sano et al. | |
| 6,326,642 B1 | | 12/2001 | Yamazaki et al. | |
| 6,327,006 B1 | | 12/2001 | Sato et al. | |
| 6,342,717 B1 | * | 1/2002 | Komatsu | 257/347 |
| 6,383,904 B1 | * | 5/2002 | Yu | 438/589 |
| 6,504,173 B2 | * | 1/2003 | Hsu et al. | 257/60 |

FOREIGN PATENT DOCUMENTS

| | | |
|---|---|---|
| JP | 63-208896 | 8/1988 |
| JP | 01-059866 | 3/1989 |
| JP | 07-130652 | 5/1995 |
| JP | 08-78329 | 3/1996 |
| JP | 2737780 | 1/1998 |
| JP | 10-135468 | 5/1998 |
| JP | 10-135469 | 5/1998 |
| JP | 11-354802 | 12/1999 |
| JP | 2000-131716 | 5/2000 |

\* cited by examiner

*Primary Examiner*—Ngân V. Ngô
(74) *Attorney, Agent, or Firm*—Eric J. Robinson; Robinson Intellectual Property Law Office, P.C.

(57) ABSTRACT

This invention is intended to provide a technique for improving characteristics of a TFT and realizing a structure of the TFT optimum for driving conditions of a pixel section and a driving circuit by using a small number of photomasks. The TFT includes a first electrode, a first insulating film put between a semiconductor film and the first electrode, a second electrode, and a second insulating film put between the semiconductor film and the second electrode. The first electrode and the second electrode are overlapped with each other, with a channel formation region of the semiconductor film put between the first electrode and the second electrode, and a constant voltage is always applied to the first electrode.

10 Claims, 38 Drawing Sheets

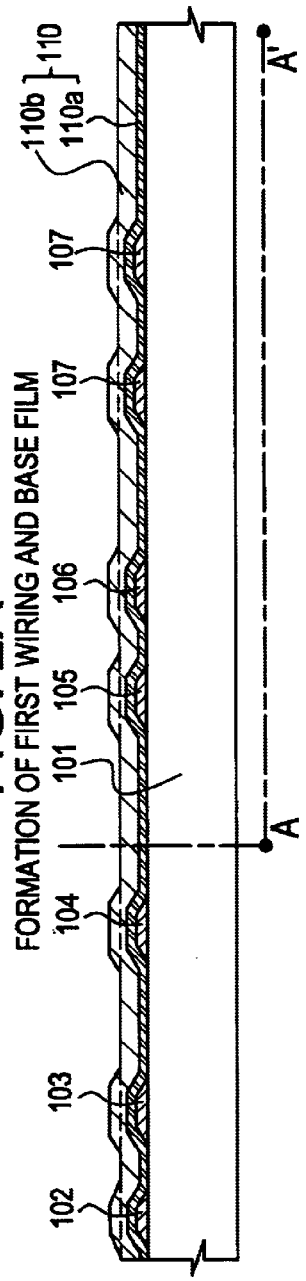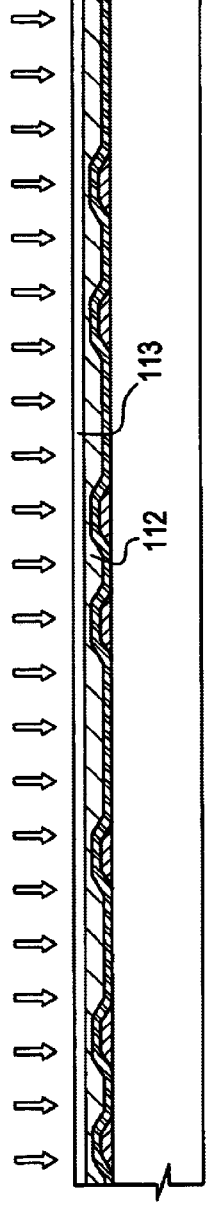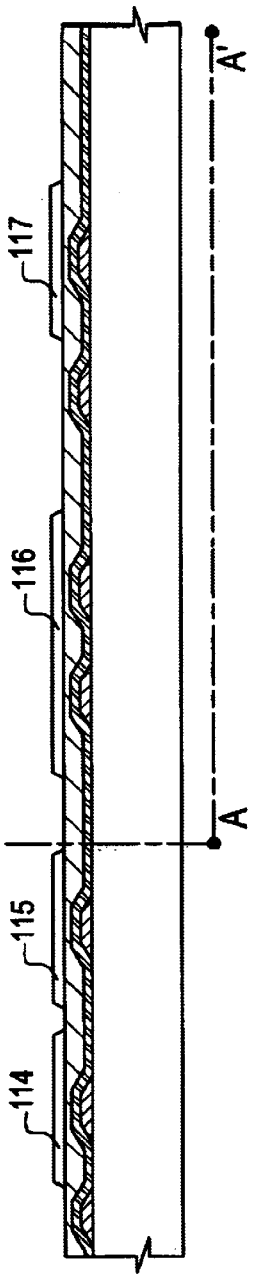

FORMATION OF GATE INSULATING FILM AND CONDUCTIVE FILM AND SECOND WIRING PATTERN

FIRST ETCHING TREATMENT AND FIRST DOPING TREATMENT

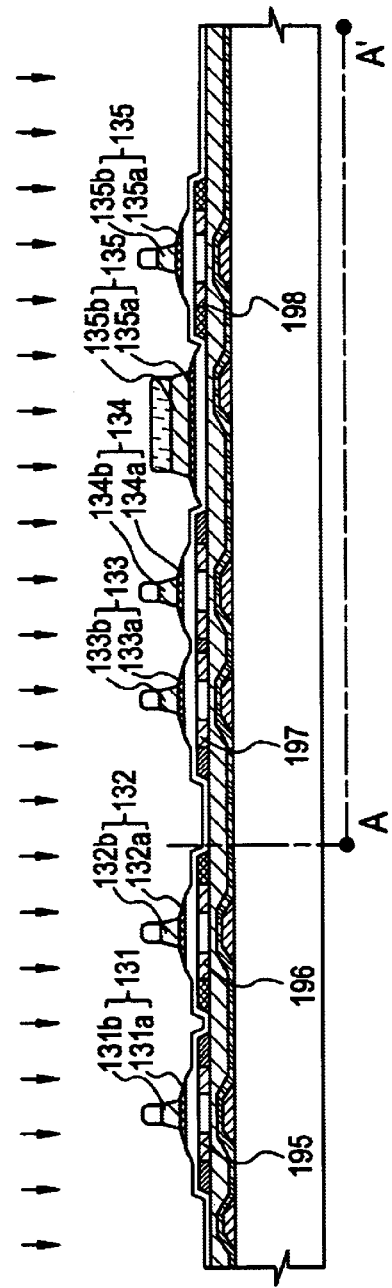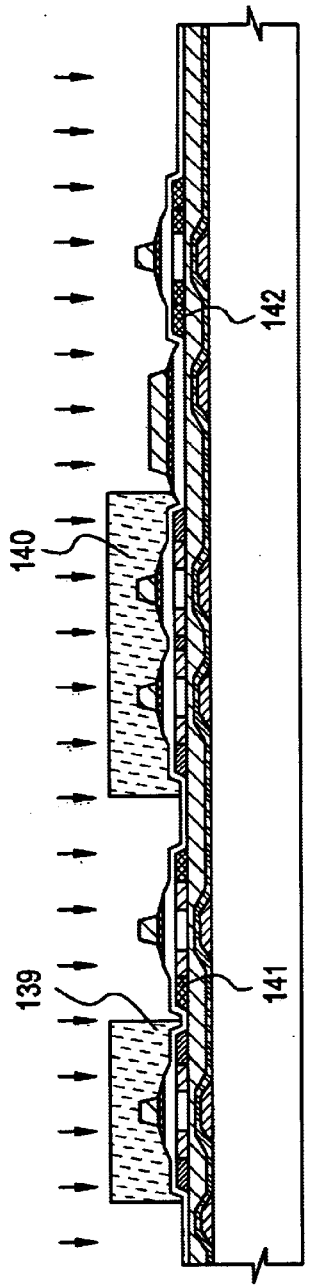

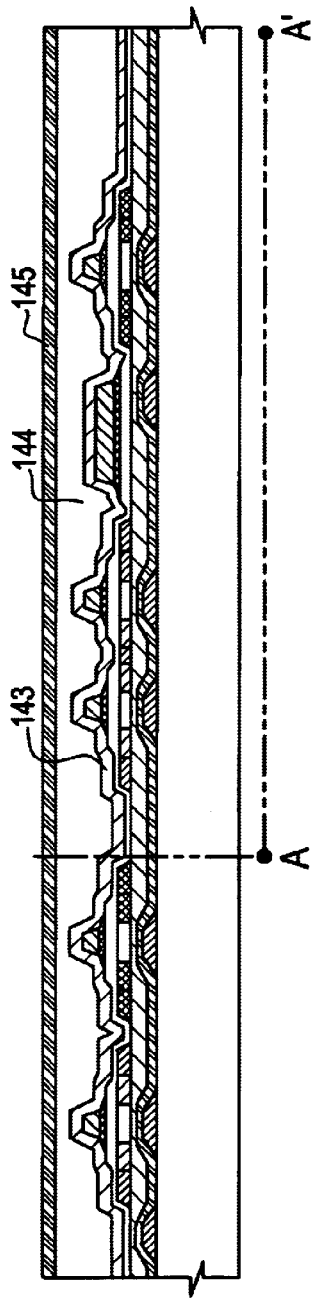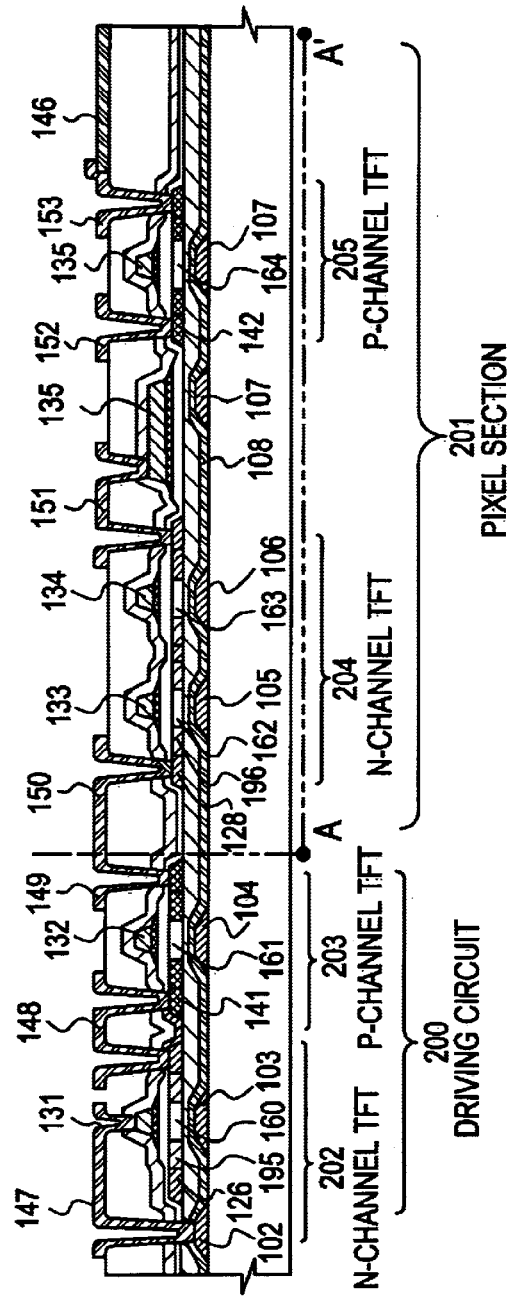
FIG. 5A
FORMATION OF INTERLAYER INSULATING FILM (AND PLANARIZATION TREATMENT) AND FORMATION OF TRANSPARENT CONDUCTIVE FILM
FIG. 5B
FORMATION OF CONTACT HOLE AND FORMATION OF THIRD WIRING

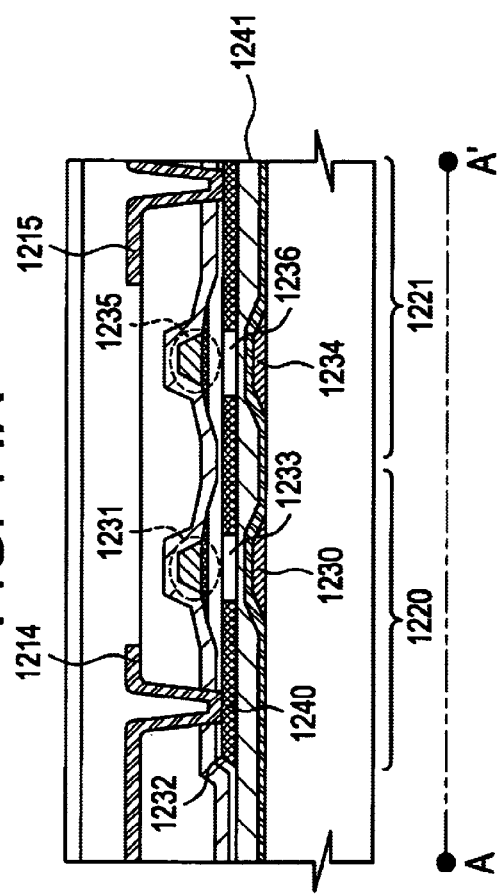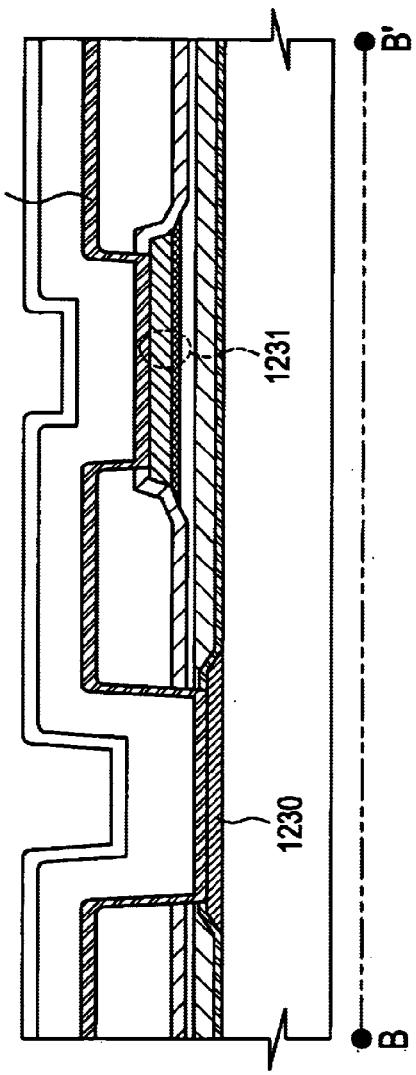

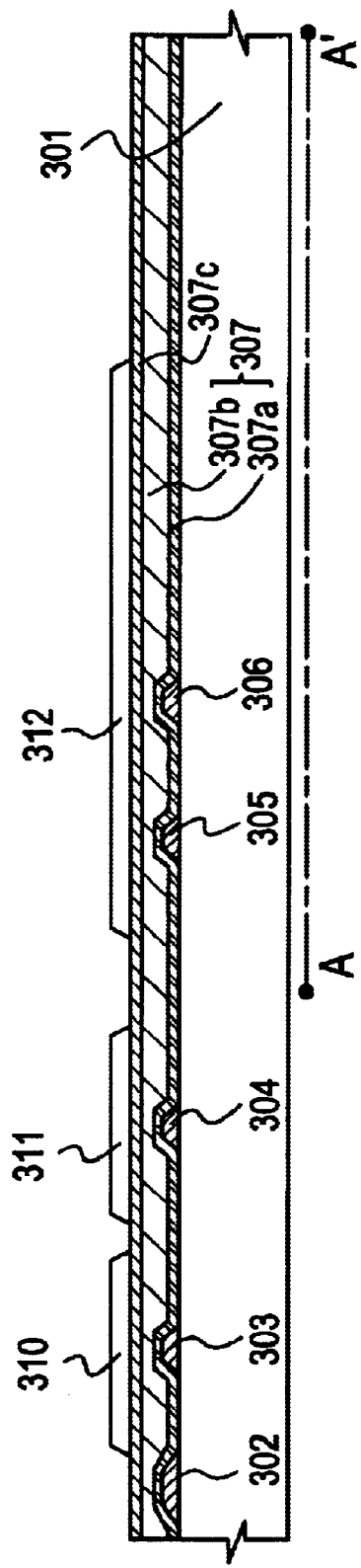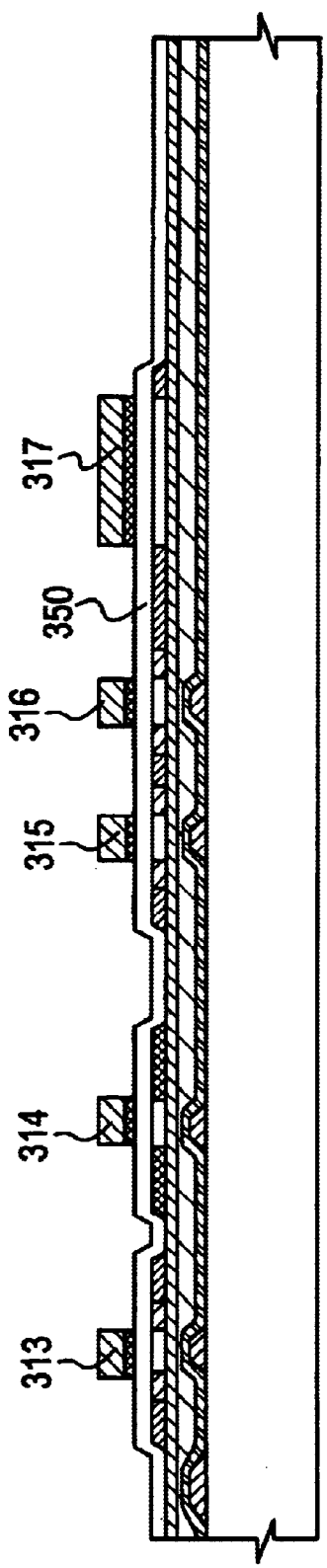
FIG. 15A
FIG. 15B

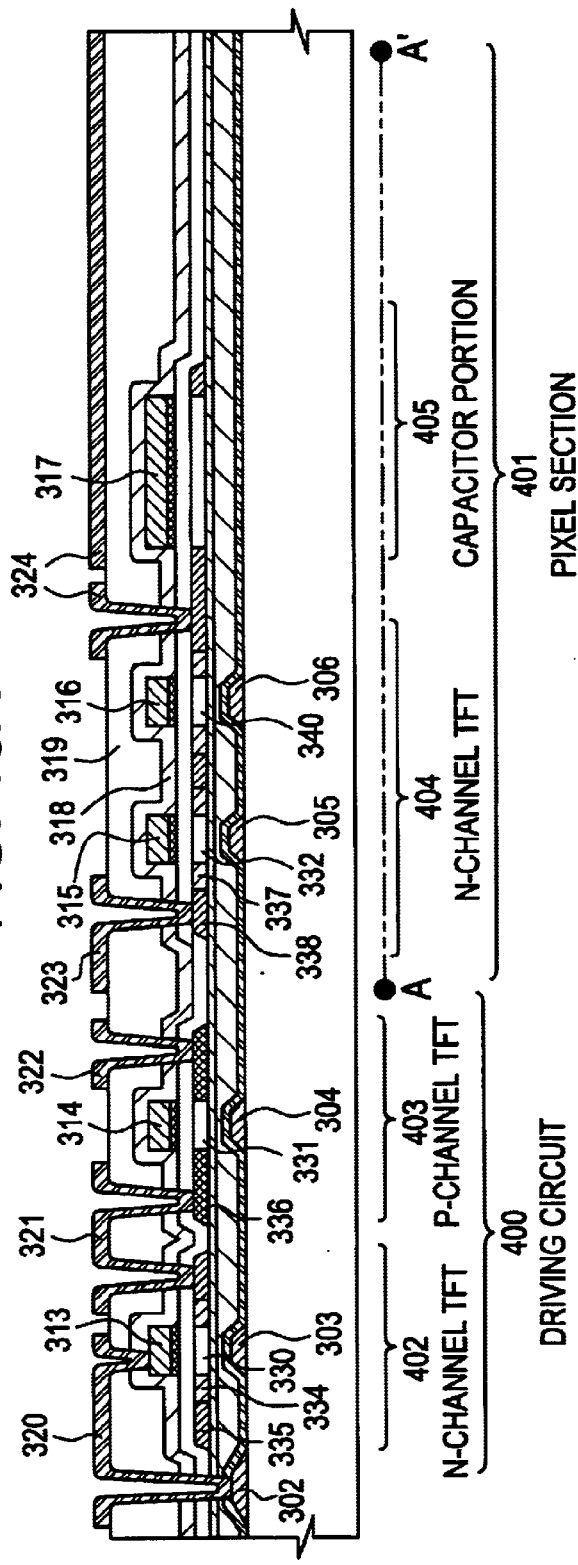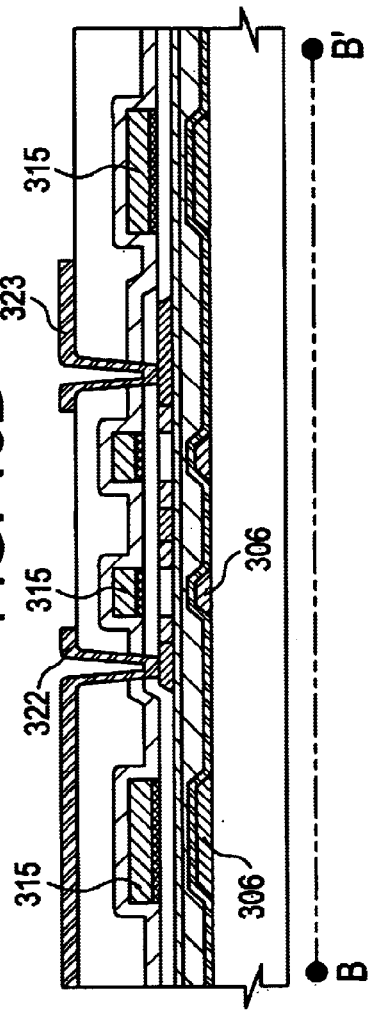

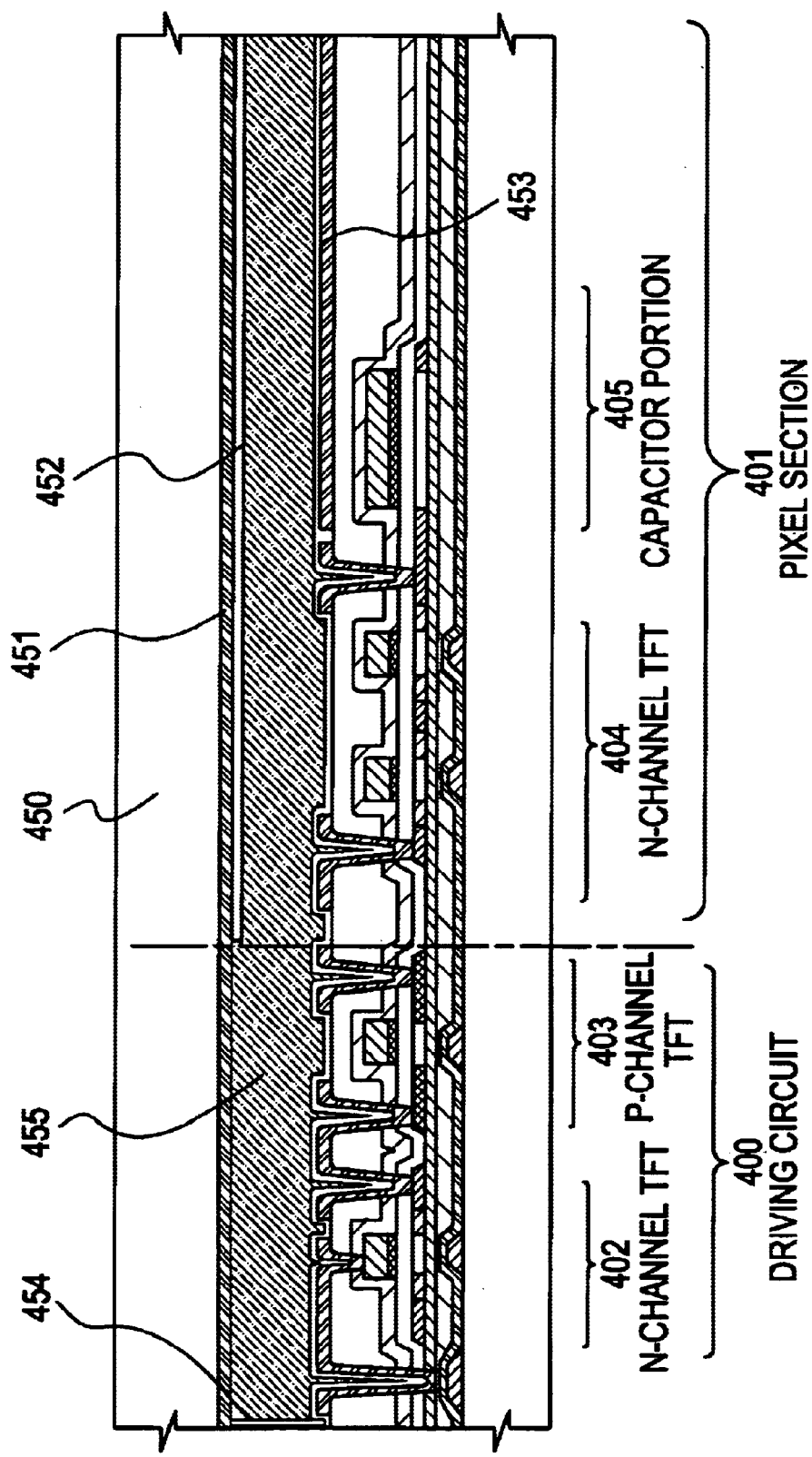

FIG. 20A  FORMATION OF FIRST SEMICONDUCTOR FILM
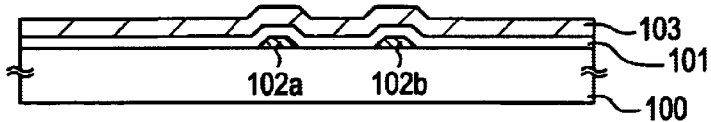
FIG. 20B  ADDITION OF METAL ELEMENT
FIG. 20C  HEAT TREATMENT
FIG. 20D  IRRADIATION OF LASER LIGHT (ATMOSPHERE OR OXYGEN ATMOSPHERE)
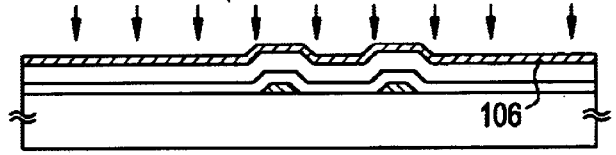
FIG. 20E  FORMATION OF SECOND SEMICONDUCTOR FILM CONTAINING RARE GAS ELEMENT AND FORMATION OF BARRIER LAYER
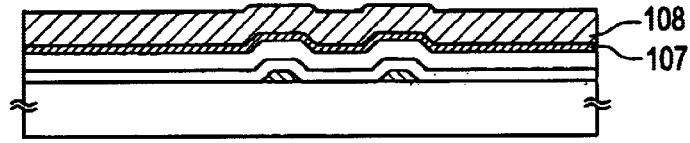
FIG. 20F  GETTERING
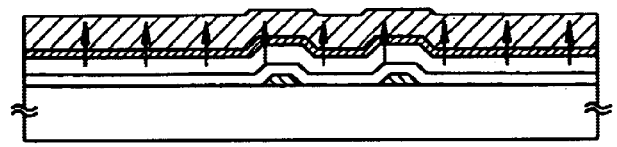
FIG. 20G  IRRADIATION OF LASER LIGHT (NITROGEN ATMOSPHERE OR VACUUM)
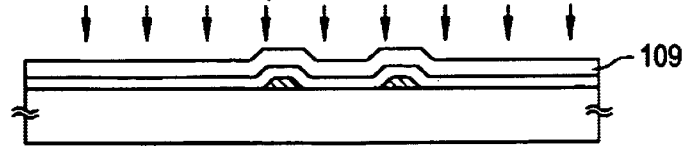

SIMULATION MODEL

SIMULATION MODEL

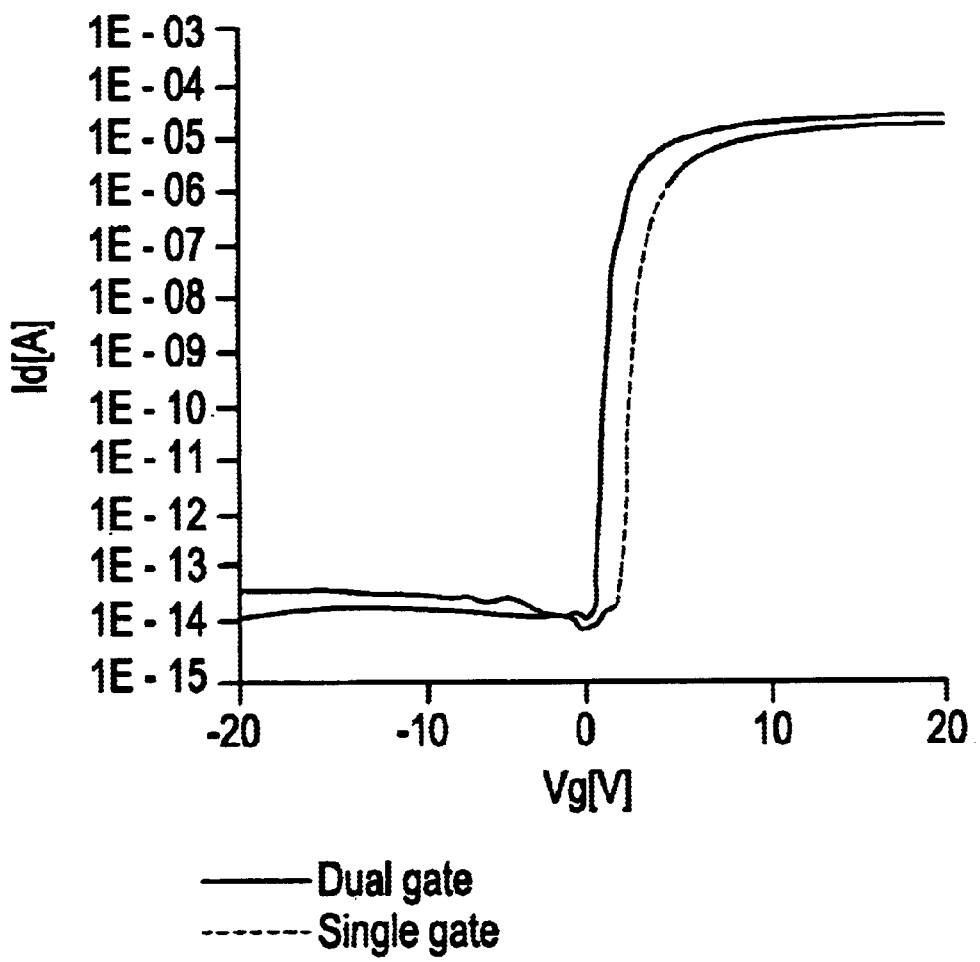

FORMATION OF FIRST SEMICONDUCTOR FILM

IRRADIATION OF LASER LIGHT (ATMOSPHERE OR OXYGEN ATMOSPHERE)

IRRADIATION OF LASER LIGHT (NITROGEN ATMOSPHERE OR VACUUM)

TRANSISTOR PROVIDED WITH FIRST AND SECOND GATE ELECTRODES WITH CHANNEL REGION THEREBETWEEN

BACKGROUND OF THE INVENTION

1. Field of the Invention

The present invention relates to a semiconductor device using a thin film transistor (hereinafter referred to as a TFT) wherein a semiconductor film formed on a substrate and having a crystal structure is used; and a process for manufacturing the same. The semiconductor device in the present specification means any device which functions by the use of a semiconductor characteristic, and the category of the semiconductor device manufactured by the present invention includes a display device, a typical example of which is a liquid crystal display device having therein TFT's, and a semiconductor integrated circuit (such as a microprocessor, a signal processing circuit, or a high frequency circuit).

2. Description of Related Art

In various semiconductor devices having therein semiconductor elements, such as a television, a personal computer or a portable telephone, a display for displaying characters or images is an essential means from which people recognize information. Particularly in recent years, a planar display (flat panel display), a typical example of which is a liquid crystal display device using the electro-optic property of liquid crystal, has been actively used.

As one form of the flat panel display, there is known an active matrix driving system wherein a TFT is fitted to each pixel and a picture is displayed by writing data signals successively. TFT's are essential elements for realizing the active matrix driving system.

In almost all cases, TFT's are manufactured using amorphous silicon. However, TFT's have low electric field effect mobility and cannot be operated by frequencies necessary for processing picture signals. Therefore, TFT's are used only as switching elements fitted to respective pixels. A data line driving circuit for outputting picture signals to data lines or a scanning line driving circuit for outputting scanning signals to scanning lines is processed by an outside IC (IC driver) mounted by TAB (tape automated bonding) or COG (chip on glass).

However, as the density of pixels becomes larger, the pitch of the pixels becomes narrower; therefore, it is considered that the system in which a driver IC is mounted has a limit. For example, in the case that UXGA (pixel number: 1200×1600) is supposed, 6000 connecting terminals are required in an RGB coloring system at the simplest estimate. An increase in the number of the connecting terminals causes an increase in the probability that contact faults are generated. Moreover, the peripheral area (frame area) of its pixel section increases. As a result, it is unsuccessful that a semiconductor device using this as a display is made small-sized, and the design of the appearance thereof is damaged. In light of such background, a display device integrated with a driving circuit is clearly demanded. By integrating a pixel section with scanning line and data line driving circuits on a single substrate, the number of connecting terminals decreases drastically and the area of the frame area can also be made small.

As a means for realizing the above, suggested is a method of making TFT's of a polycrystal silicon film. However, even if polycrystal silicon is used to form TFT's, after all, the electric properties thereof are not equivalent to the properties of MOS transistors formed in a monocrystal silicon substrate. For example, the electric field effect mobility thereof is not more than $\frac{1}{10}$ of that of monocrystal silicon. This method has a problem that off-state current is large because of defects formed in boundaries between crystal grains.

However, for a data line driving circuit, high driving ability (on-state current, $I_{on}$) is required and an improvement in the reliability thereof is also required by preventing deterioration based on hot carrier effect. In addition, for a pixel section, low off-state current ($I_{off}$) is required.

As a TFT structure for reducing the off-state current, a lightly doped drain (LDD) structure is known. This structure is a structure wherein an LDD region, to which an impurity element is added at a low concentration, is arranged between a channel formed region and a source region or a drain region formed by the addition of an impurity element at a high concentration. As a structure effective for preventing deterioration of the on-state current based on hot carries, there is known an LDD structure wherein a gate electrode is overlapped with some portions of an LDD area (hereinafter, the gate-drain overlapped LDD is abbreviated to the GOLD).

A TFT is manufactured by layering semiconductor films or conductive films while etching the films into predetermined shapes using photomasks. However, if the structure of the TFT is optimized to obtain characteristics required for a pixel section or each driving circuit, the number of photomasks increases, the manufacturing process is complicated and the number of steps disadvantageously, inevitably increases.

SUMMARY OF THE INVENTION

It is an object of the present invention to provide a technique capable of improving the characteristic of a TFT and realizing a TFT of an optimum structure for the driving conditions of a pixel section or a driving circuit using a small number of photomasks.

To obtain the above object, a thin film transistor of a semiconductor device according to the present invention includes a semiconductor film, a first electrode, and a first insulating film put between the semiconductor film and the first electrode, and also includes a second electrode, and a second insulating film put between the semiconductor film and the second electrode. The first electrode and the second electrode are overlapped with each other, with a channel formation region of the semiconductor film put between them.

In addition, according to the present invention, in the case of a TFT in which the decrease of OFF current is regarded more important than the increase of ON current, e.g., a TFT which is formed as a switching element in the pixel section of the semiconductor device, a constant voltage (common voltage) is applied to the first electrode. This constant voltage is set lower than threshold voltage in the case of an n-channel type TFT and set higher than threshold voltage in the case of a p-channel type TFT.

By applying the common voltage to the first electrode, it is possible to suppress threshold irregularity and to suppress OFF current compared with the TFT which includes only one electrode.

Further, according to the present invention, in the case of a TFT in which the increase of ON current is regarded more important than the decrease of ON current, e.g., a TFT which is included in the buffer or the like of the driving circuit of the semiconductor device, the same voltage is applied to the first and second electrodes.

In the specification, the driving circuit means a circuit which generates signals for displaying images on a pixel section. A data line driving circuit and a scanning line driving circuit are, therefore, driving circuits.

By applying the same voltage to the first and second electrodes, the spread of a depleted layer is accelerated substantially as in the case of making the semiconductor film thin and it is, therefore, possible to lower the sub-threshold coefficient of the TFT and to improve the field effect mobility of the TFT. Accordingly, compared with a TFT which includes only one electrode, ON current can be increased. It is thereby possible to decrease driving voltage by using the TFT having this structure in the driving circuit. In addition, since ON current can be increased, the TFT can be made small in size (the channel width thereof can be particularly made small). It is thereby possible to improve the integration density of the TFT. Besides, it is possible to suppress interface scattering and to increase transconductance (gm).

The circuit diagram of the thin film transistor of the present invention will be described with reference to FIGS. 31A, 31B and 31C. In FIGS. 31A, 31B and 31C, only p-channel type TFT is typically shown. An n-channel type TFT is opposite in arrow direction to the p-channel type TFT. FIG. 31A is a circuit diagram of an ordinary TFT which includes only one electrode. FIG. 31B is a circuit diagram of a TFT according to the present invention wherein two electrodes are provided with a semiconductor film put therebetween, and a constant voltage (ground voltage in this case) is applied to one of the two electrodes. FIG. 31C is a circuit diagram of a TFT according to the present invention wherein two electrodes are provided with a semiconductor film put therebetween and the two electrodes are electrically connected to each other. In this specification, the present invention will be described with reference to the circuit diagrams shown in FIGS. 31A, 31B and 31C.

BRIEF DESCRIPTION OF THE DRAWINGS

FIGS. 2A to 2C are cross-sectional views for explaining the manufacturing steps of a driving circuit and a pixel section in a luminous device;

FIGS. 4A and 4B are cross-sectional views for explaining the manufacturing steps of the driving circuit and the pixel section in the luminous device;

FIGS. 5A and 5B are cross-sectional views for explaining the manufacturing steps of the driving circuit and the pixel section in the luminous device;

FIGS. 14A and 14B are cross-sectional views of the flip-flop circuit;

FIGS. 15A and 15B are cross-sectional views for explaining the manufacturing steps of a driving circuit and a pixel section in a liquid crystal display device;

FIGS. 16A and 16B are cross-sectional views for explaining the manufacturing steps of the driving circuit and the pixel section in the liquid crystal display device;

FIG. 17 is a cross-sectional view for explaining the configuration of the liquid crystal display device;

FIGS. 20A to 20G show semiconductor layer crystallization steps;

FIG. 29 is a graph showing the characteristics of the TFT obtained by the simulations;

FIGS. 37C and 37D are a top view of the ordinary TFT for which the measured values are obtained as shown in FIG. 34 and a cross-sectional view thereof, respectively.

DESCRIPTION OF THE PREFERRED EMBODIMENTS

Figure 1A:
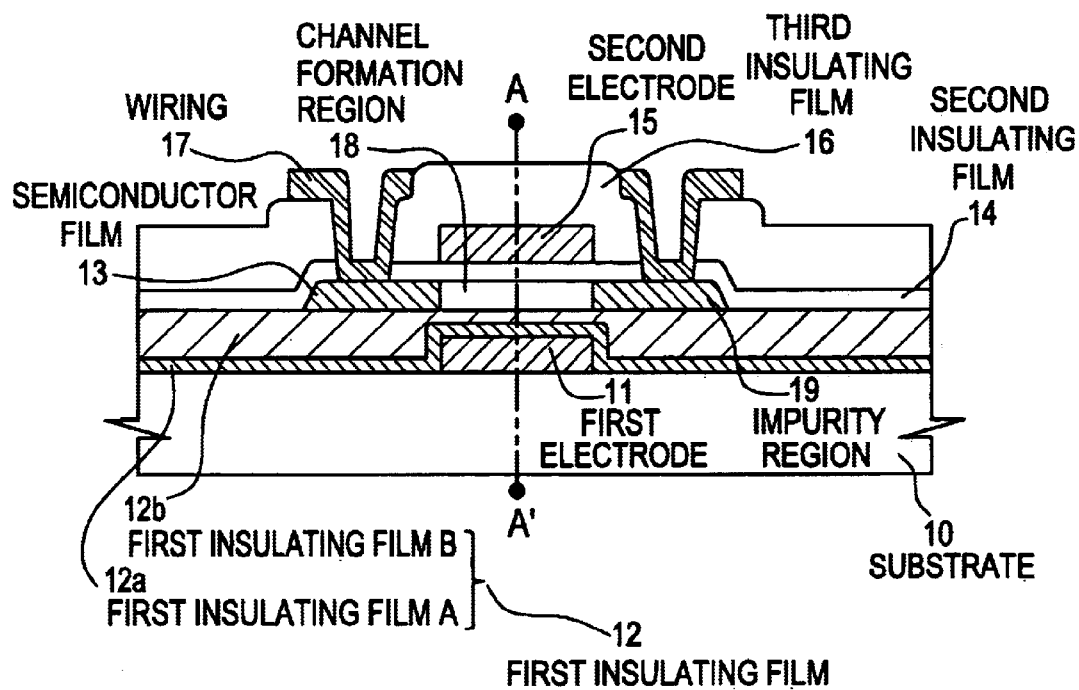
FIGS. 1A to 1C are cross-sectional views for explaining the structure of a TFT according to the present invention.

The embodiments of the present invention will be described with reference to FIGS. 1A to 1B. In FIG. 1A, a first electrode 11 is formed on a substrate 10 which has an insulating surface. The first electrode 11 may be formed out of a conductive material. The first electrode 11 can be typically formed out of alloy or a compound containing one or a plurality of types of elements selected from a group consisting of aluminum (Al), tungsten (W), molybdenum (Mo), tantalum (Ta) and titanium (Ti). Alternatively, the first electrode 11 may have a layered structure in which a plurality of conductive films are layered. The first electrode 11 has a thickness of 150 to 400 nm.

A first insulating film 12 is formed to cover the first electrode 11. In the embodiments, a layered film consisting of two insulating films (a first insulating film A 12a and a first insulating film B 12b) is used as the first insulating film 12. In FIGS. 1A, 1B and 1C, a silicon oxide nitride film or a silicon nitride film having a thickness of 10 to 50 nm is formed as the first insulating film A 12a. As the first insulating film B 12b, a silicon oxide nitride film or a silicon oxide film is formed to have a thickness of 0.5 to 1 μm. If the silicon oxide nitride film is used, a film which is manufactured using mixture gas of $SiH_4$, $NH_3$ and $N_2O$ by a plasma CVD method and which contains 20 to 40 atom % nitrogen is applied thereto. By using the nitrogen containing insulating film such as the silicon oxide nitride film stated above or a silicon nitride film, it is possible to prevent impurities such as alkali metal from being diffused from the substrate 10 side.

The surface of the first insulating film 12 often has irregularities resulting from the first electrode 11 formed prior to the first insulating film 12. The irregularities are flattened by polishing the surface of the first insulating film 12. As a planarization method, a chemical-mechanical polishing (to be referred to as "UCMP" hereinafter) method may be mentioned. As an abrasive material (slurry) for the CMP applied to the first insulating film 12, a KOH-added aqueous solution into which foamed silica particles obtained by thermally decomposing silicon chloride are dispersed may be used. By the CMP, the first insulating film 12 is removed by a thickness of about 0.1 to 0.5 μm to flatten the surface thereof. The surface of the first insulating film 12 is not necessarily polished. The difference in level among the irregularities on the surface of the first insulating film 12 thus flattened is preferably not larger than 5 nm, more preferably not larger than 1 nm. As a result of the improved flatness of the first insulating film 12, it is possible to decrease OFF current in the manufacturing of the TFT.

A semiconductor film 13 is formed on the first insulating film 12, the surface of which is thus flattened. The semiconductor film 13 includes a channel formation region 18 and impurity regions 19 between which the channel formation region 18 is put. A second insulating film 14 is formed on the semiconductor film 13. Further, a second electrode 15 is formed on the semiconductor film 13 with the second insulating film 14 put between the second electrode 15 and the semiconductor region 13.

The first electrode 11 and the second electrode 15 are overlapped with each other with the channel formation region 18 put therebetween.

A third insulating film 16 and a wiring 17 are formed if necessary.

The first electrode 11 and the second electrode 15 may be electrically connected to each other or a common voltage may be applied to one of the first and second electrodes 11 and 15.

Figure 1B:
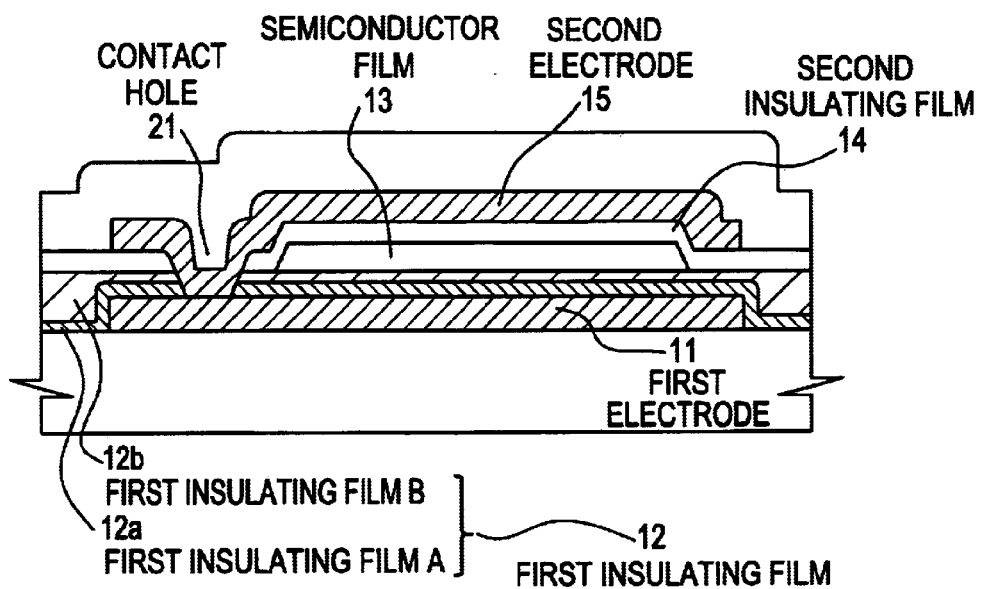
Figure 1C:
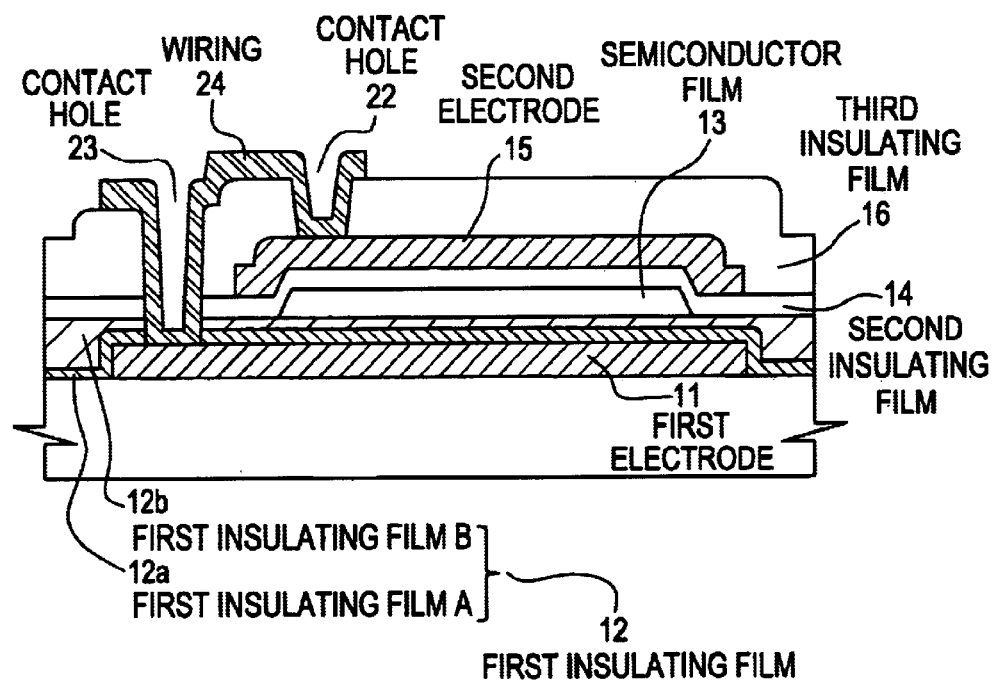

FIG. 1B shows a cross section taken along line A–A' of FIG. 1A in a case where the first electrode 11 is directly connected to the second electrode 15.

As shown in, FIG. 1B, the first electrode 11 is connected to the second electrode 15 outside of the semiconductor film 13 through a contact hole 21 which is formed in the first insulating film 12b and the second insulating film 14.

FIG. 1C shows a cross section taken along line A–A' of FIG. 1A in a case where the first electrode 11 is connected to the second electrode 15 by a wiring 24 which is formed out of the same conductive film as that of the wiring 17.

As shown in FIG. 1C, the first electrode 11 is connected to the wiring 24 through a contact hole 23 which is formed in the first insulating film 12b, the second insulating film 14 and the third insulating film 16. In addition, the second electrode 15 is connected to the wiring 24 through a contact hole 22 which is formed in the third insulating film 16.

It is noted that the electrical connection between the first electrode 11 and the second electrode 15 is not limited to the configurations shown FIGS. 1B and 1C.

The thickness of the film removed by the CMP is determined in light of the thickness of the first insulating film 12, the dielectric constant of the first insulating film 12 and the thickness of the second insulating film 14. The remaining film substantially functions as a gate insulating film. Accordingly, if the first insulating film is formed by layering a plurality of insulating films, only the uppermost insulating film thereof on the first electrode 11 may be polished or the lower insulating film thereof may be polished and exposed.

For example, if the first insulating film A 12a and the first insulating film B 12b are formed out of silicon oxide nitride films, respectively, the first insulating film 12 has a dielectric constant of 7.5. If the second insulating film 14 is formed out of a silicon oxide film, the second insulating film 14 has a dielectric constant of 3.9. The first and second insulating films 12 and 14, therefore, differ in dielectric constant. In that case, as finished dimensions after the CMP, the thickness of the first insulating film 12 may be set at 150 nm and that of the second insulating film 14 may be set at 110 nm.

By applying a common voltage to the first electrode 11, it is possible to suppress threshold irregularity and to suppress OFF current compared with a TFT which includes only one electrode.

There are known a top-gate type (planar type) TFT, a bottom-gate type (inverted stagger type) TFT and the like which differ according to the arrangement of a semiconductor film, a gate insulating film and a gate electrode. In any type of TFT, it is necessary to make the thickness of the semiconductor film thin so as to lower a sub-threshold coefficient. If a semiconductor film formed by crystallizing an amorphous semiconductor film is used for the TFT, the crystallinity of the semiconductor film deteriorates as the amorphous semiconductor film is thinner, with the result an advantage of merely thinning the semiconductor film cannot be obtained. However, by electrically connecting the first electrode to the second electrode and, as shown in FIGS. 1A, 1B and 1C, overlapping the two electrodes with the semiconductor film on the upper and lower surfaces thereof, respectively, it is possible to accelerate the formation of a depleted region following the application of a voltage, to lower field effect mobility and the sub-threshold coefficient and to thereby increase ON current in substantially the same manner as that of thinning the semiconductor film.

If the first electrode 11 is electrically connected to the second electrode 15, it is possible to lower the field effect mobility and the sub-threshold coefficient and to increase ON current as the dielectric constant of the first insulating film 12 is closer to that of the second insulating film 14.

Further, it is possible to lower the field effect mobility and the sub-threshold coefficient and to increase ON current as the thickness of the first insulating film 12 when the thickness is uniform in the section in which the first electrode 11 is overlapped with the channel formation region 18 is closer to that of the second insulating film 14 when the thickness thereof is uniform in the section in which the second electrode 15 is overlapped with the channel formation region 18. If it is assumed that the thickness of the first insulating film 12 in the section in which the first insulating film 12 is overlapped with the first electrode 11 is d1, and that of the second insulating film 14 in the section in which the second insulating film 14 is overlapped with the second electrode 15 is d2, then the thicknesses d1 and d2 preferably satisfy $|d1-d2|/d1 \leq 0.1$ and $|d1-d2|/d2 \leq 0.1$. It is more preferable that the thicknesses d1 and 2d satisfy $|d1-d2|/d1 \leq 0.05$ and $|d1-d2|/d2 \leq 0.05$.

Most preferably, the threshold voltage of the TFT when a ground voltage is applied to the first electrode 11 is set almost equal to that of the TFT when the ground voltage is applied to the second electrode 15 while the first electrode 11 is not electrically connected to the second electrode 15, and then the first electrode 11 is electrically connected to the second electrode 15. By doing so, it is possible to lower the field effect mobility and the sub-threshold coefficient and to increase ON current.

By adopting the above-stated configuration, it is possible to form channels (dual channels) above and below the semiconductor film, respectively and to thereby improve the TFT characteristic.

Further, a wiring for transmitting various signals or power can be formed simultaneously with the first electrode 11. If the wiring formation is combined with a planarization processing by the CMP method, it does not at all influence the cemiconductor film and the like to be formed on the wiring. Besides, a multilayer wiring can realize densified wirings. Concrete examples in which the present invention is applied to an active matrix driven type display device will be shown in the following embodiments.

Embodiment 1

Manufacturing steps of manufacturing a semiconductor device according to the present invention will be described. In this embodiment, a method of simultaneously manufacturing a pixel section and TFT's (n-channel type TFT's and p-channel type TFT's) for a driving circuit provided near the pixel section, on the same substrate will be described in detail. In this embodiment, an example in which a common voltage is applied to the first electrodes of all the TFT's formed on the pixel section and the first electrode is connected to the second electrode of each TFT formed on the driving circuit is shown. FIGS. 2A, 2B, 2C to 6A and 6C are cross-sectional views for explaining the semiconductor device manufacturing steps. FIGS. 7A, 7B to FIG. 9 are corresponding top views. For the convenience of explanation, common reference symbols are used therein.

In FIG. 2A, a substrate made of an arbitrary material can be used as a substrate 101 as long as the substrate has an insulating film and resists treatment temperature in later steps. Typically, a glass substrate, a quartz substrate, a ceramic substrate or the like can be used. Alternatively, a substrate such as a silicon substrate, a metal substrate or a stainless substrate having an insulating film formed on the surface thereof may be used. It is also possible to use a plastic substrate having heat resistance against the treatment temperature in this embodiment.

A first wiring 102 and first electrodes 103 to 107 are formed on the insulating surface of the substrate 101. Each of the first wiring 102 and the first electrodes 103 to 107 are formed out of a conductive material made of one or a plurality of types of elements selected from among Al, W, Mo, Ti and Ta. In this embodiment, tungsten (W) is used as the material of the first wiring 102 and the first electrodes 103 to 107. Alternatively, a conductive material having tungsten (W) layered on TaN may be used as each of the first wiring 102 and the first electrodes 103 to 107.

Figure 7A:
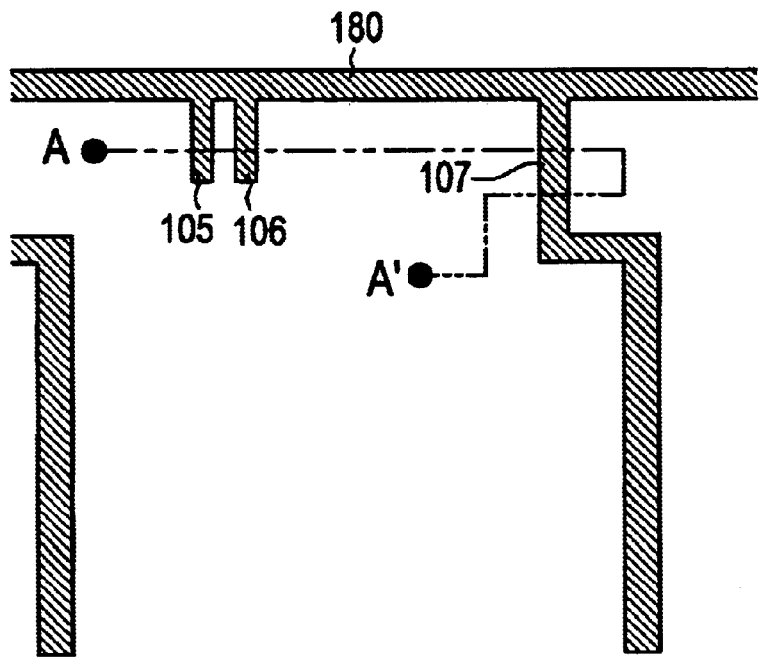
FIGS. 7A and 7B are top views for explaining the manufacturing steps of the pixel section in the luminous device.

FIG. 7A is a top view of a pixel section shown in FIG. 2A. The first electrodes 105, 106 and 107 form a part of a common wiring 180.

After forming the first wiring 102 and the first electrodes 103 to 107, a first insulating film 110 is formed. In this embodiment, the first insulating film 110 is formed by layering two insulating films (a first insulating film A 110a and a first insulating film B 110b). The first insulating film A 110a is formed out of a silicon oxide nitride film to have a thickness of 10 to 50 nm. The first insulating film B 110b is formed out of a silicon oxide film or a silicon oxide nitride film to have a thickness of 0.5 to 1 μm.

The surface of the first insulating film 110 often has irregularities resulting from the first wiring 102 and the first electrodes 103 to 107 formed prior to the first insulating film 110. It is preferable to flatten these irregularities. As a planarization method, the CMP method is used. As an abrasive material (slurry) for the CMP applied to the first insulating film 110, a KOH-added aqueous solution into which foamed silica particles obtained by thermally decomposing silicon chloride gas are dispersed, for example, may be used. By the CMP, the first insulating film 110 is removed by a thickness of about 0.1 to 0.5 μm to thereby flatten the surface thereof.

As a result, as shown in FIG. 2B, the flattened first insulating film 112 is formed. A semiconductor layer is formed on the first insulating film 112. The semiconductor layer 113 is formed out of a semiconductor of a crystal structure. The semiconductor layer 113 can be obtained by crystallizing an amorphous semiconductor layer formed on the first insulating film 112. After being deposited, the amorphous semiconductor layer is crystallized by a heat treatment or laser irradiation. Although the material of the amorphous semiconductor layer is not limited to a specific one, the amorphous semiconductor layer is preferably formed out of silicon, silicon germanium ($Si_xGe_{1-x}$, where $0<x<1$, typically x=0.001 to 0.05) alloy or the like.

Thereafter, the semiconductor layer 113 is etched to be divided into banded sections to thereby form semiconductor films 114 to 117 as shown in FIG. 2C.

Figure 7B:
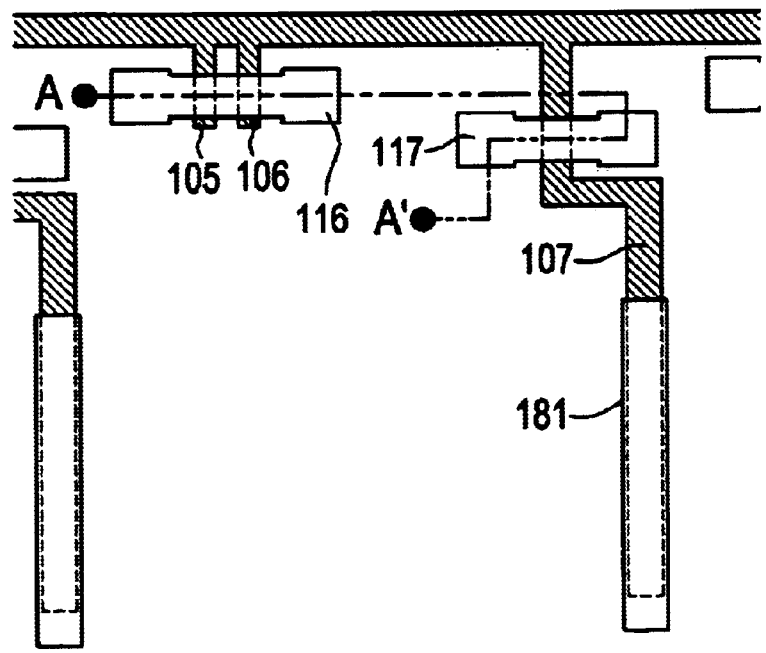

FIG. 7B is a top view of FIG. 2C. The first electrodes 105 and 106 are overlapped with the semiconductor film 116 with the first insulating film 112 interposed therebetween. In addition, the first electrode 107 is overlapped with the semiconductor film 116 with the first insulating film 112 interposed therebetween. A semiconductor film 181 is provided to form a capacitance and overlapped with the first electrode 107 with the first insulating film 112 interposed therebetween.

Figure 3A:
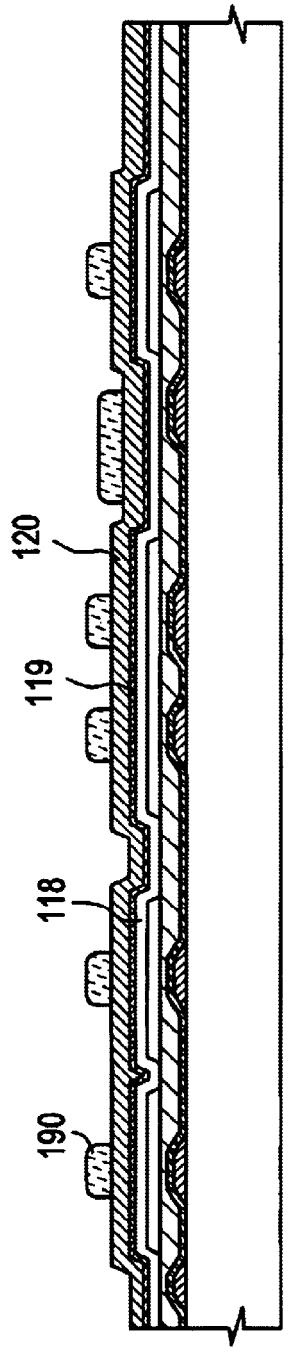
FIGS. 3A and 3B are cross-sectional views for explaining the manufacturing steps of the driving circuit and the pixel section in the luminous device.

Next, as shown in FIG. 3A, a second insulating film 118 which covers the semiconductor films 114 to 117 and 118, is formed. The second insulating film 118 is formed out of silicon containing insulator by a plasma CVD method or a sputtering method. The thickness of the second insulating film 118 is 40 to 150 nm.

Conductive films for forming a second gate electrode and a second wiring, are formed on the second insulating film. According to the present invention, the second gate electrode is formed by layering two or more conductive films. A first conductive film 119 provided on the second insulating film 118 is formed out of a nitride of high melting point metal such as molybdenum or tungsten. A second conductive film 120 provided on the first conductive film 119 is formed out of high melting point metal, low resistance metal such as copper or aluminum or polysilicon. More specifically, as the first conductive film 119, a metal nitride of one or a plurality of elements selected from among W, Mo, Ta and Ti, is used. As the second conductive film 120, alloy of one or a plurality of elements selected from W, Mo, Ta, Ti, Al and Cu or n type polycrystalline silicon is used. For example, the first conductive film 119 may be formed out of TaN and the second conductive film 120 may be formed out of tungsten (W). If the second gate electrode or the second wiring is formed out of three layers of conductive films, the first layer may be a Mo film, the second layer may be an Al film and the third layer may be a TiN film. Alternatively, the first layer may be a W film, the second layer may be an Al film and the third layer may be a TiN film. By providing a multilayer wiring, the thickness of the wiring itself increases to make it possible to suppress wiring resistance.

The first conductive film 119 and the second conductive film 120 are etched using a mask 190 to thereby form the second wiring and the second electrode.

Figure 3B:
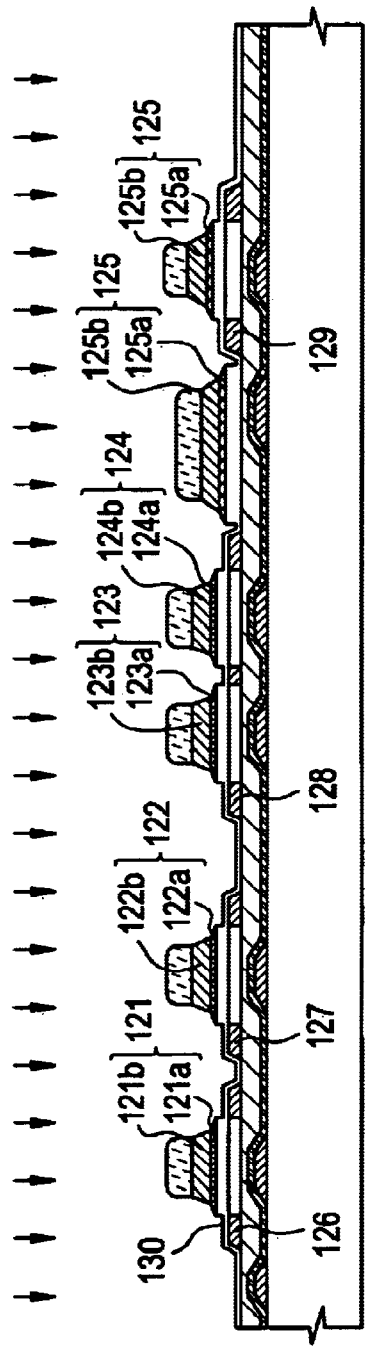

As shown in FIG. 3B, first shape type electrodes 121 to 125 each having tapered end sections (which electrodes consist of the first conductive films 121a to 125a and the second conductive films 121b to 125b, respectively) are formed by the first etching treatment. The surface of the second insulating film 118 is etched and thinned by a thickness of about 20 to 50 nm in the sections in which the second insulating film 118 is not covered with the first shape type electrodes 121 to 125. To differentiate the second insulating film in a before-etching state from that in an after-etching state, the second insulating film after etching is denoted by reference symbol 130.

The first doping treatment is carried out by an ion injection method or an ion doping method for injecting ions without causing mass separation. In the doping, using the first shape type electrodes 121 to 125 as masks, first concentration, one-conductive type impurity regions 126 to 129 are formed in the semiconductor films 114 to 117, respectively. The first concentration is set at $1\times10^{20}$ to $1.5\times10^{21}$/cm$^3$.

Next, the second etching treatment is carried out as shown in FIG. 4A without removing a mask made of resist. In the second etching treatment, second shape type electrodes 131 to 135 (which consist of first conductive films 131a to 135a and second conductive films 131b to 135b, respectively) are formed by subjecting the second conductive film 120 to anisotropic etching. The second shape type electrodes 131 to 135 are formed so that the widths thereof are reduced by the second etching treatment and the end sections thereof are located inward of the first concentration, one-conductive type impurity regions 126 to 129 (second impurity regions).

As shown in the next step, the length of an LDD is determined according to each reduced width. The second shape type electrodes 131 to 135 function as second electrodes, respectively.

Figure 8A:
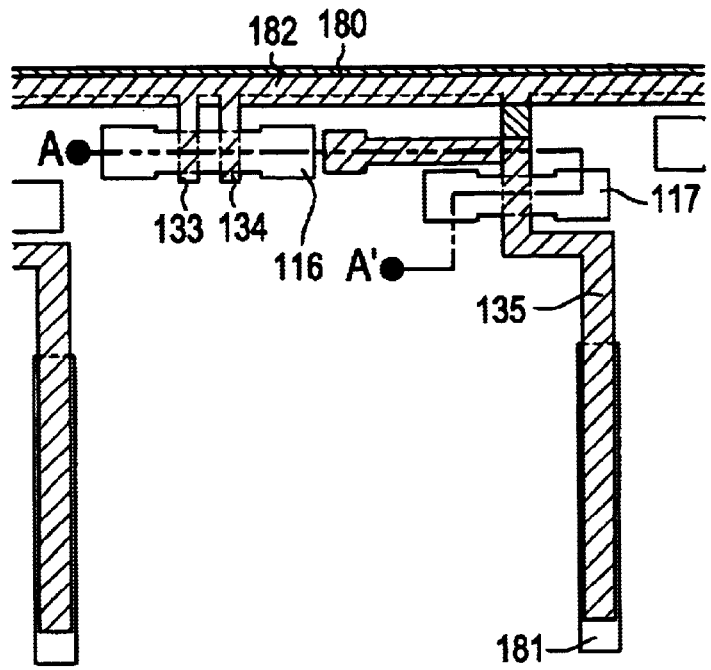
FIGS. 8A and 8B are top views for explaining the manufacturing steps of the pixel section in the luminous device.

FIG. 8A is a top view of FIG. 4A. The second shape type electrodes 133 and 134 form a part of a gate wiring 182. The second shape type electrodes 133 and 134 are overlapped with the semiconductor film 116 with the second insulating film 130 interposed therebetween. The second shape type electrode 135 is overlapped with the semiconductor film 117 with the second insulating film 130 interposed therebetween. In addition, the second shape type electrodes 133 and 134 are overlapped with the first electrodes 105 and 106, respectively, with the semiconductor film 116 and the second insulating film 130 interposed therebetween. The second shape type electrode 135 is overlapped with the semiconductor film 181 with the second insulating film 130 interposed therebetween.

Further, the second shape type electrodes 131 and 132 are overlapped with the first electrodes 103 and 104, with the semiconductor films 114, 115 and the second insulating film 130 interposed therebetween, respectively.

In this state, the second doping treatment is carried out to thereby inject one-conductive type impurities into the semiconductor films 114 to 117. Second concentration, one-conductive type impurity regions (first impurity regions) 195 to 198 formed by the second doping treatment are formed to be overlapped with the first conductive films 131a to 135a which constitute the second shape type electrodes 131 to 135 in a self-aligned fashion, respectively. Since the impurities doped by the ion doping method are passed through the first conductive films 131a to 135a and then added to the semiconductor films, the number of ions which reach the semiconductor films decreases and the ion concentration of each semiconductor film, quite naturally, becomes low. The concentration is $1\times10^{17}$ to $1\times10^{19}$/cm$^3$.

Next, as shown in FIG. 4B, masks 139 and 140 made of resist are formed. Using the masks 139 and 140, the third doping treatment is carried out. In this third doping treatment, third concentration type impurity regions 141 and 142 of a conductive type opposite to one-conductive type are formed in the semiconductor films 115 and 117, respectively. The third concentration type impurity regions 141 and 142 of the conductive type opposite to one-conductive type are formed in regions overlapped with the second shape type electrodes 132 and 134, respectively. Impurity elements are added to the semiconductor films in a concentration range of $1.5\times10^{20}$ to $1.5\times10^{21}$/cm$^3$.

As a result of the above steps, the impurity doped regions intended for valence electron control are formed in the respective semiconductor films. The first electrodes 103 to 107 and the second shape type electrodes 131 to 135 function as gate electrodes at positions at which the electrodes cross the semiconductor films, respectively.

Thereafter, a step of activating the impurity elements doped into the respective semiconductor films is executed. In this activation treatment, gas heating type instantaneous heat annealing is employed. The heat treatment is carried out at a temperature of 400 to 700° C. in a nitrogen atmosphere, typically at a temperature of 450 to 500° C. In addition to the heat annealing, laser annealing using the second higher harmonic wave (532 nm) of a YAG laser is available. If the impurities are activated by the irradiation of a laser beam, the laser beam is applied to the semiconductor films using the second higher harmonic wave (532 nm) of the YAG laser. Needless to say, the RTA method which uses a lamp light source instead of laser light is also applicable. In the RTA method, the lamp light source is radiated from both sides or one side of a substrate to thereby heat the semiconductor films.

Thereafter, as shown in FIG. 5A, a passivation film 143 made of silicon nitride is formed to have a thickness of 50 to 100 nm by the plasma CVD method, a heat treatment is carried out at a temperature of 410° C. using a clean oven and the semiconductor films are hydrogenated with hydrogen emitted from the silicon nitride film.

Next, a third insulating film 144 made of an organic insulating material is formed on the passivation film 143. The reason for using the organic insulating material is to flatten the surface of the third insulating film 144. To obtain a more completely flattened surface, the surface of the third insulating film 144 is preferably subjected to a planarization treatment by the CMP method. If the CMP is used in combination with the planarization, a silicon oxide film formed by the plasma CVD method, an SOG (Spin on Glass) film or a PSG film formed by a coating method, or the like can be used as the third insulating film 144. The passivation film 143 may be regarded as a part of the third insulating film 144.

A transparent conductive film 145 which mainly contains indium tin oxide (ITO) having a thickness of 60 to 120 nm is formed on the surface of the third insulating film 144 thus flattened. Since the surface of the transparent conductive film 145 has microscopic irregularities, it is preferable that the surface thereof is polished and flattened by the CMP method with aluminum oxide used as an abrasive material.

Figure 8B:
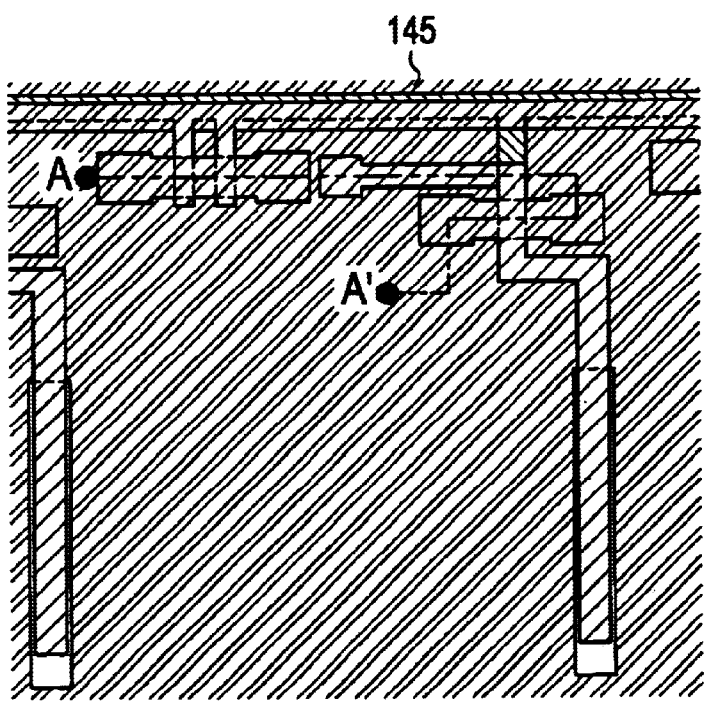

FIG. 8B is a top view of FIG. 5A.

Thereafter, the transparent conductive film 145 is etched to thereby form a pixel electrode (third electrode) 146. Contact holes are formed in the second insulating film 130, the passivation film 143 and the third insulating film 144, and wirings 147 to 153 are formed. The wirings are formed by layering a titanium film and an aluminum film.

The wiring 147 is connected to the first wiring 102 and the second shape type electrode 131. In addition, the first wiring 102 is electrically connected to the first electrode 103.

The wiring 148 is connected to the impurity regions 126 and 141. The wiring 149 is connected to the impurity region 141. The wiring 150 is connected to the impurity region 128 and functions as a source wiring. The wiring 151 is connected to the impurity region 128 and the second shape type electrode 135. The wiring 152 is connected to the impurity region 142. The wiring 153 is connected to the impurity region 142 and the pixel electrode 146 and functions as a power supply line.

In the steps described so far, if the one-conductive type impurity region is an n type region and the impurity region of the conductive type opposite to one-conductive type is a p type region, a driving circuit 200 which includes an n-channel type TFT 202, and a p-channel type TFT 203 and a pixel section 201 which includes an n-channel type TFT 204 and a p-channel type TFT 205 are formed.

As for the driving circuit 200, on the n-channel type TFT 202, a pair of gate electrodes 131 and 103 are overlapped with each other with the channel formation region 160 put therebetween. The second concentration, one-conductive type impurity region 195 functions as an LDD region and the first concentration, one-conductive type impurity region 126 functions as a source or a drain region. On the p-channel type TFT 203 of the driving circuit 200, a pair of gate electrodes 132 and 104 are overlapped with each other with the channel formation region 161 put therebetween. The third concentration type impurity region 141 of the opposite conductive type to one-conductive type functions as a source or drain region. The LDD is formed to have a length of 0.5 to 2.5 µm, preferably 1.5 µm in a channel length direction. The configuration of such an LDD is intended to prevent the deterioration of the TFT mainly due to the hot carrier effect. A shift register circuit, a buffer circuit, a level shifter circuit, a latch circuit and the like can be formed out of these n-channel type TFT's and p-channel type TFT's. The first n-channel type TFT 202 is suited particularly for the buffer circuit requiring high driving voltage so as to prevent the deterioration of the TFT 202 due to the hot carrier effect.

As for the pixel section 201, on the n-channel type TFT 204, a pair of gate electrodes 133 and 105 are overlapped with each other with the channel formation region 162 put therebetween. On the n-channel type TFT 204, a pair of gate electrodes 134 and 106 are overlapped with each other with the channel formation region 163 put therebetween. The second concentration, one-conductive type impurity region 196 functions as an LDD region and the first concentration, one-conductive type impurity region 128 functions as a source or drain region. The n-channel type TFT 204 is, constituted so that two TFT's are connected in series with the first concentration, one-conductive type impurity region put therebetween. On the p-channel type TFT 205, a pair of gate electrodes 135 and 107 are overlapped with each other with the channel formation region 164 put therebetween. The third concentration type impurity region 142 of the opposite conductive type to one-conductive type functions as a source or drain region.

In this embodiment, by always applying a constant voltage (common voltage) to the common wiring, the common voltage is applied to the first electrode. This constant voltage is set to be lower than a threshold voltage in the case of the n-channel type TFT and higher than the threshold voltage in the case of the p-channel type TFT. By applying the common voltage to the first electrode, the threshold irregularity of the TFT can be suppressed compared with the TFT which includes only one electrode. It is also possible to suppress OFF current. The decrease of OFF current rather than the increase of ON current influences the TFT which is formed as a switching element in the pixel section of the semiconductor device. The above-stated configuration is, therefore, advantageous to this TFT.

Further, in this embodiment, by forming a pair of gate electrodes electrically connected to each other through the semiconductor film on the TFT included in the driving circuit of the semiconductor device, the thickness of the semiconductor film is substantially halved, the formation of a depleted region is accelerated following the application of a gate voltage, making it possible to improve the field effect mobility and to lower the subthreshold coefficient. As a result, by using the TFT of such a structure in the driving circuit, it is possible to decrease driving voltage. In addition, current driving capability is improved and the TFT can be thereby made smaller in size (channel width thereof can be particularly made smaller). It is thus possible to improve the integration density of the semiconductor device.

Figure 6A:
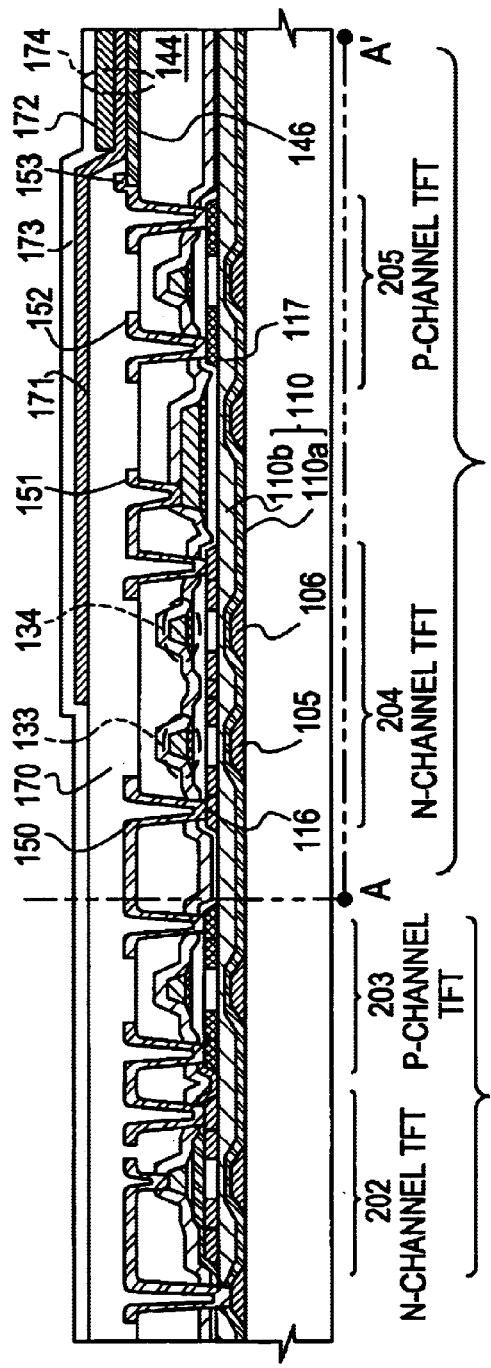
FIGS. 6A and 6B are cross-sectional views for explaining the manufacturing steps of the driving circuit and the pixel section in the luminous device.

The pixel section 201 shows a structure which can be applied to an active matrix driven type luminous device. FIG. 6A shows a state in which a luminous element is formed on the third insulating film 144. A partition layer 170 which covers the n-channel type TFT 204 and the p-channel TFT 205, is formed on the third insulating film 144. Since an organic compound layer or a cathode cannot be subjected to a wet treatment (such as etching with chemicals or washing), the partition layer 170 formed out of a photosensitive resin material is provided on a fourth insulating film for the pixel electrode 146. The partition layer 170 is formed out of an organic resin material such as polyimide, polyamide, polyimide amide or acryl. This partition layer 170 is formed to cover the end sections of the pixel electrode 146. In addition, each of the end sections of the partition layer 170 is formed to have a cone angle of 45 to 60 degrees.

Figure 9:
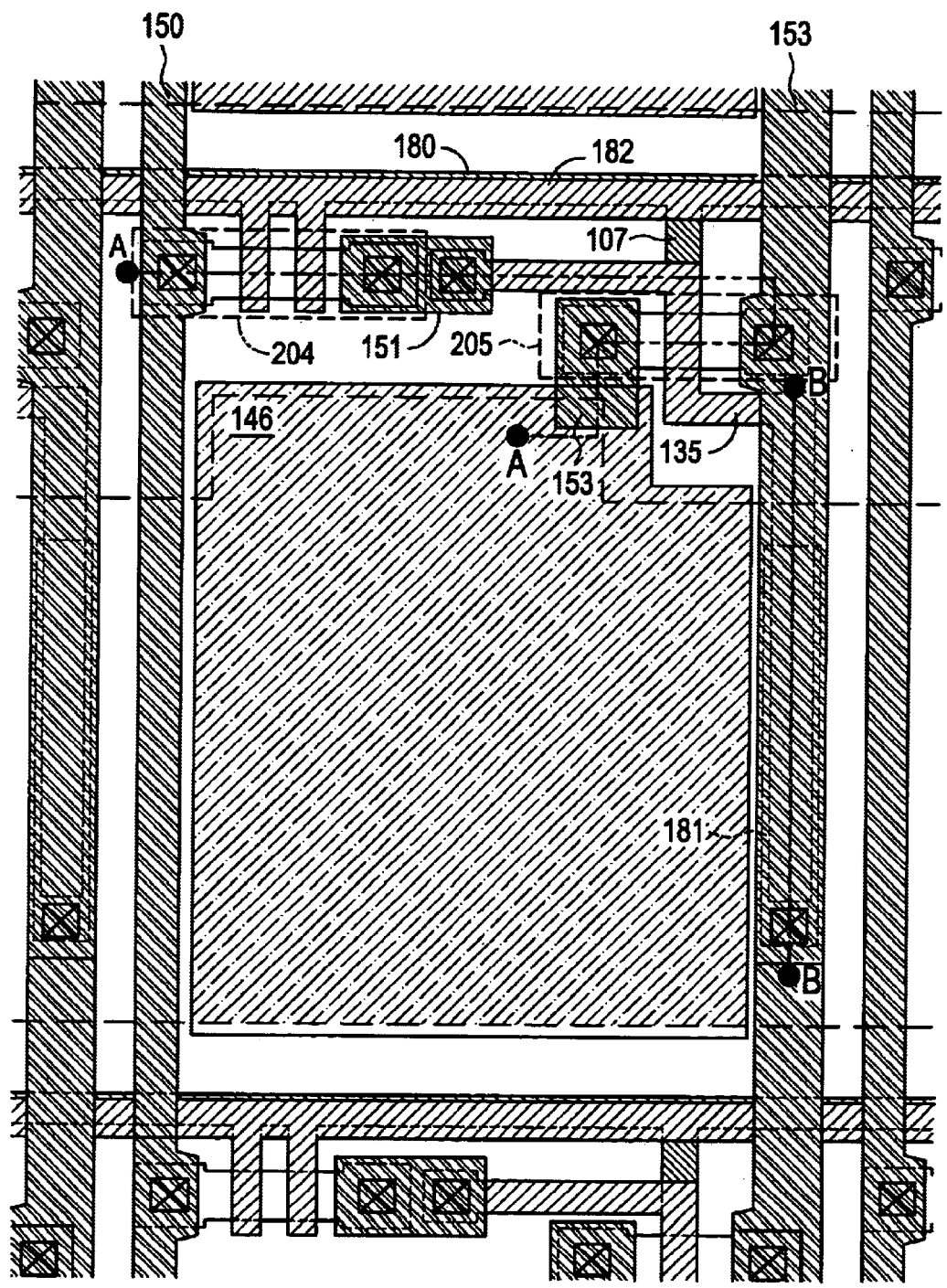
FIG. 9 is a top view for explaining the configuration of the pixel section in the luminous device.

FIG. 9 is a top view of the pixel section 201 in the above-stated state. In FIG. 9, the partition layer 170 is formed in a region surrounded by a dashed line.

An active matrix driven type luminous device shown herein is constituted by arranging organic luminous elements in a matrix. The organic luminous element 174 consists of an anode, a cathode and an organic compound layer formed between the anode and the cathode. If the pixel electrode 146 is formed out of a transparent conductive film, the pixel electrode 146 serves as the anode of the luminous element 174. The organic compound layer is formed out of a combination of a hole transport material having relatively high hole mobility, an electron transport material opposite to the hole transport material, a light emitting material and the like. These materials may be formed into respective layers or mixed with one another.

The organic compound material is formed as thin film layers having a total thickness of about 100 nm. To this end, the surface of the ITO conductive thin film formed as the anode should have improved flatness. If flatness is low, the anode or the ITO film is short-circuited with the cathode formed on the organic compound layer at the worst. As another method for preventing short-circuit, a method of forming an insulating film having a thickness of 1 to 5 nm may be adopted. As the insulating film, a film made of polyimide, polyamide amide, polyamide, acryl or the like can be used. If an opposed electrode (fourth electrode) 172 is formed out of alkali metal such as MgAg or LiF or alkaline-earth metal, the opposed electrode 172 can function as the cathode of the organic luminous element 174.

The opposed electrode 172 is formed out of a material containing magnesium (Mg), lithium (Li) or calcium (Ca) having a low work function. Preferably, the opposed electrode 172 containing MgAg (a material of mixture of Ag and Mg with a mixture ratio of Mg:Ag=10:1) is used. In addition to the MgAg electrode, an MgAgAl electrode, an LiAl electrode or an LiFAl electrode is available. An insulating film 173 made of silicon nitride or a DLC film is formed on the opposed electrode 172 to have a thickness of 2 to 30 nm, preferably 5 to 10 nm. The DLC film can be formed by the plasma CVD method. Even at a temperature of not higher than 100 ° C., the DLC film can be formed to cover the end sections of the partition layer 622 with good covering property. The internal stress of the DLC film can be lessened by mixing argon in small quantities into the DLC film. The DLC film can be, therefore, used as a protection film. In addition, the DLC film has high gas barrier property against CO, $CO_2$, $H_2O$ and the like as well as oxygen, so that the DLC film is suited as the insulating film 173 which functions as a barrier film.

Figure 6B:
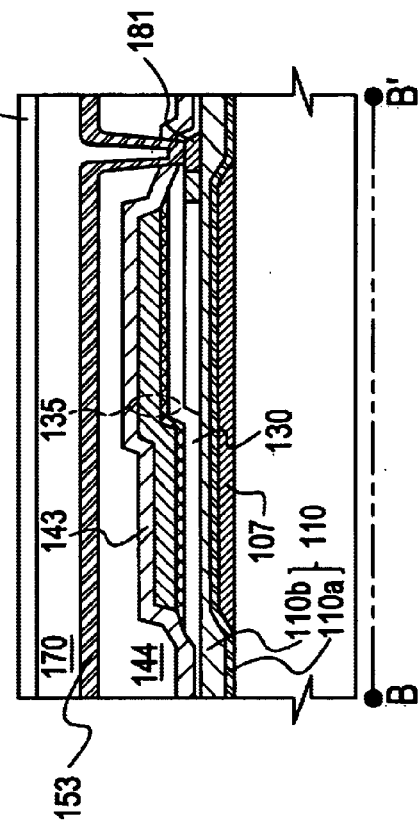

FIG. 6B is a cross-sectional view taken along line B–B' of FIG. 9. A capacitance is formed in the section in which the first electrode, the first insulating film 112 and the semiconductor film 181 are overlapped with one another. A capacitance is also formed in the section in which the second shape type electrode 135, the second insulating film 130 and the semiconductor film 181 are overlapped with one another.

In this embodiment, the first electrode is connected to the second electrode by the wiring which is formed simultaneously with the source wiring. Alternatively, the first electrode and the second electrode may be directly connected to each other. It is noted, however, that if the first electrode is connected to the second electrode by the wiring which is formed simultaneously with the source wiring as described in the first embodiment, it is unnecessary to increase the number of steps and it is possible to suppress the number of masks.

After airtightness is improved by a processing such as packaging, connectors (flexible print circuits: FPC's) are attached to connect terminals pulled out from the elements or circuits formed on the substrate to external signal terminals, whereby the semiconductor device is completed as a product.

Embodiment 2

In this embodiment, the different configuration of the pixels of the luminous device which is one example of the semiconductor device according to the present invention from that described in the first embodiment will be described.

Figure 10:
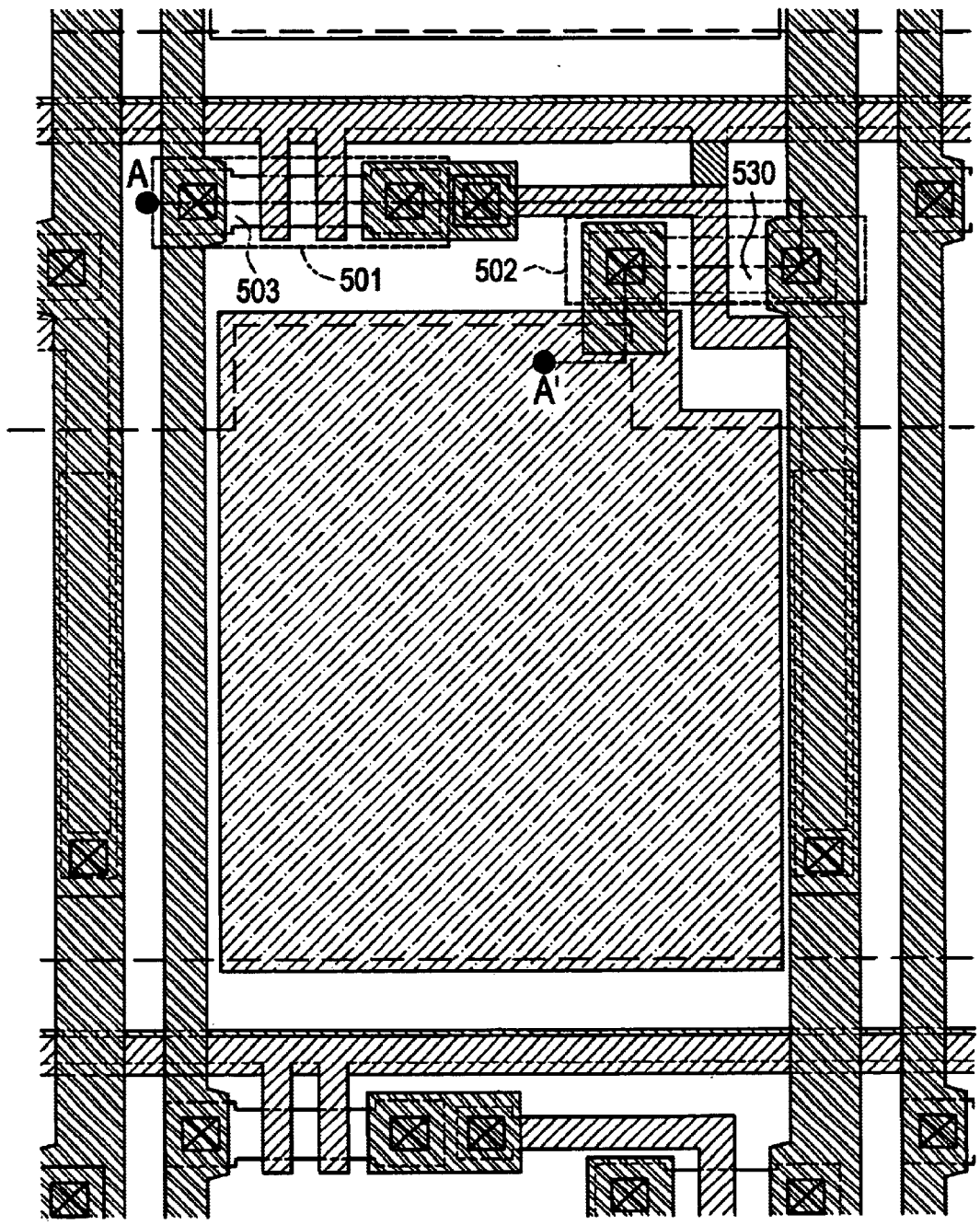
FIG. 10 is a top view for explaining the configuration of the pixel section in the luminous device.
Figure 11:
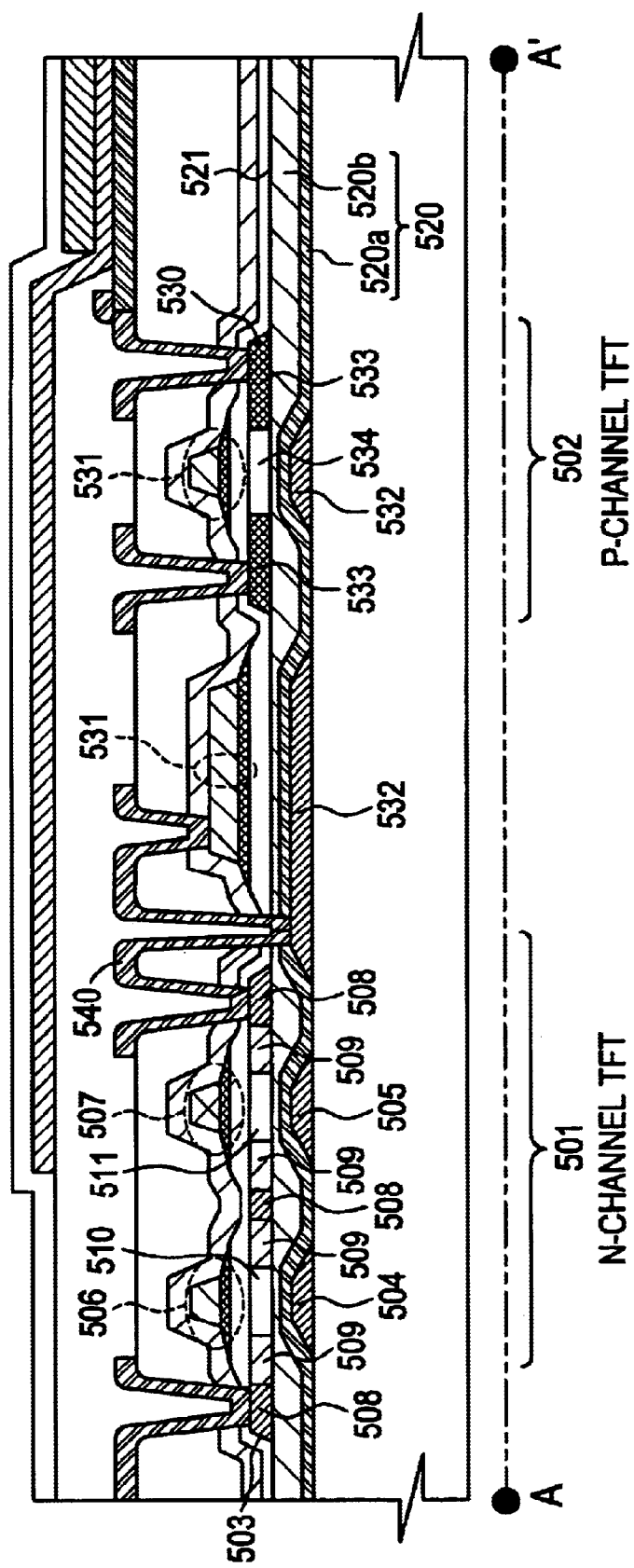
FIG. 11 is a cross-sectional view for explaining the configuration of the pixel section in the luminous device.

FIG. 10 is a top view of the pixels of a luminous device in this embodiment. FIG. 11 is a cross-sectional view taken along line A–A' of FIG. 10.

Reference symbol 501 denotes a n-channel type TFT, and 502 denotes a p-channel type TFT. The n-channel type TFT 501 includes a semiconductor film 503, a first insulating film 520, first electrodes 504 and 505, a second insulating film 521, and second electrodes 506 and 507. The semiconductor film 503 includes a first concentration, one-conductive type impurity region 508, a second concentration, one-conductive type impurity region 509 and channel formation regions 510 and 511.

The first electrodes 504 and 505 are overlapped with the channel formation regions 510 and 511 with the fist insulating film 520 put therebetween, respectively. In addition, the second electrodes 506 and 507 are overlapped with the channel formation regions 510 and 511 with the second insulating film 521 put therebetween, respectively.

The p-channel type TFT 502 includes a semiconductor film 530, a first insulating film 520, a first electrode 532, a second insulating film 521, and a second electrode 531. The semiconductor film 530 includes a third concentration, one-conductive type impurity region 533 and a channel formation region 534.

The first electrode 532 is overlapped with the channel formation region 534 with the first insulating film 520 put therebetween. The second electrode 531 is overlapped with the channel formation region 534 with the second insulating film 521 put therebetween.

The first electrode 532 is electrically connected to the second electrode 531 through a wiring 540.

In this embodiment, a common voltage is applied to the first electrode of the TFT (which corresponds to the n-channel type TFT 501 in this embodiment) which is used as a switching element among the TFT's in the same pixels. By applying the common voltage to the first electrode, it is possible to suppress threshold irregularity and to suppress OFF current compared with the TFT which includes only one electrode.

Further, on the TFT (which corresponds to the p-channel type TFT 502 in this embodiment) to which high current is carried than that of the TFT used as a switching element, the first electrode is electrically connected to the second electrode. By applying the same voltage to the first and second electrodes, the spread of a depletion layer is accelerated substantially as in the case of making the thickness of the semiconductor film thin. It is, therefore, possible to lower the sub-threshold coefficient and to improve the field effect mobility. It is thus possible to increase ON current compared with the TFT which includes one electrode. As a result, by using the TFT having this structure in the driving circuit, it is possible to decrease driving voltage. In addition, since ON current can be increased, it is possible to make the TFT smaller in size (channel width thereof can be particularly made smaller). It is thus possible to improve the integration density of the semiconductor device.

Embodiment 3

In the third embodiment, a flip-flop circuit used for the shift register of a driving circuit will be described while taking a case of forming a TFT having a first electrode and a second electrode electrically connected to each other, as an example.

Figure 12A:
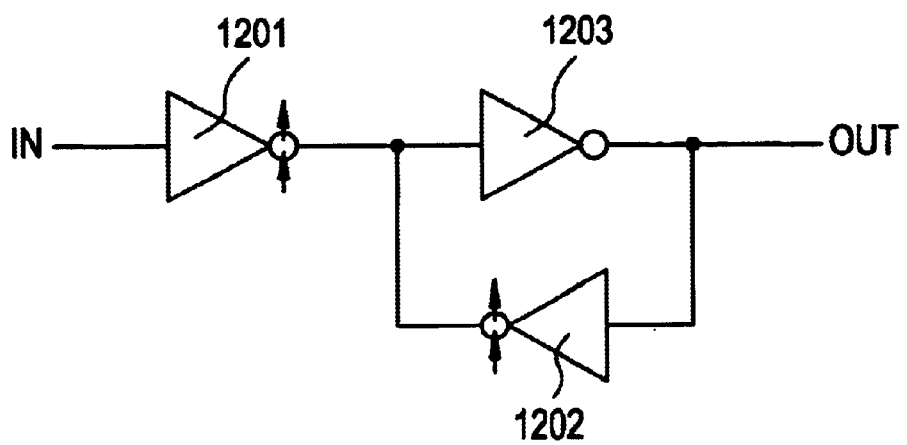
FIGS. 12A and 12B are circuit diagrams of a flip-flop circuit.
Figure 12B:
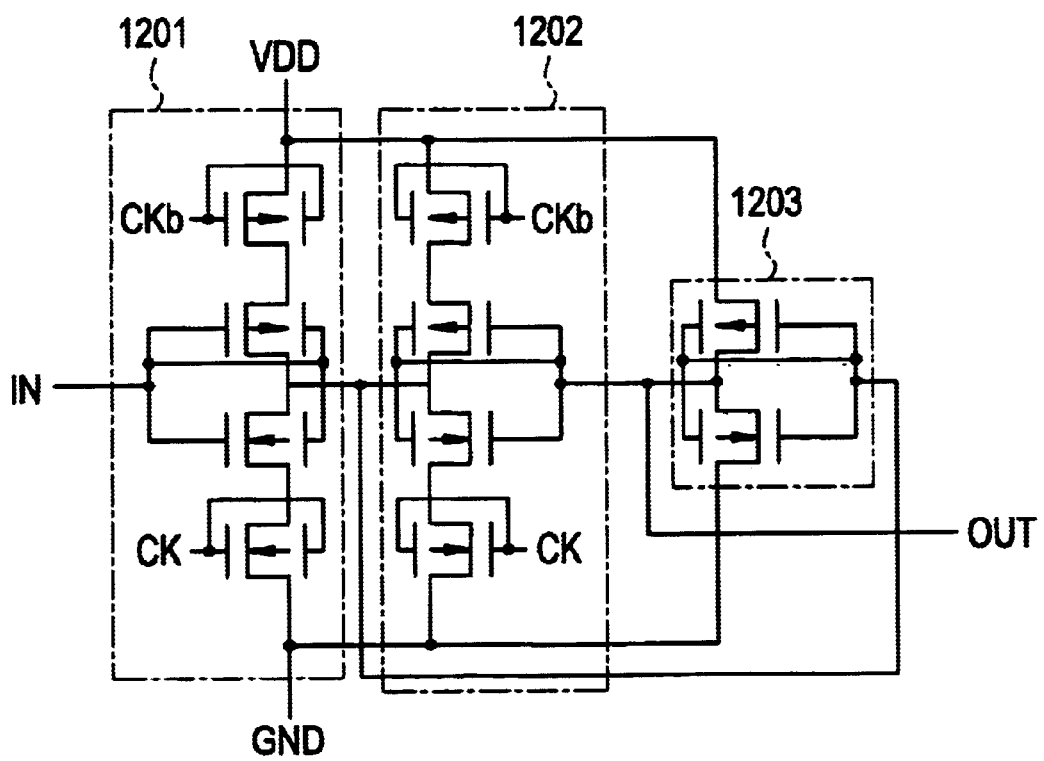

FIGS. 12A and 12B are circuit diagrams of a flip-flop circuit in this embodiment. The configuration of the flipflop circuit included in the semiconductor device of the present invention is not limited to that shown in FIGS. 12A and 12B. In addition, the flip-flop circuit is only one example of the circuits included in the driving circuit. It does not necessarily mean that the semiconductor device of the present invention includes a flip-flop circuit. The TFT of the present invention can be used for a circuit other than the flip-flop circuit.

The flip-flop circuit shown in FIG. 12A includes clocked inverters 1201 and 1202 and an inverter 1203. FIG. 12B is a circuit diagram which shows the respective circuit elements of the flip-flop circuit shown in FIG. 12A more concretely.

Each of the clocked inverters in this embodiment includes two p-channel type TFT's and two n-channel type TFT's. A first voltage (VDD) is applied to the source of the first p-channel type TFT and the drain of the first p-channel type TFT is connected to the source of the second p-channel type TFT. The drain of the second p-channel type TFT is connected to the drain of the second n-channel type TFT. The source of the second n-channel type TFT is connected to the drain of the first n-channel type TFT. A second voltage (GND) is applied to the source of the first n-channel type TFT. The first voltage is higher than the second voltage.

A clock signal (CK) is inputted into the gate electrode of the first n-channel type TFT, and an inverted clock signal (CKb) which is a signal having an inverted polarity from that of the clock signal (CK), is inputted into the gate electrode of the first p-channel type TFT.

The clocked inverter outputs an output signal (OUT) having an inverted polarity from that of a signal (IN) inputted into the gate electrodes of the second p-channel type TFT and the second n-channel type TFT, synchronously with the clock signal (CK) and the inverted clock signal (CKb).

In this embodiment, all of the TFT's included in the clocked inverter shown in FIG. 12B have first and second electrodes which are electrically connected to each other, respectively.

Figure 13:
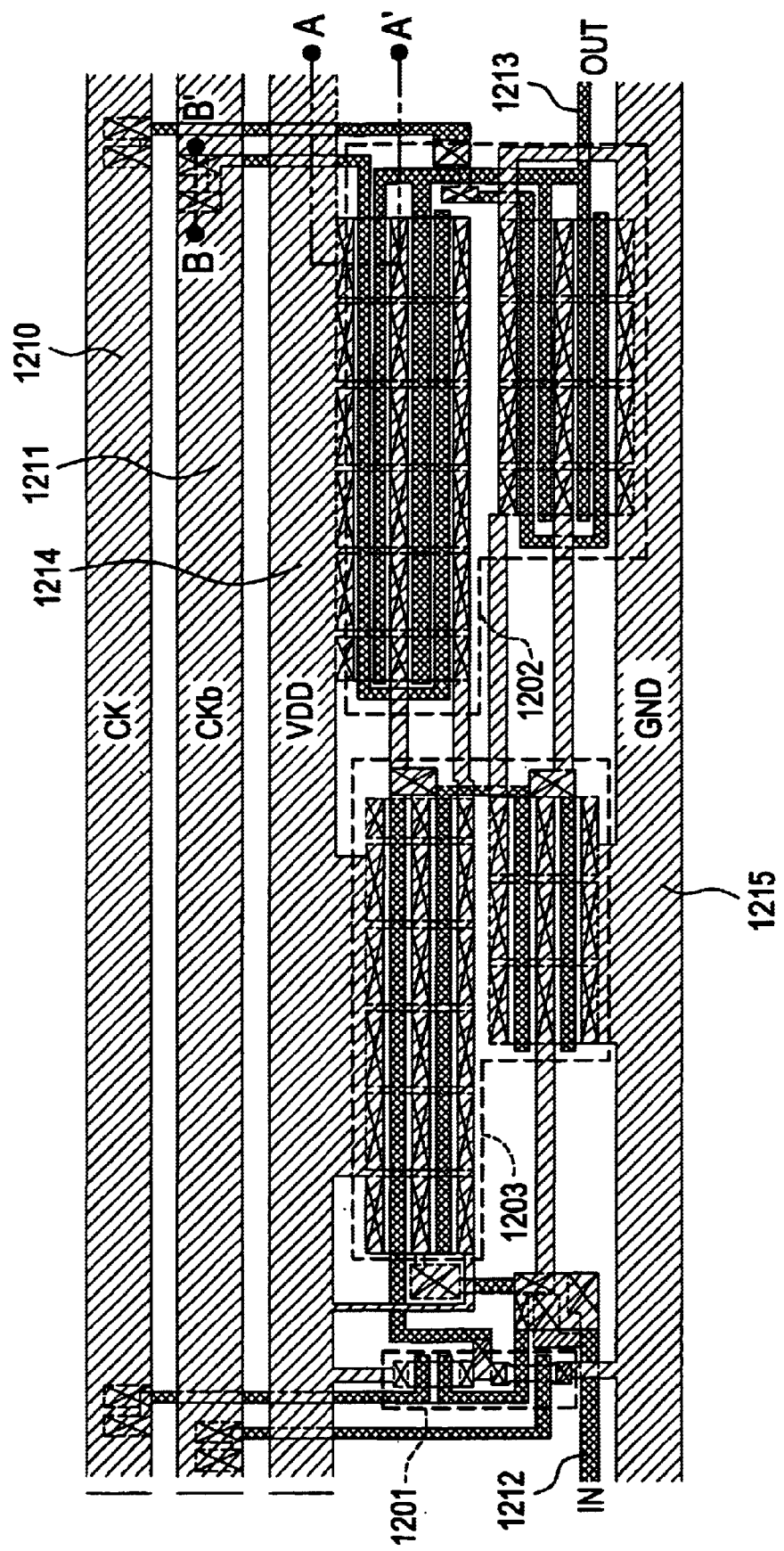
FIG. 13 is a top view of the flip-flop circuit.

FIG. 13 is a top view of the clocked inverter shown in FIG. 12B. Reference symbols 1201 and 1202 denote the clocked inverters and 1203 denotes the inverter. The clock signal (CK), the inverted clock signal (CKb) and the input signal (IN) are inputted into wirings 1210, 1211 and 1212, respectively. The output signal (OUT) is outputted from a wiring 1213. The first voltage (VDD) and the second voltage (GND) are applied to wirings 1214 and 1215, respectively.

FIG. 14A is a cross-sectional view taken along line A–A' of FIG. 13 and FIG. 14B is a cross-sectional view taken along line B–B' of FIG. 13.

Reference symbol 1220 denotes a first p-channel type TFT included in the clocked inverter 1202, and 1221 denotes a second p-channel type TFT included in the clocked inverter 1202.

The first p-channel type TFT 1220 includes a first electrode 1230 and a second electrode 1231. The first electrode 1230 is overlapped with the second electrode 1231 while a channel formation region 1233 included in a semiconductor film 1232 is put between them.

The second p-channel type TFT 1221 includes a first electrode 1234 and a second electrode 1235. The first electrode 1234 is overlapped with the second electrode 1235 while a channel formation region 1236 included in the semiconductor film 1232 is put therebetween.

A source region 1240 included in the semiconductor film 1232 of the first p-channel type TFT 1220 is connected to the wiring 1214. In addition, a drain region 1241 included in the semiconductor film 1232 of the second p-channel type TFT 1221 is connected to the wiring 1215.

The first electrode 1230 and the second electrode 1231 are connected to the wiring 1211 into which the inverted clock signal (CKb) is inputted. The first electrode 1230 and the second electrode 1231 are, therefore, electrically connected to each other. In addition, although not shown in FIG. 14B, the first electrode 1234 is electrically connected to the second electrode 1235.

In this embodiment, the first electrode is electrically connected to the second electrode by a wiring. Alternatively, the first electrode and the second electrode may be directly connected to each other. It is noted, however, that if the first electrode is electrically connected to the second electrode by the wiring, it is possible to form the wiring simultaneously with other wirings and it is, therefore, possible to suppress the number of masks.

The wirings 1210, 1211, 1214 and 1215 can be formed by layering a plurality of conductive films. By providing a multilayer wiring and thereby shortening the length of the wiring, it is possible to decrease wiring resistance and to further improve the integration of the driving circuit.

In addition, as shown in this embodiment, it is not necessary to connect the first and second electrodes of the TFT for each TFT. If the first electrodes or the second electrodes of a plurality of TFT's included in the circuit are connected to one another, it suffices that the first electrode is connected to the second electrode in one of the plurality of TFT's.

This embodiment can be carried out freely in combination with the first and second embodiments.

Embodiment 4

Another embodiment of the present invention will be described, referring to drawings. One example of the structure of a pixel structure and a driving circuit suitable for a liquid crystal display device will be described. FIGS. 15, 16 and 17, which are referred to in this embodiment, are sectional views for explaining the process of the manufacture thereof. FIGS. 18 and 19 are top views corresponding thereto. In the following description, common reference numbers are used for convenience.

In FIG. 15A, electrodes 303 to 306 and the first wiring 302 are formed on the substrate 301 in the same way as in Embodiment 1. Then, the first insulating film 307 is formed. In this embodiment, three layers insulating films (the first insulating film A 307a, the first insulating film B 307b and the first insulating film C 307c) are laminated to use as the first insulating film 307. First, a first insulating film A 307a of a silicon oxynitride film is formed to have a thickness of 50 nm. A silicon oxide film made by TEOS is used to form a second insulating film B 307b of 1 µm thickness. The surface is made flat by CMP, and subsequently a silicon oxynitride film C 307c is formed as a third insulating film 309, to produce a three-layer structure. Needless to say, the insulating film in FIG. 15 is not limited to this structure, the same structure as in Embodiment 1 may be used. The semiconductor films 310 to 312 divided into island shapes are formed in the same way as in Embodiment 1.

Figure 18A:
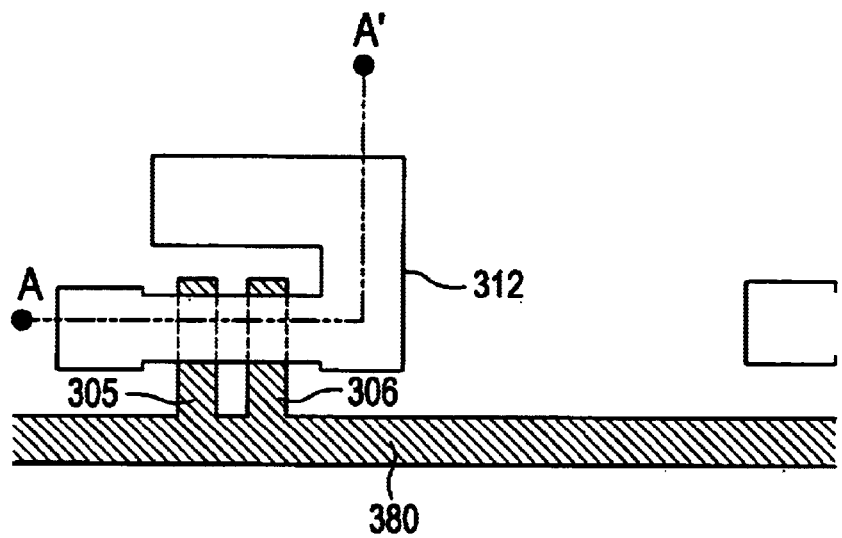
FIGS. 18A and 18B are top views for explaining the manufacturing steps of the pixel section in the liquid crystal display device.
Figure 19:
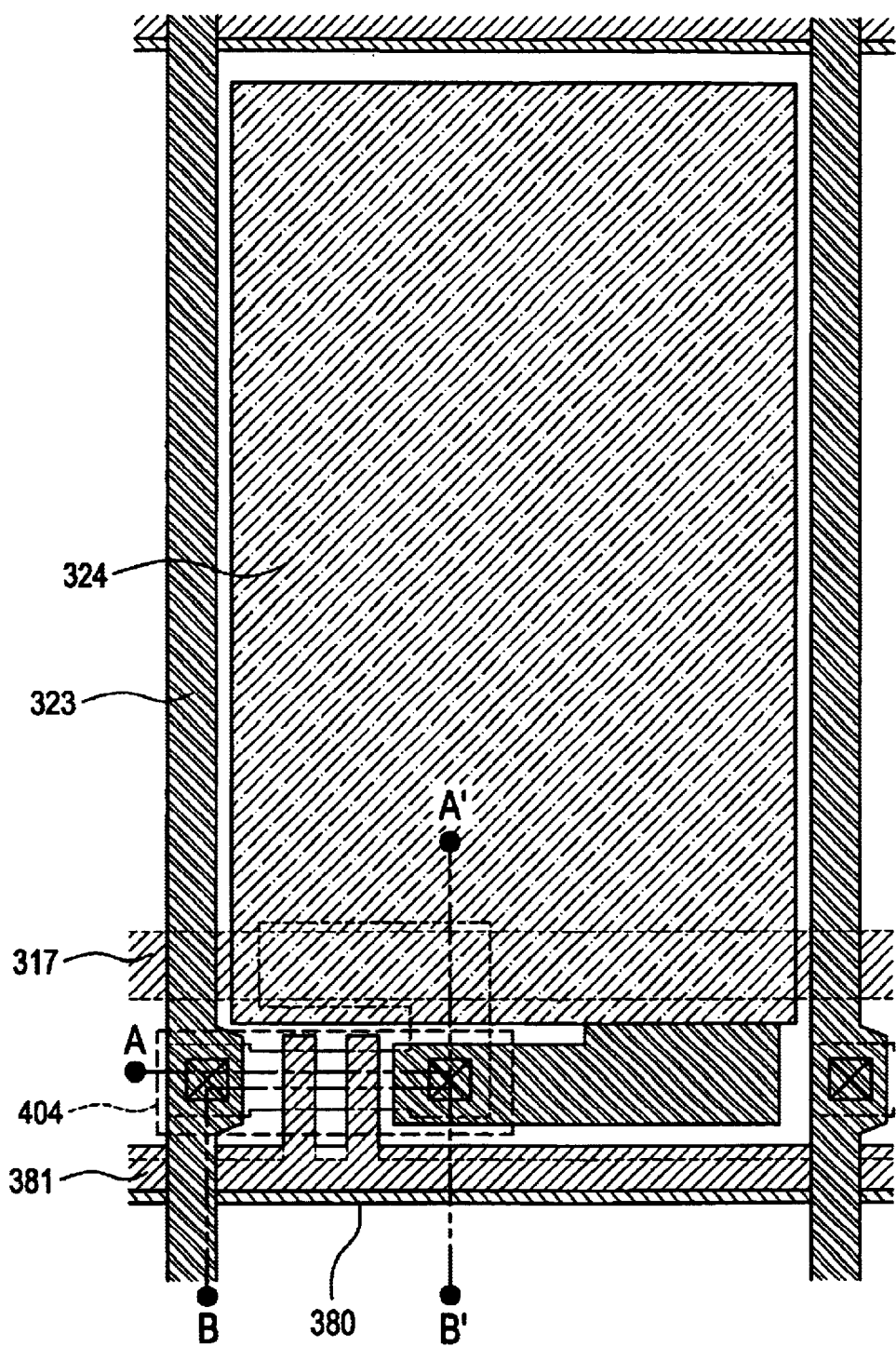
FIG. 19 is a top view for explaining the configuration of the pixel section in the liquid crystal display device.

The top view of the state shown in FIG. 15A is illustrated in FIG. 18A. The cross-sectional view taken along the line A–A' in FIG. 18A correspond to the view in FIG. 15A. The first electrode 305 and the first electrode 306 are included in a part of the common wiring 380.

Next, as illustrated in FIG. 15B, a second insulating film 350 covering semiconductor films 310 to 312 is formed. The second insulating film 350 is made of an insulator containing silicon by plasma CVD or sputtering. The thickness thereof Is from 40 to 150 nm.

Second electrodes 313 to 317 are formed thereon. The material of the second wiring is not limited, and the electrodes are composed of a first layer made of a nitride of a high melting point metal such as molybdenum or tungsten, and a high melting point metal, a low-resistance metal such as aluminum or copper, polysilicon or the like, which is formed on the first layer. Specifically, for the first layer a nitride of one or more selected from W, Mo, Ta and Ti is selected, and for the second layer an alloy of one or more selected from W, Mo, Ta, Ti, Al and Cu, or an n-type polycrystal silicon is used.

Figure 18B:
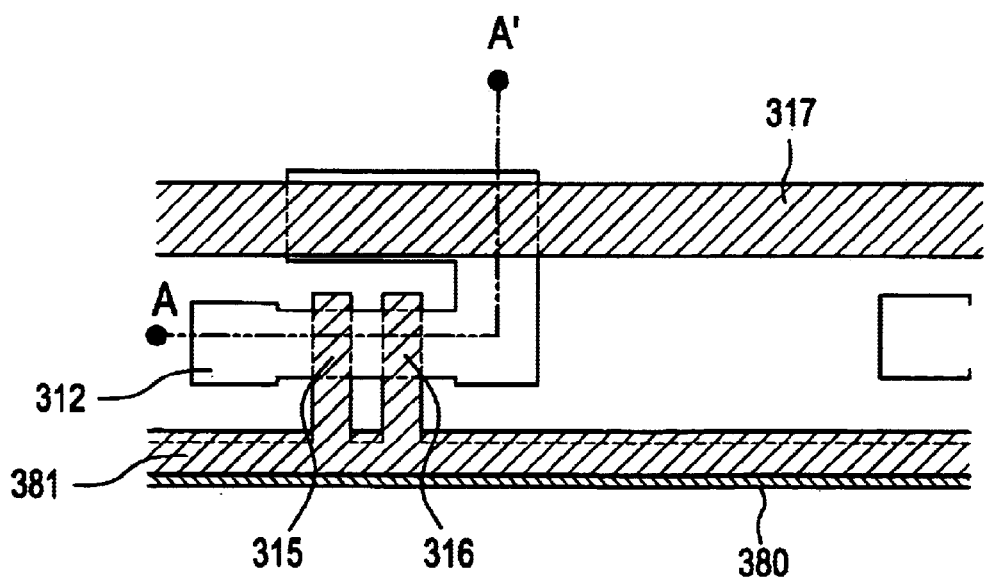

The top view in FIG. 15B is shown in FIG. 18B. The second electrode 315 and the second electrode 316 are included in a part of the gate wiring 381. The second electrode 315 and the second electrode 316 are overlapped with the first electrode 305 and 306 respectively via the first insulating film 307, the semiconductor film 312 and the second insulating film 350.

Thereafter, impurity regions are formed in the respective semiconductor films by ion doping in the same way as in Embodiment 1. Furthermore, heat treatments for activation and hydrogenation are performed. In the heat treatments, it is advisable to use the RTA method in a gas-heating manner.

A passivation film 318 made of a silicon nitride film and a third insulating film 319 made of an organic resin material such as acrylic, polyimide, polyamide, and polyimide amide are formed. The passivation film 318 may be as a part of the third insulating film 319. The surface of the third insulating film is desirably made flat by CMR Thereafter, openings are made and then wirings 320 to 323 and a pixel electrode 324 are formed.

In this way, a driving circuit section 400 having an n-channel type TFT 402 and a p-channel type TFT 403 and a pixel section 401 having an n-channel type TFT 404 and a capacitor portion 405 are formed.

In the n-channel type TFT 402 of the driving circuit section 400, a semiconductor film 310 has a channel formed region 330. The channel formed region 330 is overlapped with the first electrode 303 via the first insulating film 307. The channel formed region 330 is overlapped with the second electrode 313 via the second insulating film 350.

Further, not shown in the figure, the first wiring 302 is connected to the first electrode 303, and the wiring 320 is connected to the first wiring 302 and the second electrode 313. A one-conductive type impurity region 334 having a second concentration functions as an LDD, and a one-conductive type impurity region 335 having a first concentration functions as a source or drain region. The length, in the channel length direction, of the LDD is from 0.5 to 2.5 µm, preferably 1.5 µm. A main purpose of such a structure of the LDD is to prevent deterioration of the TFT's based on hot carrier effect.

In the p-channel type TFT 403, the semiconductor film 311 has a channel formed region 331. The channel formed region 331 is overlapped with the first electrode 304 via the first insulating film 307. The channel formed region 331 is overlapped with the second electrode 314 via the second insulating film 350. An impurity region 336 of a conductive type reverses to the one-conductive type, which has a third concentration, functions as a source or drain region.

The n-channel type TFT 402 and the p-channel type TFT 403 can constitute a shift register circuit, a buffer circuit, a level shifter circuit, a latch circuit or the like. The structure of the first n-channel type TFT 402 is particularly suitable for a buffer circuit having a high driving voltage, in order to prevent the deterioration based on hot carrier effect.

The present invention can be applied to a circuit made basically of an NMOS or a PMOS, as well as a circuit made of the CMOS.

In the n-channel TFT 404 of the pixel section 401, the semiconductor film 312 has the channel formed regions 332 and 340. The first electrode 305 is overlapped with the second electrode 315 via the channel formed region 332. The first electrode 306 is overlapped with the second electrode 316 via the channel formed region 340. A one-conductive type impurity region 337 having the second concentration functions as an LDD, and a one-conductive type impurity region 338 having the first concentration functions as a source or drain region. This n-channel type TFT 404 is in a form wherein two TFT's are connected to each other in series so as to sandwich the one-conductive type impurity region having the first concentration.

In the pixel section 401, a capacitor section connected to the n-channel type TFT 404 is composed of the semiconductor film 312, the second insulating film 350 and a second electrode 317.

FIG. 19 illustrates a top view of the pixel section shown in FIG. 16A. Line A–A' corresponds to FIG. 16A. Line B–B' corresponds to FIG. 16B.

As described above, in the present invention, a pair of gate electrodes is formed to sandwich a semiconductor film, whereby the thickness of the semiconductor film is made substantially half and further depletion advances rapidly with the application of gate voltage to increase electric field effect mobility. The sub-threshold coefficient can be made low.

After the formation of the structure illustrated in FIG. 16A, an oriented film 453 is formed and subjected to rubbing treatment, as illustrated in FIG. 17. Before the formation of the oriented film 453, columnar spacers for keeping a substrate interval may be formed at desired positions by pattering an organic resin film such as an acrylic resin film, which is not illustrated. Spherical spacers may be scattered onto the entire surface of the substrate, instead of the columnar spacers.

Next, a counter electrode 451 is formed on a counter substrate 450. An oriented film 452 is formed thereon and subjected to rubbing treatment. The counter electrode 451 is made of ITO. A counter substrate 450 on which a seal pattern 454 is formed is adhered thereto. Thereafter, a liquid crystal material 455 is injected into the space between both of the substrates, and then the space is completely sealed with a sealant (not illustrated). As the liquid crystal material, any known liquid crystal material may be used. In this way, an active matrix driving type liquid crystal display device illustrated in FIG. 17 is completed.

This embodiment can be implemented by being freely combined with the third embodiment.

Embodiment 5

In the fifth embodiment, a case of manufacturing a semiconductor film by a different method from that in the first embodiment will be described.

In FIG. 20A, reference symbol 100 denotes a substrate which includes an insulating surface. In FIG. 20A, a glass substrate, a quartz substrate, a ceramic substrate or the like can be used as the substrate 100. Alternatively, a substrate such as a silicon substrate, a metal substrate or a stainless substrate having an insulating film formed on the surface thereof may be used. It is also possible to use a plastic substrate having heat resistance against the treatment temperature in the steps of this embodiment.

As shown in FIG. 20A, first electrode 102a and 102b are first formed on the substrate 100. The first electrodes 102a and 102b may be formed out of a conductive substance. Typically, the first electrodes 102a and 102b can be formed out of alloy or a compound consisting of one or a plurality of elements selected from among aluminum (Al), tungsten (W), molybdenum (Mo), tantalum (Ta) and titanium (Ti). Alternatively, Layered conductive films may be used as the first electrodes.

A first insulating film 101 is formed on the insulating surface of the substrate 100 to cover the first electrodes 102a and 102b. The first insulating film 101 is formed out of a silicon oxide film, a silicon nitride film, a silicon oxide nitride film ($SiO_xN_y$) or the like. As a typical example, a film having a two-layer structure in which a first silicon oxide nitride film formed using $SiH_4$, $NH_3$ and $N_2O$ as reaction gas and having a thickness of 50 to 100 nm and a second silicon oxide nitride film formed using $SiH_4$ and $N_2O$ as reaction gas and having a thickness of 100 to 150 nm are layered, is used as the first insulating film 101. It is also preferable that a silicon nitride film (SiN film) or the second silicon oxide nitride film ($SiN_xO_y$ film, where X>>Y) is used as one layer of the first insulating film. During gettering, nickel tends to move toward a region having a high oxygen concentration. It is, therefore, quite effective to use the silicon nitride film as the first insulating film which contacts with the semiconductor film. Alternatively, a film having a three-layer structure in which a first silicon oxide nitride film, a second silicon oxide nitride film and a silicon nitride film are sequentially layered may be used as the first insulating film 101.

Next, a first semiconductor layer 103 having an amorphous structure is formed on the first insulating film 101. A semiconductor material mainly containing silicon is used to form the first semiconductor layer 103. Typically, an amorphous silicon film or an amorphous silicon germanium film is used as the first semiconductor layer 103. The first semiconductor layer 103 is formed to have a thickness of 10 to 100 nm by the plasma CVD method, a low pressure CVD method or a sputtering method. It is preferable that the concentration of impurities such as oxygen and nitrogen contained in the film of the first semiconductor layer 103 having an amorphous structure, is decreased to not higher than $5\times10^{18}/cm^3$ (atom concentration measured by secondary ion mass spectroscopy). These impurities prevent later crystallization and, even after the crystallization, increase the density of a trapping center or recombination center. For these reasons, it is preferable to use not only high impurity material gas but also use an extreme high vacuum CVD system which includes a mirror treatment (field polishing) reaction chamber or an oil-free evacuation system.

Next, to crystallize the first semiconductor layer 103 having an amorphous structure, a technique described in Japanese Patent Unexamined Application Publication No. 8-78329 is employed in this embodiment. The technique described therein is for selectively adding a metal element which accelerates crystallizing an amorphous silicon film, carrying out a heat treatment and thereby forming a semiconductor layer having a crystal structure spreading from the metal element added regions. A nickel acetate solution which contains a metal element (nickel in this embodiment) of 1 to 100 ppm in weight terms, which has a catalytic action for accelerating crystallization, is coated on the surface of the first semiconductor layer 103 having an amorphous structure by a spinner to thereby form a nickel containing layer 104 (FIG. 20B). Instead of the coating means, a means for forming a very thin film by sputtering, deposition or plasma treatment may be used to form the nickel containing layer 104. While an example of coating the nickel acetate solution on the entire surface of the first semiconductor layer 103 is shown in this embodiment, it is also possible to form a mask and to selectively form a nickel containing layer using the mask.

Next, a heat treatment is carried out for crystallization. In this case, silicide is formed in the sections of the semiconductor layer contacted by the metal element which accelerates the crystallization of the semiconductor and crystallization progresses while centering around the silicide. As a result, the first semiconductor layer 105 having an amorphous structure shown in FIG. 20C is formed. It is preferable that the concentration of oxygen contained in the first semiconductor layer 105 thus crystallized is set at not higher than $5\times10^{18}/cm^3$. In this embodiment, after a heat treatment (at 450° C. for 1 hour) for dehydrogenation, the heat treatment (at 550 to 650° C. for 4 to 24 hours) for crystallization is carried out. If crystallization is conducted by the irradiation of strong light, one of infrared light, visible light and ultraviolet light or a combination thereof can be used. Typically, light radiated from a halogen lamp, a metal halide lamp, a xenon arc lamp, a carbon arc lamp, a high pressure sodium lamp or a high pressure mercury lamp is used. The lamp light source is turned on for 1 to 60 seconds, preferably 30 to 60 seconds one to ten times so as to instantaneously heat the semiconductor layer up to about 600 to 1000° C. If necessary, a heat treatment for discharging hydrogen contained in the first semiconductor layer 105 of the amorphous structure before the strong light is applied to the first semiconductor layer 105 may be carried out. Alternatively, the heat treatment and the strong light irradiation may be conducted simultaneously. In light of productivity, it is preferable to crystallize the semiconductor by the irradiation of strong light.

The metal element (nickel in this embodiment) remains in the first semiconductor layer 105 thus obtained. The metal element remains at a mean concentration higher than $1\times10^{19}/cm^3$ even if they are not uniformly distributed in the film. Although it is possible to form various semiconductor elements including TFT's even in such a state, the element is removed by the following method in this embodiment.

To enhance a crystallization rate (the rate of crystal components in the entire product of the film) and to repair defects left in crystal grains, a laser beam (first laser beam) is applied to the first semiconductor layer 105 having an amorphous structure in the atmosphere or in an oxygen atmosphere. If the laser beam (first laser beam) is applied to the first semiconductor layer 105, irregularities are formed on the surface thereof and a thin oxide film 106 is formed (FIG. 20D). This laser beam (first laser beam) may be an excimer laser beam having a wavelength of not less than 400 nm or the second and third higher harmonic waves of the YAG laser. Alternatively, a beam emitted from an ultraviolet lamp may be used in place of the excimer laser beam.

Furthermore, an oxide film (referred to as "chemical oxide") is formed using an ozone containing aqueous solution (typically ozone water) to thereby form a barrier layer 107 which consists of the oxide film and has a total thickness of 1 to 10 nm. A second semiconductor layer 108 containing a rare gas element is formed on this barrier layer 107 (FIG. 20E). In this embodiment, the oxide film 106 formed as a result of the application of the laser beam is regarded as a part of the barrier layer. This barrier layer 107 functions as an etching stopper when only the second semiconductor layer 108 is selectively removed in a later step. Even if an aqueous solution in which sulfuric acid, hydrochloric acid, nitric acid or the like is mixed with oxygenated water, in place of the ozone containing aqueous solution is used, the chemical oxide can be formed. Alternatively, as another method of forming the barrier layer 107, ultraviolet rays may be irradiated to the first semiconductor layer 105 in an oxygen atmosphere to thereby generate ozone and to oxidize the surface of the semiconductor layer 105 having an amorphous structure. As yet another formation method, the barrier layer 107 may be formed by depositing an oxide film having a thickness of about 1 to 10 nm by the plasma CVD method, the sputtering method, the deposition method or the like. Further, as still another method, a thin oxide film may be formed as the barrier layer 107 by heating the first semiconductor layer 105 up to about 200 to 350° C. in a clean oven. Although the barrier layer 107 is not limited to any specific layer as long as the barrier layer 107 is formed by any one of the above-stated methods or a combination thereof, it is necessary that the barrier layer 107 has a sufficient film property or thickness to enable nickel contained in the first semiconductor layer 105 to move to the second semiconductor layer 108 in a later gettering step.

In this embodiment, the second semiconductor layer 108 containing a rare gas element is formed by the sputtering method and a gettering site is formed (FIG. 20E). It is preferable that sputter conditions are appropriately adjusted so as not to add the rare gas element to the first semiconductor layer 105. As the rare gas element, one or a plurality of elements selected from among helium (He), neon (Ne), argon (Ar), krypton (Kr) and xenon (Xe) are employed. Among them, argon (Ar), which is an inexpensive gas, is preferable. In this embodiment, a target which consists of silicon is used in a rare gas element containing atmosphere to form the second semiconductor layer 108. There are two meanings to contain rare gas element ions as inert gas ions in the film. One is to form dangling bonds so as to distort the semiconductor layer. The other is to generate distortions between the lattices of the semiconductor layer. The distortions between the lattices of the semiconductor layer are generated conspicuously when an element, such as argon (Ar), krypton (Kr) or xenon (Xe), larger than silicon in atomic diameter is used. Further, by containing the rare gas element in the film, not only lattice distortions but also unpaired bonds are formed, contributing to the gettering action.

Furthermore, if the second semiconductor layer 108 is formed, using a target containing phosphorus which is a one-conductive type impurity element, not only gettering by the rare gas element but also gettering using the Coulomb force of phosphorus can be conducted.

In addition, since nickel tends to move to a region having a high oxygen concentration during the gettering, it is preferable that the concentration of oxygen contained in the second semiconductor layer 108 is set higher than that of oxygen contained in the first semiconductor layer 105, e.g., not lower than $5\times10^{18}/cm^3$.

Thereafter, a heat treatment is carried out to conduct gettering for decreasing the concentration of the metal element (nickel) in the first semiconductor layer 105 or removing the metal element (nickel) (FIG. 20F). As the heat treatment for the gettering, a treatment for applying strong light or an ordinary heat treatment may be conducted. As a result of this gettering, the metal element moves in an arrow direction shown in FIG. 20F (i.e., a direction from the substrate side to the surface of the second semiconductor layer 108), thereby removing the metal element contained in the first semiconductor layer 105 or decreasing the concentration of the metal element. The moving distance of the metal element during the gettering may be at least the same as the thickness of the first semiconductor layer 105. With such a distance, it is possible to complete the gettering in relatively short time. In this embodiment, nickel is entirely moved to the second semiconductor layer 108 so as not to segregate nickel in the first semiconductor layer 105. As a result, nickel is hardly contained in the first semiconductor layer 105. Namely, gettering is sufficiently conducted so that the nickel concentration of the film becomes not higher than $1\times10^{18}/cm^3$, preferably not higher than $1\times10^{17}/cm^3$.

Furthermore, depending on the conditions of this gettering heat treatment, it is possible to enhance the crystallization rate of the first semiconductor layer 105 and to repair the defects left in crystal grains, i.e., to improve crystallinity simultaneously with the gettering.

In this specification, gettering means that a metal element in a gettering target region (corresponding to the first semiconductor layer 105 in this embodiment) is discharged by heat energy and diffused and thereby moved to a gettering site. Accordingly, the gettering depends on treatment temperature, which follows that the gettering can be conducted in shorter time as the treatment temperature is higher.

In addition, if a strong light irradiation treatment is used as the heat treatment for this gettering, a lamp light source for heating is turned on for 1 to 60 seconds, preferably 30 to 60 seconds repeatedly one to ten times, preferably two to six times. The luminous intensity of the lamp light source may be arbitrarily set. However, it is necessary to set the luminous intensity thereof so that the semiconductor layer is instantaneously heated up to about 600 to 1000° C., preferably about 700 to 750° C.

Additionally, if the gettering is conducted by a heat treatment, the heat treatment may be carried out at a temperature of 450 to 800° C. for 1 to 24 hours, e.g., at 550° C. for 14 hours in a nitrogen atmosphere. Attentively, strong light may be irradiated to the semiconductor layer in addition to the heat treatment.

Next, using the barrier layer 107 as an etching stopper, only the second semiconductor layer denoted by the reference symbol 106 is removed and then the barrier layer 107 consisting of the oxide film is removed. As a method of selectively etching only the second semiconductor layer, dry etching using $ClF_3$ without using plasma or wet etching using an alkali solution such as an aqueous solution containing hydrazine or tetraethyl ammonium hydroxide (expressed by a chemical formula $(CH_3)_4NOH$) can be conducted. In addition, if the nickel concentration of the surface of the barrier layer is measured by TXRF after removing the second semiconductor layer, the nickel concentration is detected to be high. It is, therefore, preferable to remove the barrier layer using fluorine containing etchant.

Next, a laser beam (second laser beam) is applied to the first semiconductor layer 105 having a crystal structure either in a nitrogen atmosphere or in vacuum. If the laser beam (second laser beam) is irradiated, the difference in level (P-V value: Peak to Valley value; difference in height between maximum and minimum) among the irregularities formed by the irradiation of the first laser beam is decreased, i.e., the surface is flattened (FIG. 20G). The P-V value of the irregularities may be observed with an AFM (atomic force microscope). Specifically, the P-V value of the irregularities formed by the irradiation of the first laser beam of about 10 nm to 30 nm can be decreased to not lower than 5 nm by the irradiation of the second laser beam. Depending on the conditions, the P-V value can be decreased to not lower than 1.5 nm. As this laser beam (second laser beam), an excimer laser beam having a wavelength of not more than 400 nm or the second and third higher harmonic waves of the YAG laser can be employed. Alternatively, a light beam emitted from a ultraviolet lamp may be used in place of the excimer laser beam.

The energy density of the second laser beam is set higher than that of the first laser beam, preferably higher than that of the first laser beam by 30 to 60 $mJ/cm^2$. It is noted, however, if the energy density of the second laser beam is higher than that of the first laser beam by 90 $mJ/cm^2$ or more, surface roughness tends to increase and crystallinity tends to deteriorates or crystal grains tend to be transformed to crystallites, thereby deteriorating the characteristics of the first semiconductor layer.

Although the energy density of the second laser beam is higher than that of the first laser beam, the crystallinity of the semiconductor layer hardly changes before and after the irradiation. In addition, crystal states such as grain diameters hardly change. In other words, it is considered that the irradiation of the second laser beam is intended only to flatten the surface of the semiconductor layer.

The flattening of the semiconductor layer having a crystal structure by the irradiation of the second laser beam possesses high merit. For example, by improving the flatness of the semiconductor layer, it is possible to make the second insulating film to be formed in a later step as a gate insulating film thinner and to thereby improve the mobility of the TFT. In addition, by improving the flatness, it is possible to decrease OFF current in the manufacturing of the TFT.

Furthermore, the irradiation of the second laser beam has an advantage in that if the rare gas element is inadvertently added to the first semiconductor layer when the gettering site is formed, the rare gas element in the semiconductor layer having a crystal structure can be removed or decreased.

Next, using a well-known patterning technique, the first semiconductor layer 109 thus flattened is patterned to thereby form a semiconductor film having a desired shape.

This embodiment can be carried out freely in combination with the first to fourth embodiments.

Embodiment 6

In the sixth embodiment, a case of forming a semiconductor film by a thermal crystallization method using a catalytic element is described. If the catalytic element is used, it is preferable to use the technique disclosed in Japanese Patent Unexamined Application Publication No. 7-130652 or 8-78329.

Figure 21A:
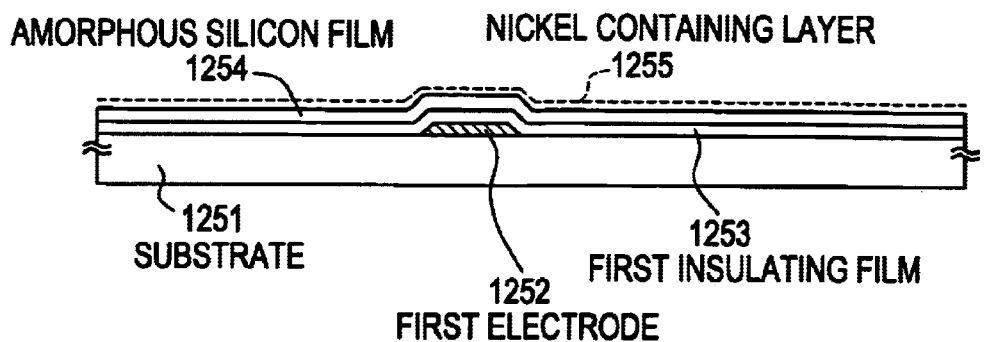
FIGS. 21A and 21B show semiconductor layer crystallization steps.
Figure 21B:
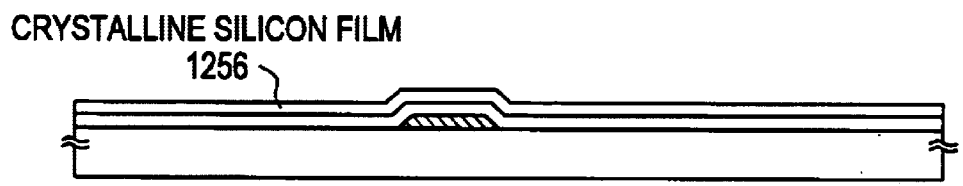

A case of applying the technique disclosed in Japanese Patent Unexamined Application Publication No. 7-130652 to the present invention will first be described with reference to FIGS. 21A and 21B. First, a first electrode 1252 is formed on a substrate 1251. A first insulating film 1253 is then formed on the substrate 1251 to cover the first electrode 1252, and an amorphous silicon film 1254 is formed on the first insulating film 1253. Further, a nickel acetate solution containing nickel of 10 ppm in weight terms is coated on the resultant substrate to thereby form a nickel containing layer 1255 (FIG. 21A).

Next, after a dehydrogenation step at a temperature of 500° C. for 1 hour, a heat treatment is conducted at a temperature of 500 to 650° C. for 4 to 12 hours, e.g., at 550° C. for 8 hours, thereby forming a crystalline silicon film 1256. The crystalline silicon film 1256 thus obtained exhibits quite excellent crystallinity (FIG. 21B).

Meanwhile, according to the technique disclosed in Japanese Patent Unexamined Application Publication No. 8-78329, an amorphous semiconductor film can be selectively crystallized by selectively adding a catalytic element thereto. A case of applying this technique to the present invention will be described with reference to FIGS. 22A and 22B.

First, a first electrode 1302 is formed on a glass substrate 1301. A first insulating film 1303 is formed on the substrate 1301 to cover the first electrode 1302, and an amorphous silicon film 1304 is formed on the first insulating film 1303. A silicon oxide film 1305 is continuously formed on the amorphous silicon film 1304. At this moment, the thickness of the silicon oxide film 1305 is 150 nm.

Figure 22A:
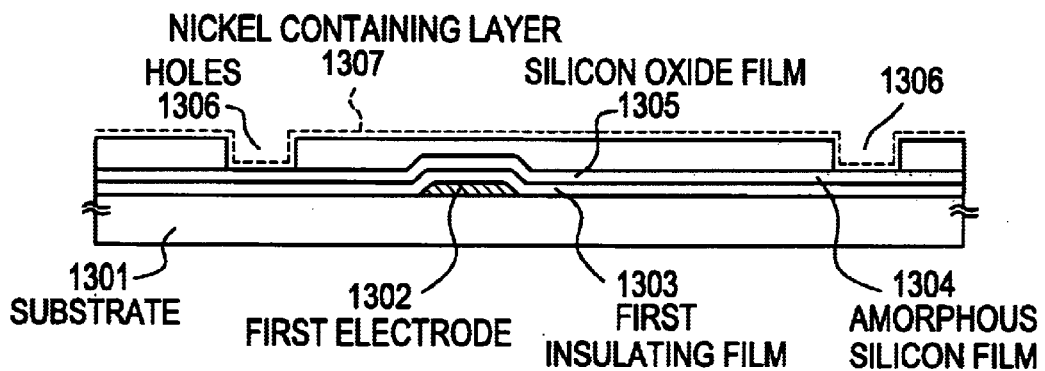
FIGS. 22A and 22B show semiconductor layer crystallization steps.

Next, the silicon oxide film 1305 is patterned to thereby selectively form contact holes 1306 and a nickel acetate solution containing nickel of 10 ppm in weight terms is coated on the resultant substrate. As a result, a nickel containing layer 1307 is formed. The nickel containing layer 1307 contacts with the amorphous silicon film 1304 only at the bottoms of the contact holes 1306 (FIG. 22A).

Figure 22B:
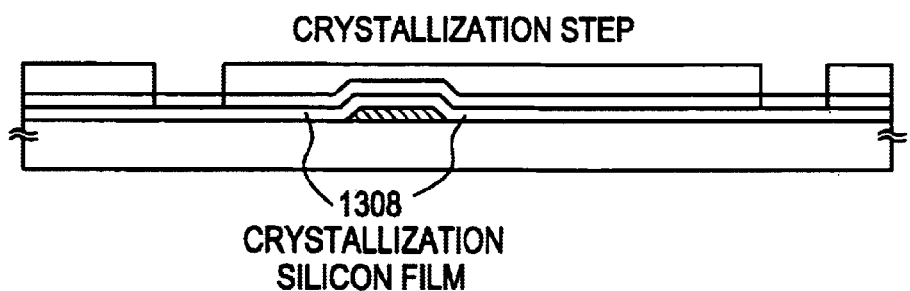

Thereafter, a heat treatment is carried out at a temperature of 500 to 650° C. for 4 to 24 hours, e.g., at 570° C. for 14 hours, thereby forming a crystalline silicon film 1308. In this crystallization process, parts of the amorphous silicon film 1304 which contact with nickel are first crystallized and the crystallization proceeds therefrom in a lateral direction. The crystalline silicon film 1308 thus formed is constituted so that stick-like or needle-like crystals are collected together. Since each crystal grows with a certain directivity macroscopically, the crystalline silicon film 1308 is advantageous of having uniform crystallinity (FIG. 22B).

The catalytic element available in the above-stated two techniques may be germanium (Ge), iron (Fe), palladium (Pd), tin (Sn), lead (Pb), cobalt (Co), platinum (Pt), copper (Cu) or gold (Au) in place of nickel (Ni).

By forming the crystalline semiconductor film (including a crystalline silicon film and a crystalline silicon germanium film) using one of the above-stated techniques and patterning the crystalline semiconductor film, a semiconductor layer of a crystalline TFT can be formed. Although the TFT formed out of the crystalline semiconductor film by the technique described in this embodiment exhibits excellent characteristics, it is required to ensure high reliability, accordingly. Nevertheless, by adopting the TFT structure of the present invention, it is possible to manufacture a TFT while making the most use of the technique in this embodiment.

Figure 23A:
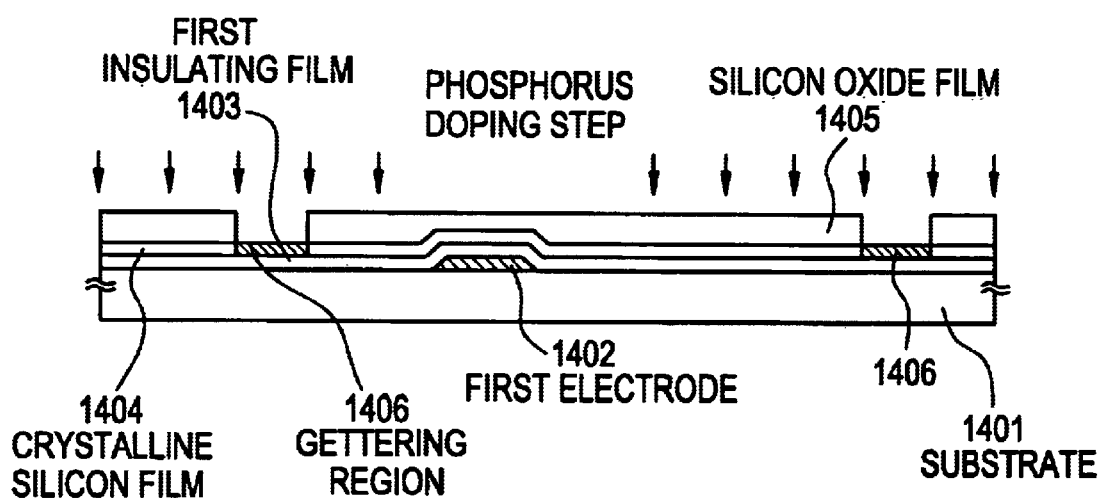
FIGS. 23A and 23B show semiconductor layer crystallization steps.
Figure 23B:
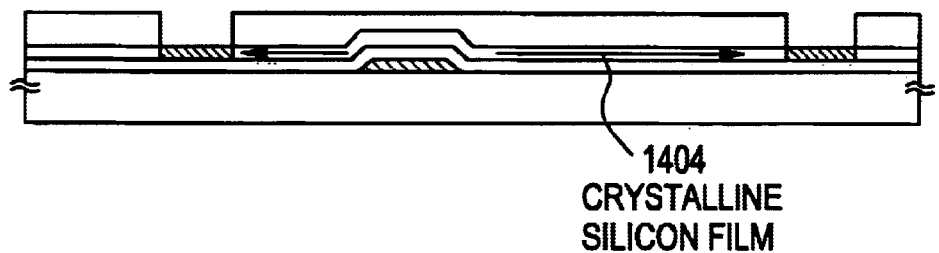

Next, a case of executing steps of forming a crystalline semiconductor film using an amorphous silicon film as an initial film and using the catalytic element stated above, and then removing the catalytic element from the crystalline semiconductor film, will be described with reference to FIGS. 23A and 23B. In this embodiment, the steps are executed using the technique described in Japanese Patent Unexamined Application Publication No. 10-135468 or 10-135469.

The technique described therein is for removing a catalytic element used to crystallize an amorphous semiconductor film using the gettering action of phosphorus after the crystallization. By utilizing this technique, it is possible to decrease the concentration of the catalytic element in the crystalline semiconductor film to lower than $1 \times 10^{17}$ atms/$cm^3$, preferably $1 \times 10^{16}$ atms/$cm^3$.

In this embodiment, a no-alkali glass substrate represented by a 1737 substrate manufactured by Corning Inc. is used as a substrate 1401. As shown in FIG. 23A, a first electrode 1402 is formed on the substrate 1401. A first insulating film 1403 is formed on the substrate 1401 to cover the first electrode 1402 and a crystalline silicon film 1404 is formed on the first insulating film 1403.

A silicon oxide film 1405 having a thickness of 150 nm is formed on the surface of the crystalline silicon film 1404 as a-mask, contact holes are formed by patterning and regions in which part of the crystalline silicon film 1404 is exposed are provided. Thereafter, a step of adding phosphorus is executed to thereby provide a region (gettering region) 1406 in which phosphorus is added to the crystalline silicon film 1404.

In this state, if a heat treatment is carried out at a temperature of 550 to 800° C. for 5 to 24 hours, e.g., 600° C. for 12 hours in a nitrogen atmosphere, the region 1406 in which phosphorus is added to the crystalline silicon film 1404 acts as a gettering site, making it possible to segregate the catalytic element remaining in the crystalline silicon film 1404 to the gettering region 1406 in which phosphorus is added to the crystalline silicon film 1404.

The oxide silicon film 1405 serving as a mask and the phosphorus-added region 1406 are etched away, whereby the crystalline silicon film having the concentration of the catalytic element, used in the crystallization step, decreased to $1 \times 10^{17}$ atms/$cm^3$ can be obtained. This crystalline silicon film can be used as the semiconductor layer of the TFT according to the present invention as it is.

This embodiment can be carried out freely in combination with the first to fourth embodiments.

Embodiment 7

In the seventh embodiment, the configuration of the semiconductor device according to the present invention will be described.

Figure 24:
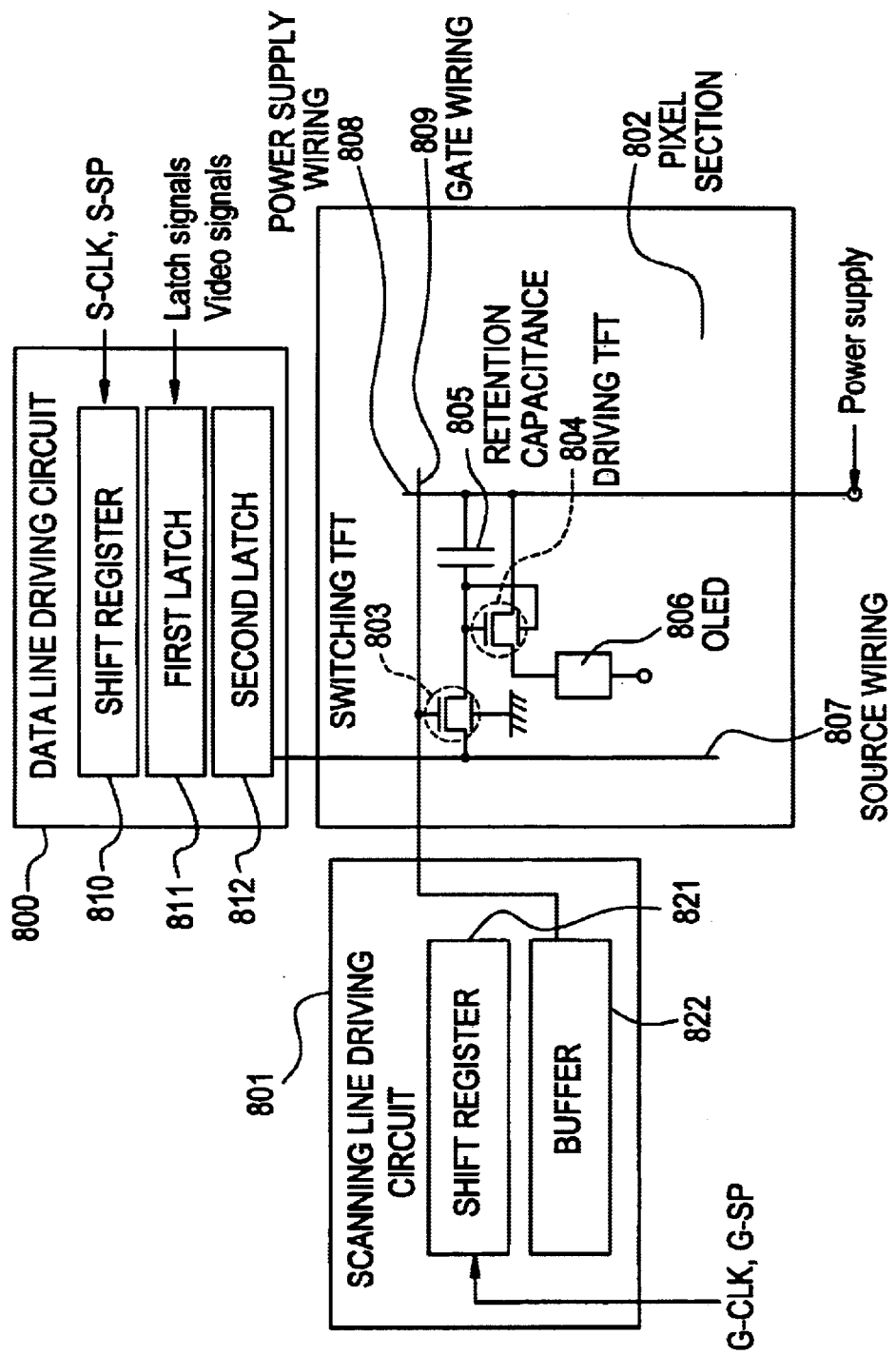
FIG. 24 is a block diagram showing the configuration of a luminous device.

FIG. 24 is a block diagram of a luminous device which is one example of the semiconductor device according to the present invention. The luminous device corresponds to an OLED (organic light emitting device) panel having an OLED, which is formed on a substrate, sealed between the substrate and a cover material. An OLED module in which IC's and the like including a controller are mounted on the OLED panel is sometimes referred to as a luminous device.

The OLED includes a layer containing an organic compound (organic light emitting material) which causes electroluminescence which occurs by applying an electric field to the organic compound, an anode layer and a cathode layer. As the luminescence of the organic compound, there are luminescence (fluorescence) which occurs when light is returned from a singlet excitation state to a ground state and luminescence (phosphorescence) which occurs when light is returned from a triplet state to a ground state. The luminous device according to the present invention may use one of fluorescence and phosphorescence or both of them.

In this specification, all layers provided between the anode and cathode are defined as the organic light emitting layer as a whole. Specifically, the organic light emitting layer includes a light emitting layer, a hole injection layer, an electron injection layer, a hole transport layer, an electron transport layer and the like. Basically, the OLED has a structure in which an anode, a light emitting layer and a cathode are layered in this order. Beside this structure, the OLED sometimes has a structure in which an anode, a hole injection layer, a light emitting layer and a cathode are layered in this order or a structure in which an anode, a hole injection layer, a light emitting layer, an electron transport layer, a cathode and the like are layered in this order.

The configuration of the luminous device will be described with reference to FIG. 24 while taking the driving circuit of a luminous device which displays images using digital video signals as an example. The luminous device shown in FIG. 24 includes a data line driving circuit 800, a scanning line driving circuit 801 and a pixel section 802.

In the pixel section 802, a plurality of source wirings, a plurality of gate wirings and a plurality of power supply lines are formed. A region surrounded by the source wirings, the gate wirings and the power supply lines corresponds to pixels. In FIG. 24, only the pixel which has one source wiring 807, one gate wiring 809 and one power supply wiring 808 is typically shown among a plurality of pixels. Each pixel includes a switching TFT 803 which serves as a switching element, a driving TFT 804, a retention capacitance 805 and an OLED 806.

The gate electrode of the switching TFT 803 is connected to the gate wiring 809. The source and drain regions of the switching TFT 803 are connected to the source wiring 807 and the gate electrode of the driving TFT 804, respectively.

The source and drain regions of the driving TFT 804 are connected to the power supply line 808 and the OLED 806, respectively. The gate electrode of the driving TFT 804 and the power supply line 808 form the retention capacitance 805. It is not always necessary to form the retention capacitance 805.

The data line driving circuit 800 includes a shift register 810, a first latch 811 and a second latch 802. A clock signal (S-CLK) and a start pulse signal (S-SP) for the data line driving circuit are applied to the shift register 810. Latch signals and video signals for determining latch timing are applied to the first latch 811.

When the clock signal (S-CLK) and the start pulse signal (S-SP) are inputted into the shift register 810, a sampling signal which determines video signal sampling timing is generated and inputted into the first latch 811.

Alternatively, the sampling signal from the shift register 810 may be buffered and amplified by a buffer or the like and then inputted into the first latch 811. Since many circuits or circuit elements are connected to the wiring into which the sampling signal is inputted, the wiring has a high load capacitance (parasitic capacitance). This buffer is effective to prevent the "delay" of the rise or fall of the timing signal caused by the high load capacity.

The first latch 811 includes a plurality of stages of latches. The first latch 811 samples the inputted video signal synchronously with the sampling signal inputted thereinto and the sampled video signal is sequentially stored in the respective stages of latches.

A period required until the video signal is written to all the stages of latches in the first latch 811 is referred to as "line period". Actually, however, this line period to which a horizontal retrace line period is added, is often referred to as "line period". When one line period is finished, a latch signal is inputted into the second latch 812. During this time, the video signals written and held in the first latch 811 are all outputted to the second latch 812, and written to and held in all stages of latches in the second latch 812.

The first latch 811 which is completed with outputting the video signals to the second latch 812 sequentially writes another video signal based on the sampling signal from the shift register 810.

In the second line period, the video signals written to and held in the second latch 812 are inputted into the source wiring 809.

Meanwhile, the scanning line driving circuit 801 includes a shift register 821 and a buffer 822. A clock signal (G-CLK) and a start pulse signal (G-SP) for the scanning line driving circuit are applied to the shift register 821.

When the clock signal (G-CLK) and the start pulse signal (G-SP) are inputted into the shift register 821, a select signal which determines gate wiring select timing is generated in the shift register 821 and inputted into the buffer 822. The select signal inputted into the buffer 822 is buffered and amplified and then inputted into the gate wiring 809.

When the gate wiring 809 is selected, the switching TFT 803 having a gate electrode connected to the selected gate wiring 809 is turned on. The video signals inputted into the source wiring are inputted into the gate electrode of the driving TFT 804 through the switching TFT 803 which is turned on.

The switching of the driving TFT 804 is controlled based on information of 1 or 0 held by the video signals inputted into the gate electrode thereof. When the driving TFT 804 is turned on, the potential of the power supply line 808 is applied to the pixel electrode of the OLED 806 and the OLED 805 thereby emits light. When the driving TFT 804 is turned off, the potential of the power supply line 808 is not applied to the pixel electrode of the OLED 806 and the OLED 806 does not emit light.

In the circuits of the data line driving circuit 800 and those of the scanning line driving circuit 801 provided in the luminous device shown in FIG. 24, the first and second electrodes of each TFT are electrically connected to each other. By applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Accordingly, compared with a TFT which includes only one electrode, the TFT can increase ON current. It is thereby possible to decrease driving voltage. In addition, since ON current can be increased, the TFT can be made small in size (the channel width thereof can be particularly made small). It is thereby possible to improve the integration density of the TFT.

Furthermore, in the pixel section 802, a common voltage is applied to one of the first and second electrodes of the switching TFT 803 used as a switching element. By doing so, it is possible to suppress threshold irregularity and to suppress OFF current compared with the TFT which includes only one electrode.

On the driving TFT 804 for supplying a current to the OLED 806, the first electrode is electrically connected to the second electrode. As a result, it is possible to increase ON current compared with the TFT which includes only one electrode. The configuration of the driving TFT is not limited to this configuration. It is also possible that a common voltage is applied to one of the first and second electrodes without electrically connecting the first electrode to the second electrode. Alternatively, a thin film transistor of an ordinary configuration in which only one electrode is provided, may be included in the driving TFT.

Figure 25:
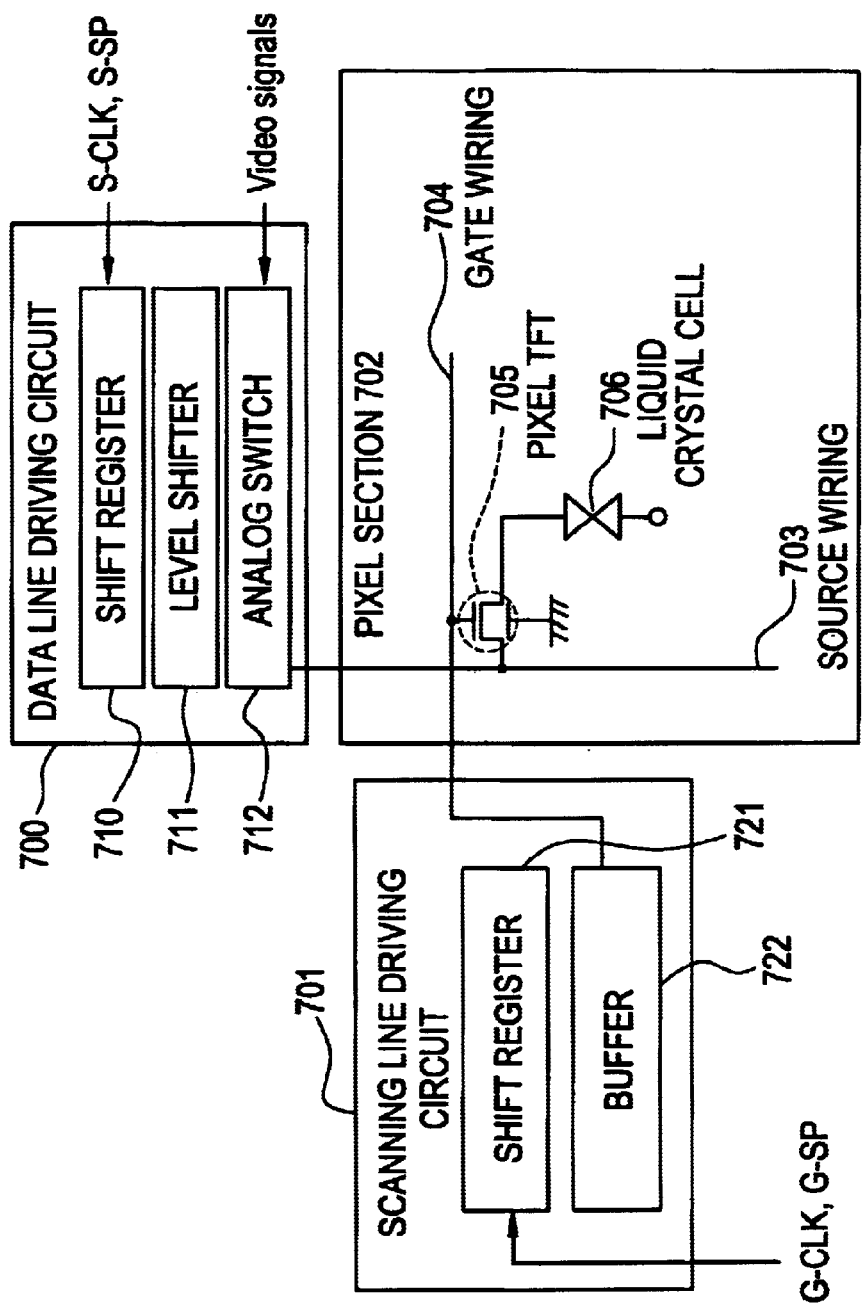
FIG. 25 is a block diagram showing the configuration of a liquid crystal display device.

Next, FIG. 25 shows the configuration of an ordinary liquid crystal display device. An element substrate shown in FIG. 25 includes a data line driving circuit 700, a scanning line driving circuit 701 and a pixel section 702.

In the pixel section 702, a plurality of source wirings and a plurality of gate wirings are formed. A region surrounded by the source wirings and the gate wirings corresponds to pixels. In FIG. 25, only the pixel which includes one source wiring 703 and one gate electrode 704 is typically shown among a plurality of pixels. Each pixel includes a pixel TFT 705 which serves as a switching element and a liquid crystal cell 706.

The liquid crystal cell 706 includes a pixel electrode, an opposed electrode and a liquid crystal provided between the pixel electrode and the opposed electrode.

The gate electrode of the pixel TFT 705 is connected to the gate wiring 704. The source and drain regions of the pixel TFT 705 are connected to the source wiring 703 and the pixel electrode included in the liquid crystal cell 706, respectively.

The data line driving circuit 700 includes a shift register 710, a level shifter 711 and an analog switch 712. A clock signal (S-CLK) and a start pulse signal (S-SP) for the data line driving circuit are applied to the shift register 710. Video signals are applied to the analog switch 712.

When the clock signal (S-CLK) and the start pulse signal (S-SP) are inputted into the shift register 710, a sampling signal which determines video signal sampling timing is generated in the shift register 710 and inputted into the level shifter 711. The voltage of the sampling signal is amplified in the level shifter 711 and the resultant sampling signal inputted into the analog switch 712. The analog switch 712 samples the inputted video signals synchronously with the inputted sampling signal and inputs the sampled video signals into the source wiring 703.

Meanwhile, the scanning line driving circuit 701 includes a shift register 721 and a buffer 722. A clock signal (G-CLK) and a start pulse signal (G-SP) for the scanning line driving circuit are applied to the shift register 721.

When the clock signal (G-CLK) and the start pulse signal (G-SP) are inputted into the shift register 721, a select signal which determines gate wiring select timing is generated in the shift register 721 and inputted into the buffer 722. The select signal inputted into the buffer 722 is buffered and amplified and then inputted into the gate wiring 704.

When the gate wiring 704 is selected, the pixel TFT 705 having a gate electrode connected to the selected gate wiring 704 is turned on. The sampled video signals inputted into the source wiring 703 are inputted into the pixel electrode of the liquid crystal cell 706 through the pixel TFT 705 which is turned on.

In the circuits of the data line driving circuit 700 and those of the scanning line driving circuit 701 provided in the liquid crystal display device shown in FIG. 25, the first and second electrodes of each TFT are electrically connected to each other. By applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Accordingly, compared with a TFT which includes only one electrode, the TFT can increase ON current. It is thereby possible to decrease driving voltage. In addition, since ON current can be increased, the TFT can be made small in size (the channel width thereof can be particularly made small). It is thereby possible to improve the integration density of the TFT.

Furthermore, in the pixel section 702, a common voltage is applied to one of the first and second electrodes of the pixel TFT 705 used as a switching element. By doing so, it is possible to suppress threshold irregularity and to suppress OFF current compared with the TFT which includes only one electrode.

This embodiment can be carried out freely in combination with the first to sixth embodiments.

Embodiment 8

In this embodiment, an appearance view of the light emitting device is described by using the present invention.

Figure 26A:
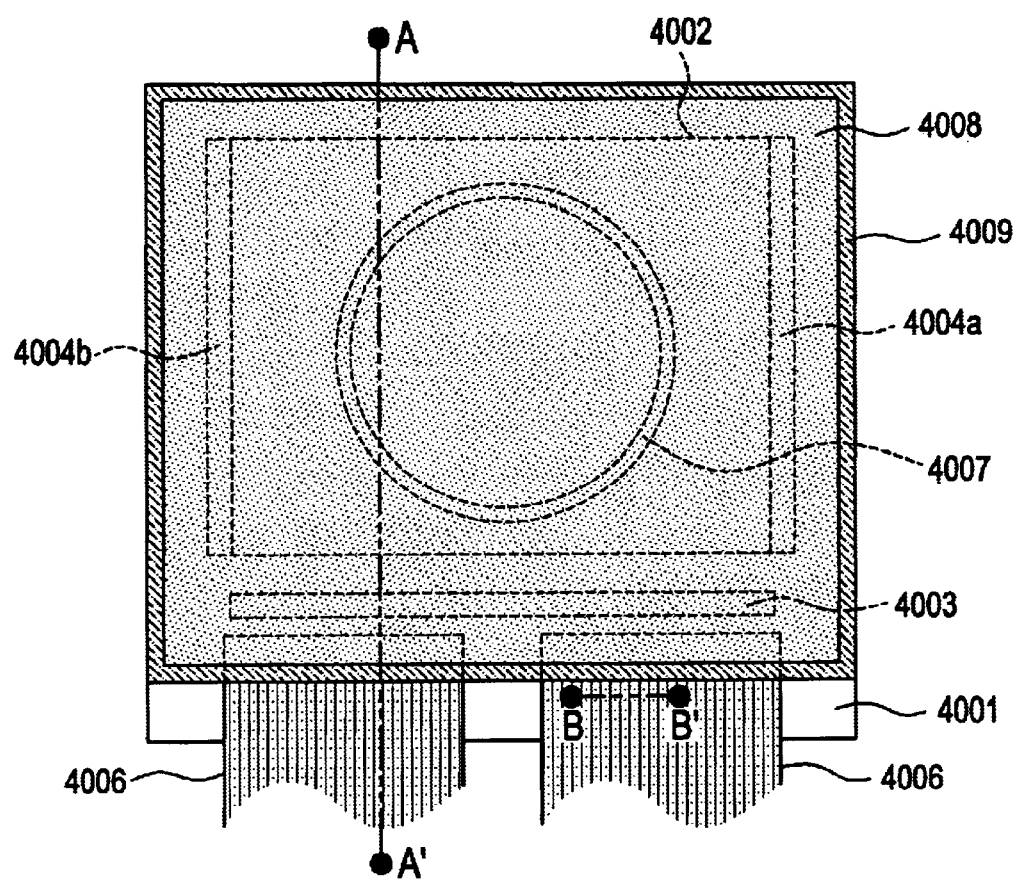
FIG. 26A is outside view of a luminous device and FIGS. 26B and 26C are cross-sectional views thereof.
Figure 26B:
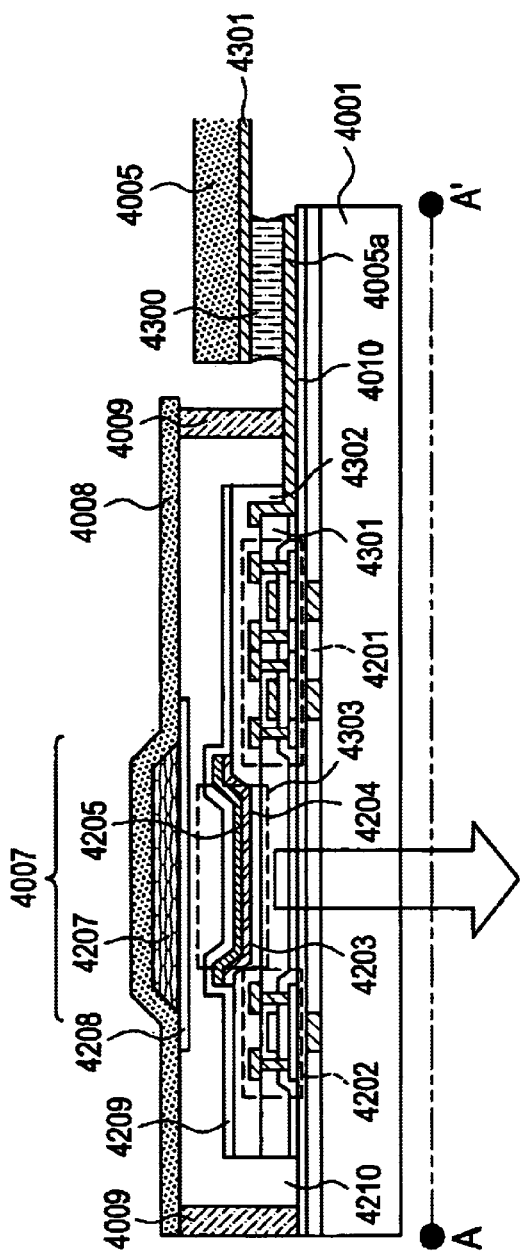
Figure 26C:
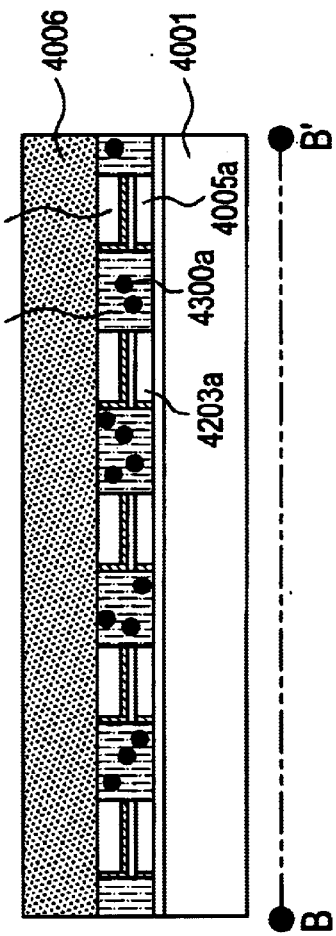

FIG. 26A is a top view of the light emitting device, FIG. 26B is a cross-sectional view taken along with a line A—A' of FIG. 26A, and FIG. 26C is a cross-sectional view taken along with a line B—B' of FIG. 26A.

A seal member 4009 is provided so as to surround a pixel portion 4002, a data line driver circuit 4003, and the first, second scanning line driver circuits 4004a, 4004b, which are provided on a substrate 4001. Further, a sealing material 4008 is provided on the pixel section 4002, the signal line driver circuit 4003, and the first, the second scanning line driver circuits 4004a, 4004b. Thus, the pixel section 4002, the data line driver circuit 4003, and the first, the second scanning line driver circuits 4004a, 4004b are sealed by the substrate 4001, the seal member 4009 and the sealing material 4008 together with a filler 4210.

Further, the pixel section 4002, the signal line driver circuit 4003, and the first, the second scanning line driver circuits 4004a, 4004b, which are provided on the substrate 4001, have a plurality of TFT's. In FIG. 26B, CMOS 4201 included in the data line driver circuit 4003 and a current controlling TFT (TFT controlling current which flows to the OLED) 4202 included in the pixel section 4002, which are formed on a base film 4010, are typically shown.

In this embodiment, the p-channel TFT or the n-channel TFT connected electrically to each other of the present invention is used as CMOS 4201, and the p-channel TFT, which has the p-channel TFT or the n-channel TFT connected electrically to each other of the present invention, is used as the driving TFT 4202. Further, the display pixel section 4002 is provided with a storage capacitor (not shown) connected to a gate electrode of the driving TFT 4202.

The third insulating film 4301 is formed on the CMOS 4201 and the driving TFT 4202, and a pixel electrode (anode) 4203 electrically connected to a drain of the driving TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, the fourth insulating film 4302 is formed on the pixel electrode 4203, and the fourth insulating film 4302 is formed with an opening portion on the pixel electrode 4203. In this opening portion, an organic light emitting layer 4204 is formed on the pixel electrode 4203. A known organic light emitting material or inorganic light emitting material may be used for the organic light emitting layer 4204. Further, there exists a low molecular weight (monomer) material and a high molecular weight (polymer) material as the organic light emitting materials, and both the materials may be used.

A known evaporation technique or application technique may be used as a method of forming the organic light emitting layer 4204. Further, the structure of the organic light emitting layer may take a lamination structure or a single layer structure by freely combining a hole injecting layer, a hole transporting layer, a light emitting layer, an electron transporting layer and an electron injecting layer.

A cathode 4205 made of a conductive film having light shielding property (typically, conductive film containing aluminum, copper or silver as its main constituent or lamination film of the above conductive film and another conductive film) is formed on the organic light emitting layer 4204. Further, it is desirable that moisture and oxygen that exist on an interface of the cathode 4205 and the organic light emitting layer 4204 are removed as much as possible. Therefore, such a device is necessary that the organic light emitting layer 4204 is formed in a nitrogen or rare gas atmosphere, and then, the cathode 4205 is formed without exposure to oxygen and moisture. In this embodiment, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light emitting layer 4204 and the cathode 4205 is formed. Further, a protective film 4209 is formed on the insulating film 4302 so as to cover the OLED 4303. The protective film 4209 is effective in preventing oxygen, moisture and the like from permeating the OLED 4303.

Reference numeral 4005a denotes a wiring drawn to be connected to the power supply line, and the wiring 4005a is electrically connected to a source region of the driving TFT 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or a substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

As shown in FIG. 26C, the pixel electrode 4203 is formed, and at the same time, a conductive film 4203a is formed so as to contact the drawn wiring 4005a.

Further, the anisotropic conductive film 4300 has a conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that this embodiment can be implemented by being freely combined with the first to third, sixth and seventh embodiments.

Embodiment 9

The semiconductor device of the present invention can be used with various electronic devices.

Such electronic devices include a video camera, a digital camera, a goggle-type display (head mount display), a car navigation system, a sound reproduction device (car audio equipment, audio equipment, or the like), a lap-top computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD), and includes a display for displaying the reproduced image), or the like. FIGS. 27A to 27F respectively show various specific examples of such electronic devices.

Figure 27A:
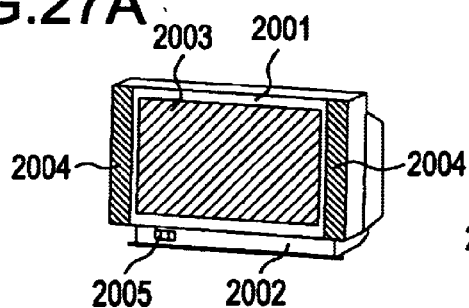
FIGS. 27A to 27H show electronic equipment each employing the semiconductor device according to the present invention.

FIG. 27A illustrates a display device which includes a frame 2001, a support table 2002, a display portion 2003, a speaker portion 2004, a video input terminal 2005, or the like. The display device of the present invention is completed by using the present invention with the display portion 2003 and other circuits. The display device includes all information display devices such as devices for a personal computer, a TV broadcast reception, an advertising display, or the like.

Figure 27B:
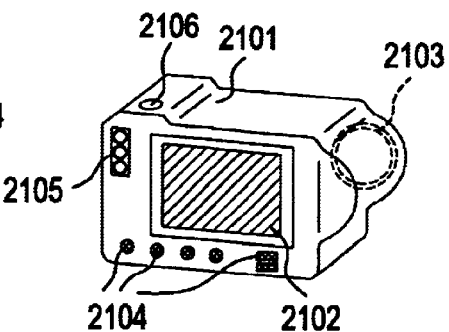

FIG. 27B illustrates a digital still camera which includes a main body 2101, a display portion 2102, an image receiving portion 2103, operation switches 2104, an external connecting portion 2105, a shutter 2106, or the like. The digital camera of the present invention can be obtained by utilizing the present invention with the display portion 2102 and other circuits.

Figure 27C:
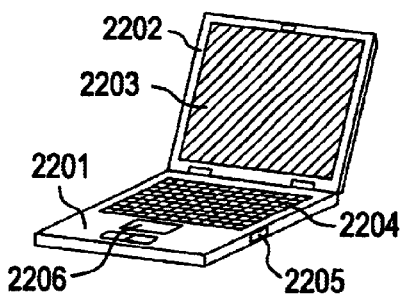

FIG. 27C illustrates a lap-top computer which includes a main body 2201, a casing 2202, a display portion 2203, a key board 2204, an external connecting port 2205, a pointing mouse 2206, or the like. The lap-top computer of the present invention can be obtained by utilizing the present invention with the display portion 2203 and other circuits.

Figure 27D:
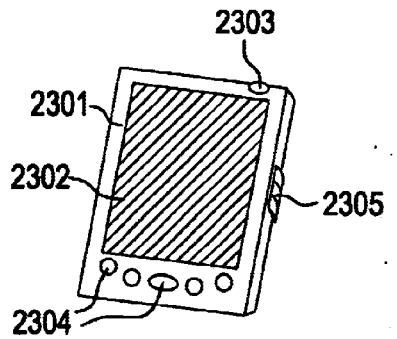

FIG. 27D illustrates a mobile computer which includes a main body 2301, a display portion 2302, switches 2303, an operation key 2304, an infrared port 2305, or the like. The mobile computer of the present invention can be obtained by utilizing the present invention with the display portion 2302 and other circuits.

Figure 27E:
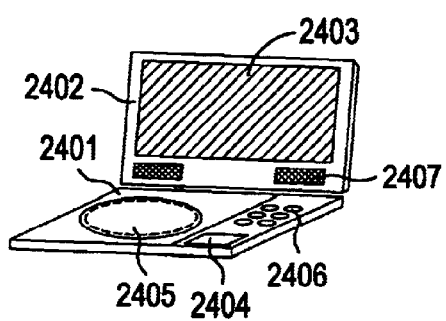

FIG. 27E illustrates a portable type image reproduction apparatus including a recording medium (more specifically, a DVD reproduction apparatus), which includes a main body 2401, a casing 2402, a display portion A 2403, a display portion B 2404, a reading portion of a recording medium (a DVD or the like) 2405, operation switches 2406, a speaker portion 2407, or the like. The display portion A 2403 is used mainly for displaying image information, while the display portion B 2404 is used mainly for displaying character information. The image reproduction apparatus can be obtained by utilizing the present invention with the display portion A 2403, the display portion B 2404 and other circuits. The image reproduction apparatus including a recording medium further includes a CD reproduction apparatus, a game machine or the like.

Figure 27F:
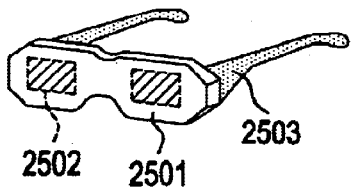

FIG. 27F illustrates a goggle type display (head mounted display) which includes a main body 2501, a display portion 2502 and an arm portion 2503. The goggle type display of the present invention can be obtained by utilizing the present invention with the display portion 2502 and other circuits.

Figure 27G:
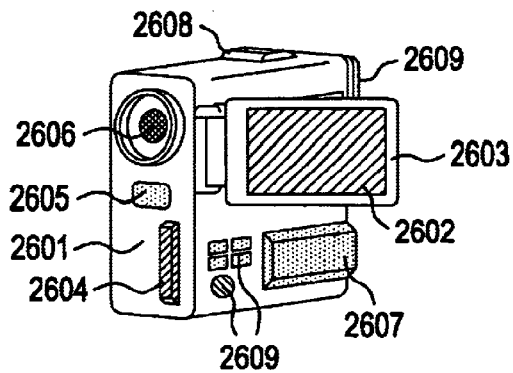

FIG. 27G illustrates a video camera which includes a main body 2601, a display portion 2602, a casing 2603, an external connecting port 2604, a remote control receiving portion 2605, an image receiving portion 2606, a battery 2607, an audio input portion 2608, an operation key 2609, or the like. The video camera of the present invention can be obtained by utilizing the present invention with the display portion 2602 and other circuits.

Figure 27H:
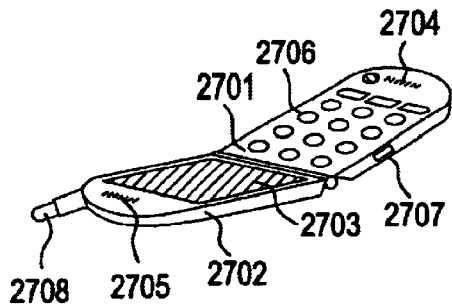

With now reference to FIG. 27H, a portable telephone is illustrated, which includes a main body 2701, a casing 2702, a display portion 2703, an audio input portion 2704, an audio output portion 2705, operation keys 2706, an external connecting port 2707, an antenna 2708, or the like. The portable telephone of the present invention can be obtained by utilizing the present invention with the display portion 2703 and other circuits.

As set forth above, the present invention can be applied variously to a wide range of electronic devices in all fields. The present invention can be implemented by freely combining it with the first to eighth embodiments.

Embodiment 10

In the tenth embodiment, the characteristics of the TFT according to the present invention if the first electrode and the second electrode of the TFT are electrically connected to each other, will be described.

Figure 28A:
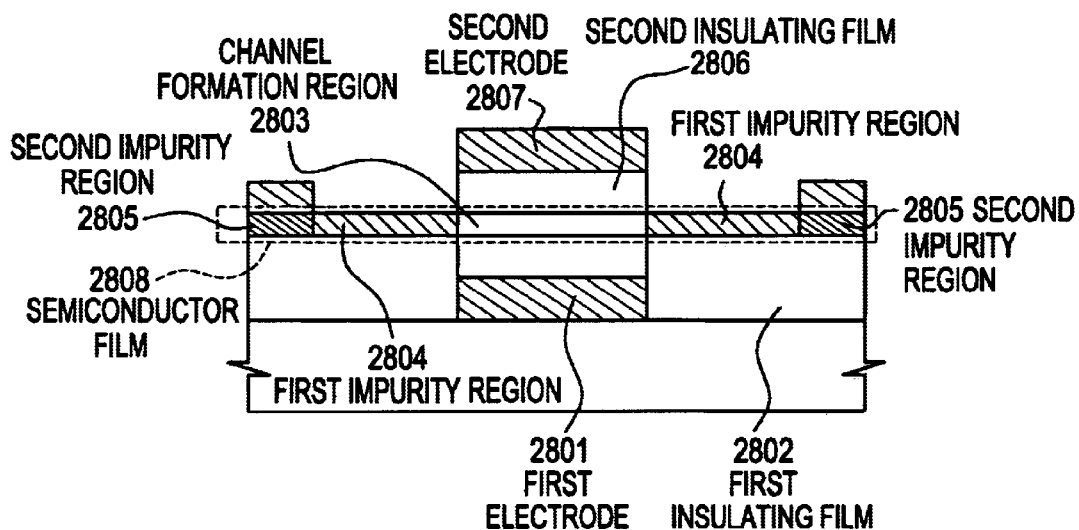
FIGS. 28A and 28B show the structure of the TFT used for simulations.
Figure 28B:
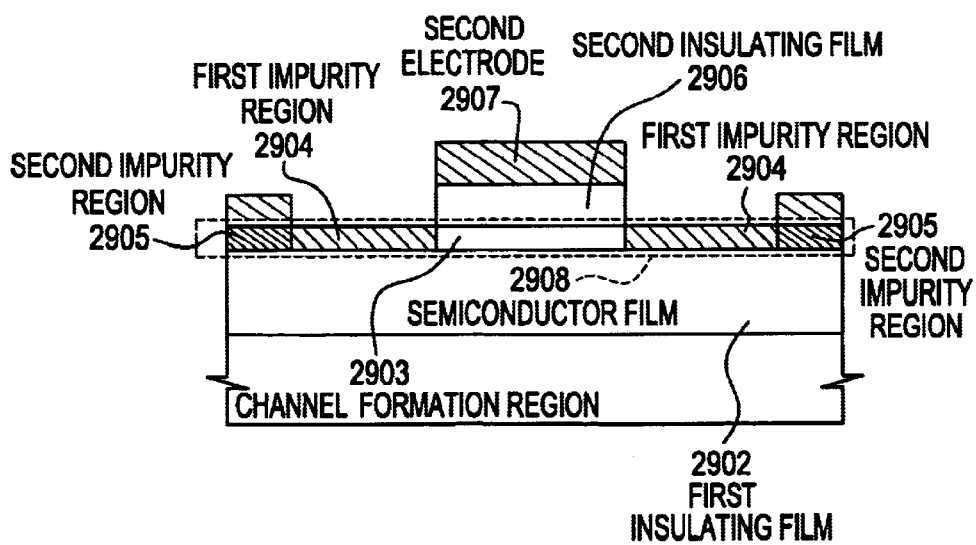

FIG. 28A shows the cross section of the TFT according to the present invention wherein the first and second electrodes are electrically connected to each other. FIG. 28B shows the cross section of a TFT which includes only one electrode for comparison purposes. FIG. 29 shows the relationships between gate voltage and drain current obtained by simulations with respect to the TFT's shown in FIGS. 28A and 28B, respectively.

The TFT shown in FIG. 28A includes a first electrode 2801, a first insulating film 2802 which contacts with the first electrode 2801, a semiconductor film 2808 which contacts with the first insulating film 2802, a second insulating film 2806 which contacts with the semiconductor film 2808, and a second electrode 2807 which contacts with the second insulating film 2806. The semiconductor film 2808 includes a channel formation region 2803, a first impurity region 2804 which contacts with the channel formation region 2803, and a second impurity region 2805 which contacts with the first impurity region 2804.

The first electrode 2801 is overlapped with the second electrode 2807 with the channel formation region 2803 put therebetween. The same voltage is applied to the first electrode 2801 and the second electrode 2807.

The first insulating film 2802 and the second insulating film 2806 are made of silicon oxide. The first electrode 2801 and the second electrode 2807 are made of aluminum (Al). A channel length is 7 $\mu$m, a channel width is 4 $\mu$m, the thickness of the first insulating film 2802 in the section in which the first gate electrode is overlapped with the channel formation region 2803 is 110 $\mu$m, and the thickness of the second insulating film 2806 in the section in which the second gate electrode is overlapped with the channel formation region 2803 is 110 $\mu$m. In addition, the thickness of the channel formation region 2803 is 50 nm and the length of the first impurity region 2804 in a channel length direction is 1.5 $\mu$m.

The channel formation region 2803 is doped with p-type allocation impurities of $1\times10^{17}$/cm$^3$, the first impurity region 2804 is doped with n-type allocation impurities of $3\times10^{17}$/cm$^3$ and the second impurity region 2805 is doped with n-type allocation impurities of $5\times10^{19}$/cm$^3$.

The TFT shown in FIG. 28B includes a first insulating film 2902, a second insulating film 2906 which contacts with the first insulating film 2902, and a second electrode 2907 which contacts with the second insulating film 2906. A semiconductor film 2908 includes a channel formation region 2903, a first impurity region 2904 which contacts with the channel formation region 2903, and a second impurity region 2905 which contacts with the first impurity region 2904.

The second electrode 2907 is overlapped with the channel formation region 2903.

The first insulating film 2902 and the second insulating film 2906 are made of silicon oxide. The second electrode 2907 is made of aluminum (Al). A channel length is 7 $\mu$m, a channel width is 4 $\mu$m, and a thickness of the second insulating film 2906 in the section in which the second gate electrode is overlapped with the channel formation region 2903 is 110 $\mu$m. In addition, the thickness of the channel formation region 2903 is 50 nm and the length of the first impurity region 2904 in a channel length direction is 1.5 $\mu$m.

The channel formation region 2903 is doped with p-type allocation impurities of $1\times10^{17}$/cm$^3$, the first impurity region 2904 is doped with n-type allocation impurities of $3\times10^{17}$/cm$^3$ and the second impurity region 2905 is doped with n-type allocation impurities of $5\times10^{19}$/cm$^3$.

In FIG. 29, the horizontal axis indicates gate voltage and the vertical axis indicates drain current. The value of drain current relative to gate voltage with respect to the TFT shown in FIG. 28A is denoted by a solid line and the value of drain current relative to gate voltage with respect to the TFT shown in FIG. 28B is denoted by a broken line.

From FIG. 29, the mobility of the TFT shown in FIG. 28A of 139 cm$^2$/V·s and the S value of 0.118 V/dec are obtained.

In addition, the mobility of the TFT shown in FIG. 28B of 86.3 cm$^2$/V·s and the S value of 0.160 V/dec are obtained. Judging from these, if the first and second electrodes are provided in a TFT and the two electrodes are electrically connected to each other, the mobility of the TFT is higher and the S value thereof is lower than those of a TFT which includes only one electrode.

Embodiment 11

In the eleventh embodiment, a case of manufacturing a semiconductor film by a different method from that of the first embodiment will be described.

Figure 30A:
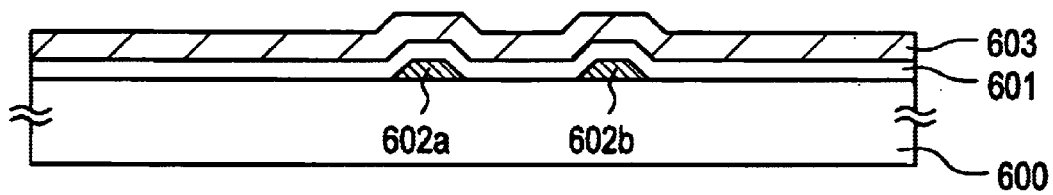
FIGS. 30A to 30C show semiconductor layer crystallization steps.

In FIG. 30A, reference symbol 600 denotes a substrate which includes an insulating surface. In FIG. 30A, a glass substrate, a quartz substrate, a ceramic substrate or the like can be used as the substrate 600. Alternatively, a substrate such as a silicon substrate, a metal substrate or a stainless substrate having an insulating film formed on the surface thereof may be used. It is also possible to use a plastic substrate having heat resistance against the treatment temperature in the steps of this embodiment.

As shown in FIG. 30A, first electrode 602a and 602b are first formed on the substrate 600. The first electrodes 602a and 602b may be formed out of a conductive substance. Typically, the first electrodes 602a and 602b can be formed out of alloy or a compound consisting of one or a plurality of elements selected from among aluminum (Al), tungsten (W), molybdenum (Mo), tantalum (Ta) and titanium (Ti). Attentively, layered conductive films may be used as the first electrodes.

A first insulating film 601 is formed on the insulating surface of the substrate 600 to cover the first electrodes 602a and 602b. The first insulating film 601 is formed out of a silicon oxide film, a silicon nitride film, a silicon oxide nitride film (SiO$_x$N$_y$) or the like. As a typical example, a film having a two-layer structure in which a first silicon oxide nitride film, which is formed using SiH$_4$, NH$_3$ and N$_2$O as a reaction gas and having a thickness of 50 to 100 nm, and a second silicon oxide nitride film, which is formed using SiH$_4$ and N$_2$O as a reaction gas and having a thickness of 100 to 150 nm, are layered, is used as the first insulating film 601. It is also preferable that a silicon nitride film (SiN film) or the second silicon oxide nitride film (SiN$_x$O$_y$ film, where X>>Y) is used as one layer of the first insulating film. During gettering, nickel tends to move toward a region having a high oxygen concentration. It is, therefore, quite effective to use the silicon nitride film as the first insulating film which contacts with the semiconductor film. Alternatively, a film having a three-layer structure, in which a first silicon oxide nitride film, a second silicon oxide nitride film and a third silicon nitride film are sequentially layered, may be used as the first insulating film 601.

Next, a first semiconductor layer 603 having an amorphous structure is formed on the first insulating film 601. A semiconductor material mainly containing silicon is used to form the first semiconductor layer 603. Typically, an amorphous silicon film or an amorphous silicon germanium film is used as the first semiconductor layer 603. The first semiconductor layer 603 is formed to have a thickness of 10 to 100 nm by the plasma CVD method, the low pressure CVD method or the sputtering method. It is preferable that the concentration of impurities such as oxygen and nitrogen contained in the film of the first semiconductor layer 603 having an amorphous structure, is decreased to not higher than $5\times10^{18}$/cm$^3$ (atom concentration measured by secondary ion mass spectroscopy). These impurities prevent later crystallization and, even after the crystallization, increase the density of a trapping center or recombination center. For these reasons, it is preferable to use not only high impurity material gas but also use an extreme high vacuum CVD system which includes a mirror treatment (field polishing) reaction chamber or an oil-free evacuation system.

Figure 30B:
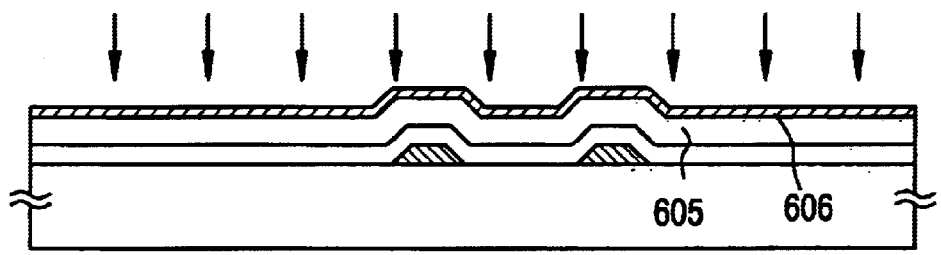

Next, the first semiconductor layer 603 is crystallized by a laser crystallization method to thereby form a second semiconductor layer 605 as shown in FIG. 30B. After a heat treatment (at 450° C. for 1 hour) for dehydrogenation, the semiconductor layer 603 is crystallized by the laser crystallization method. The irradiation of a laser beam is conducted in the atmosphere or in an oxygen atmosphere. An excimer laser or YAG laser of a pulse oscillation type or a continuous light emission type having a wavelength of not more than 400 nm can be used. If such a laser is used, it is preferable to adopt a method of linearly converging a laser beam emitted from a laser generator by an optical system, and applying the converged laser beam onto the semiconductor layer. Crystallization conditions may be appropriately selected by a person who executes the laser crystallization method. If the excimer laser is used, pulse oscillation frequency may be set at 300 Hz and laser energy density may be set at 100 to 400 mJ/cm$^2$ (typically 200 to 300 mJ/cm$^2$). If the YAG laser is used, pulse oscillation frequency may be set at 30 to 300 kHz and laser energy density may be set at 300 to 600 mJ/cm$^2$ (typically 350 to 500 mJ/cm$^2$). The laser beam which has been linearly converged to have a width of 100 to 1000 µm, e.g., 400 µm is applied to the entire surface of the substrate. The overlap rate of the linear laser beam at this time may be set at 50 to 90%.

If the laser beam (first laser beam) is applied, irregularities are formed on the surface of the second semiconductor layer and a thin oxide film 606 is formed thereon (FIG. 30B).

The oxide film 606 is removed using fluorine containing etchant.

Figure 30C:
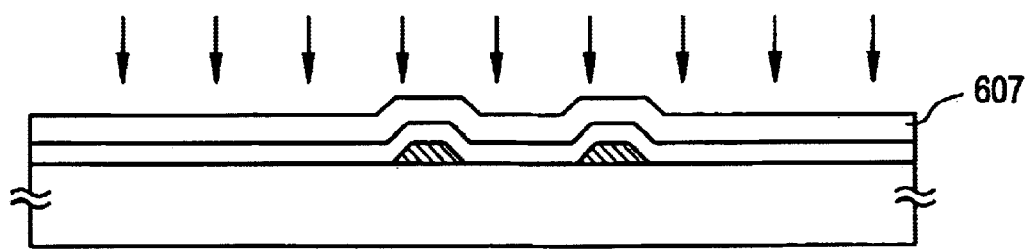
Figure 31A:
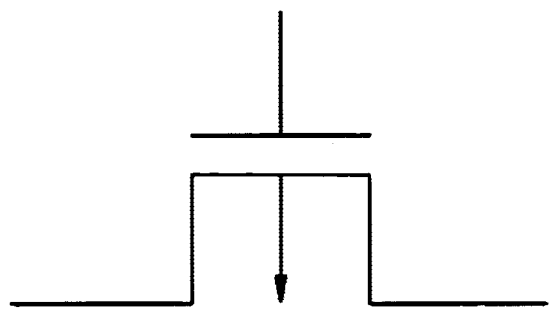
FIG. 31A is a circuit diagram of an ordinary TFT.
Figure 31B:
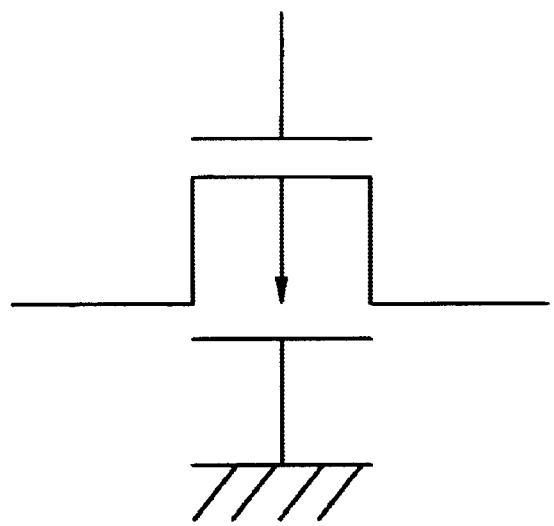
FIG. 31B is a circuit diagram of the TFT according to the present invention.
Figure 31C:
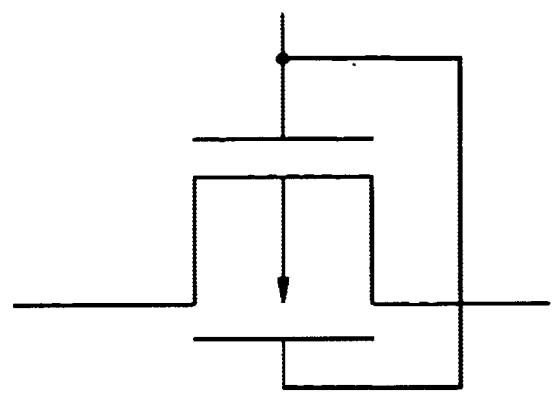
FIG. 31C is a circuit diagram of a TFT according to the present invention.

Next, a laser beam (second laser beam) is applied to the second semiconductor layer 605 having a crystal structure either in a nitrogen atmosphere or in vacuum. If the laser beam (second laser beam) is irradiated, the difference in level (P-V value: Peak to Valley value; difference in height between maximum and minimum) among the irregularities formed by the irradiation of the first laser beam is decreased, i.e., the surface is flattened (FIG. 30C). The P-V value of the irregularities may be observed with an AFM (atomic force microscope). Specifically, the P-V value of the irregularities formed by the irradiation of the first laser beam of about 10 nm to 30 nm can be decreased to not lower than 5 nm by the irradiation of the second laser beam. As this laser beam (second laser beam), an excimer laser beam having a wavelength of not more than 400 nm or the second and third higher harmonic waves of the YAG laser can be employed. Alternatively, a light beam emitted from an ultraviolet lamp may be used in place of the excimer laser beam.

The energy density of the second laser beam is set higher than that of the first laser beam, preferably higher than that of the first laser beam by 30 to 60 mJ/cm$^2$. It is noted, however, if the energy density of the second laser beam is higher than that of the first laser beam by 90 mJ/cm$^2$ or more, surface roughness tends to increase and crystallinity tends to deteriorate or crystal grains tend to be transformed to crystallites, thereby deteriorating the characteristics of the semiconductor layer.

Although the energy density of the second laser beam is higher than that of the first laser beam, the crystallinity of the semiconductor layer hardly changes before and after the irradiation. In addition, crystal states such as grain diameters hardly change. In other words, it is considered that the irradiation of the second laser beam is intended only to flatten the surface of the semiconductor layer.

The flattening of the semiconductor layer having a crystal structure by the irradiation of the second laser beam possesses high merit. For example, by improving the flatness of the semiconductor layer, it is possible to make thinner the second insulating film to be formed in a later step as a gate insulating film thinner and to thereby improve the mobility of the TFT. In addition, by improving the flatness, it is possible to decrease OFF current in the manufacturing of the TFT.

Next, using a well-known patterning technique, a third semiconductor layer 607 is patterned to thereby form a semiconductor film having a desired shape.

This embodiment can be carried out freely in combination with the first to tenth embodiments.

Embodiment 12

In the twelfth embodiment, the different configuration of the pixels of the luminous device which is one example of the semiconductor device according to the present invention from that described in the first embodiment will be described.

Figure 32:
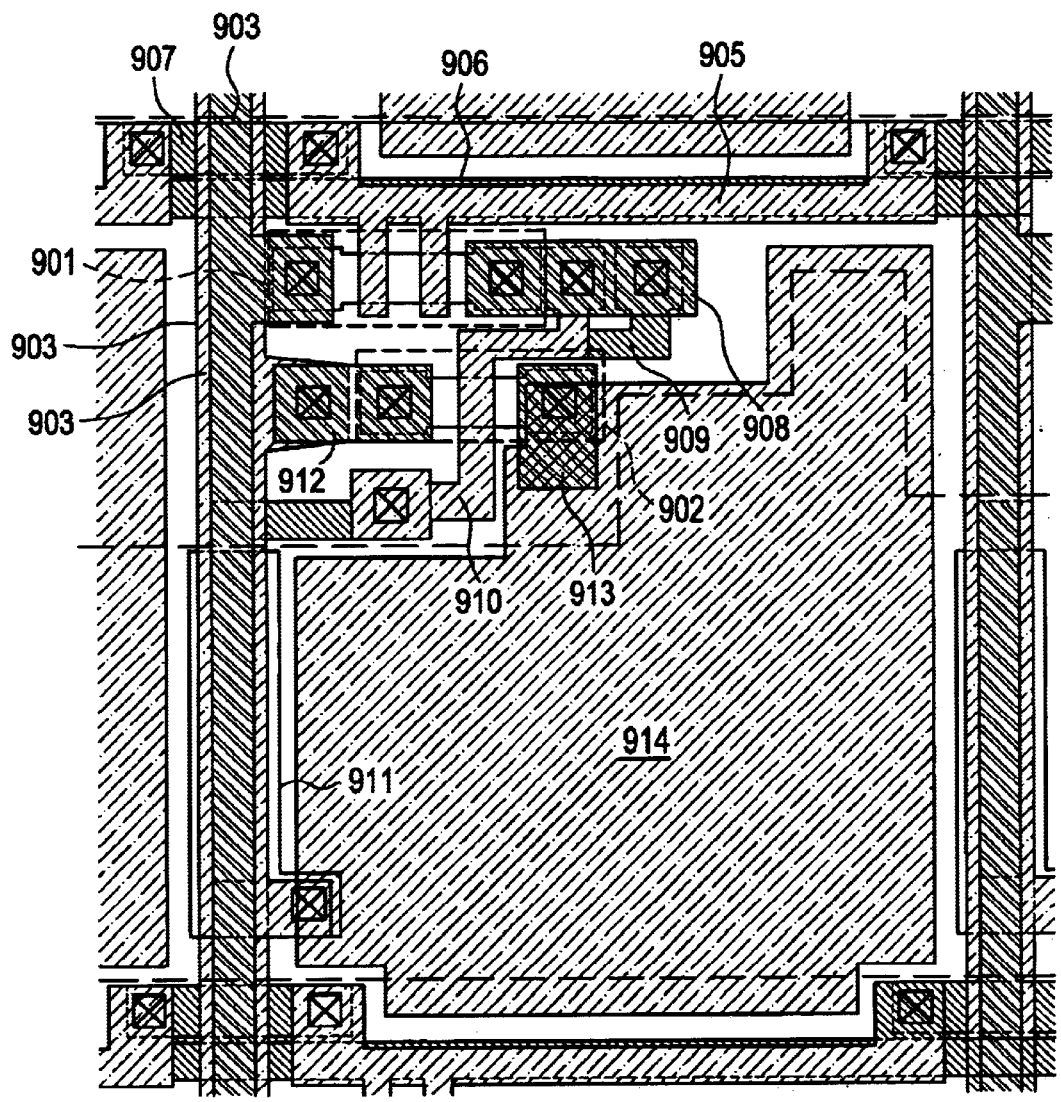
FIG. 32 is a top view for explaining the configuration of a pixel section in a luminous device.

FIG. 32 is a top view of the pixels of a luminous device in this embodiment.

Reference symbol 901 denotes an n-channel type TFT and 902 denote a p-channel type TFT. Reference symbol 903 denotes a source wiring, 904 denotes a power supply wiring, 905 denotes a gate wiring, 906 denotes a common wiring and 911 denotes a semiconductor film for capacitance.

In this embodiment, the power supply wiring 904 and the gate wiring 905 are simultaneously formed out of the same conductive film. In other words, the power supply wiring 904 and the gate wiring 905 are formed on the same layer. The gate wirings 905 of adjacent pixels are connected to each other through a connection wiring 907 which is formed on the same layer as that of the common wiring 906.

A part of the gate wiring 905 functions as the second electrode of the n-channel type TFT 901. A part of the common wiring 906 functions as the first electrode of the n-channel type TFT 901. The source and drain regions of the n-channel type TFT 901 are connected to the source wiring 903 and to the first electrode 909 and the second electrode 910 of the p-channel type TFT 902 through a connection wiring 908 which is formed on the same layer as that of the source wiring 903, respectively.

The source and drain regions of the p-channel type TFT 902 are connected to the source wiring 903 and to a pixel electrode 914 through a connection wiring 912 which is formed on the same layer as that of the source wiring 903, respectively.

The first electrode 909 is overlapped with the capacitance wiring 911 with a first insulating film (not shown) put therebetween. The capacitance wiring 911 is connected to the power supply wiring 904.

In this embodiment, by forming the source wiring and the power supply wiring on different layers, respectively, it is possible to overlap them with each other and, therefore, to increase an opening rate. The present invention is not limited to the configuration of this embodiment and the power supply wiring may be formed on a layer above the source wiring. Alternatively, one of the source and power supply wirings may be formed on the same layer as that of the common wiring.

In this embodiment, a common voltage is applied to the first electrode of the TFT (which corresponds to the n-channel type TFT 901 in this embodiment) which is used as a switching element among the TFT's in the same pixel. By applying the common voltage to the first electrode, it is possible to suppress threshold irregularity and to suppress OFF current compared with the TFT which includes only one electrode.

Further, on the TFT (which corresponds to the p-channel type TFT 902 in this embodiment) to which a higher current is carried than that of the TFT used as a switching element, the first electrode is electrically connected to the second electrode. By applying the same voltage to the first and second electrodes, the spread of a depletion layer is accelerated substantially as in the case of making the thickness of the semiconductor film thin. It is, therefore, possible to lower the sub-threshold coefficient and to improve the field effect mobility. It is thus possible to increase ON current compared with the TFT which includes one electrode. As a result, by using the TFT having this structure in the driving circuit, it is possible to decrease driving voltage. In addition, since ON current can be increased, it is possible to make the TFT smaller in size (channel width thereof can be particularly made smaller). It is thus possible to improve the integration density of the semiconductor device.

Embodiment 13

In the thirteenth embodiment, one example of a thin film transistor included in the semiconductor device according to the present invention will be described with reference to FIG. 33.

Figure 33:
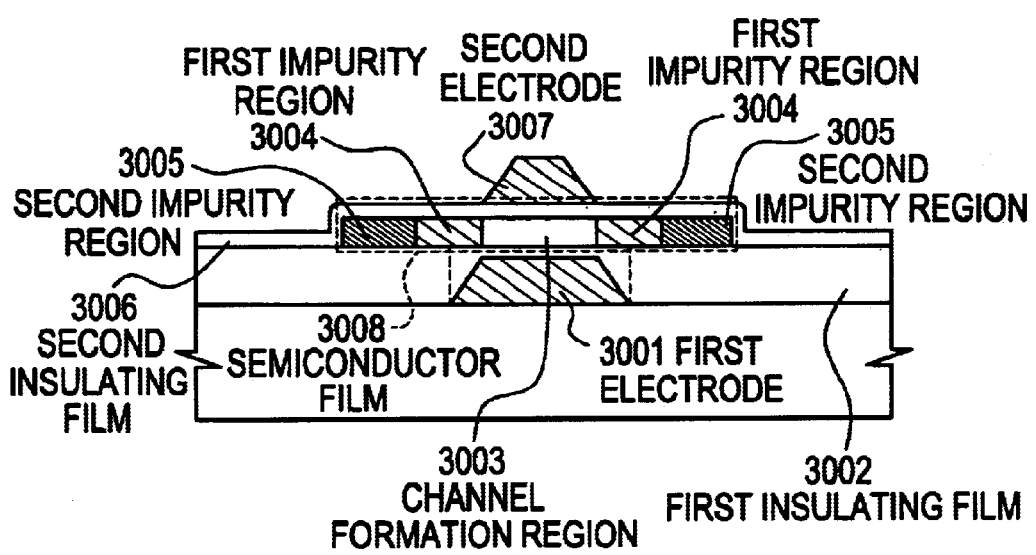
FIG. 33 is a cross-sectional view of the TFT according to the present invention.

FIG. 33 is a cross-sectional view of a thin film transistor in this embodiment The thin film transistor shown in FIG. 33 includes a first electrode 3001, a first insulating film 3002 which contacts with the first electrode 3001, a semiconductor film 3008 which contacts with the first insulating film 3002, a second insulating film 3006 which contacts with the semiconductor film 3008, and a second electrode 3007 which contacts with the second insulating film 3006. The semiconductor film 3008 includes a channel formation region 3003, a first impurity region 3004 which contacts with the channel formation region 3003, and a second impurity region 3005 which contacts with the first impurity region 3004.

One-conductive type impurities doped into the first impurity region 3004 are lower in concentration than one-conductive type impurities doped into the second impurity region 3005.

The first electrode 3001 is overlapped with the second electrode 3007 with the channel formation region 3003 put therebetween. In addition, the same voltage is applied to the first electrode 3001 and the second electrode 3007.

On the thin film transistor in this embodiment, the tapered sections of the first electrode 3001 are overlapped with the first impurity region 3004. The first electrode 3001 is almost flat in the section in which the first electrode 3001 is overlapped with the channel formation region 3003. According to the above-stated configuration, the first electrode 3001 and the channel formation region 3003 are overlapped with each other with almost a certain distance kept therebetween. In this state, if the thickness of the first insulating film in the section in which the first electrode 3001 is overlapped with the channel formation region 3003 is made almost equal to that of the second insulating film in the section in which the second electrode 3007 is overlapped with the channel formation region 3003, it is possible to further lower the S value.

This embodiment can be carried out freely in combination with the first to twelfth embodiments.

Embodiment 14

In the fourteenth embodiment, the measured values of drain current Id relative to the voltage difference (gate voltage Vgs) between a second electrode and a source region in the TFT which includes two electrodes according to the present invention, will be described. To this end, the measured values of the drain current Id when the potential of the first voltage is dropped to GND and when the first electrode is electrically connected to the second electrode are obtained, respectively. Further, for comparison purposes, the measure values of drain current Id relative to gate voltage with respect to a TFT which does not include a first electrode are obtained, as well.

Figure 37A:
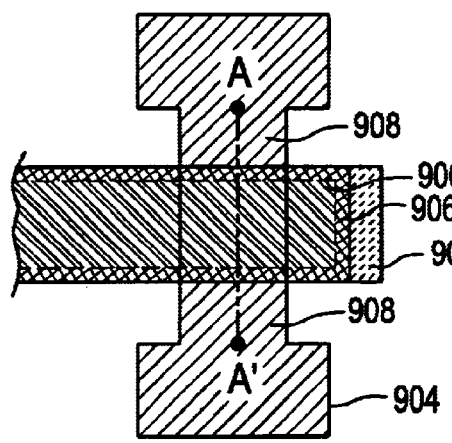
FIGS. 37A and 37B are a top view of the TFT according to the present invention for which the measured values are obtained as shown in FIG. 35 and a cross-sectional view thereof, respectively.
Figure 37B:
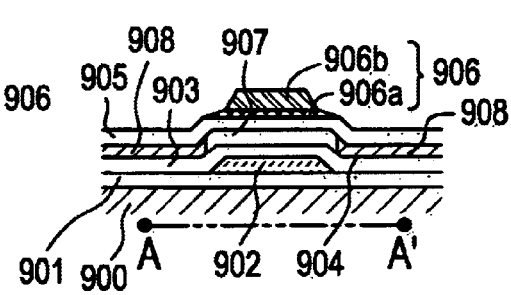
Figure 37A:
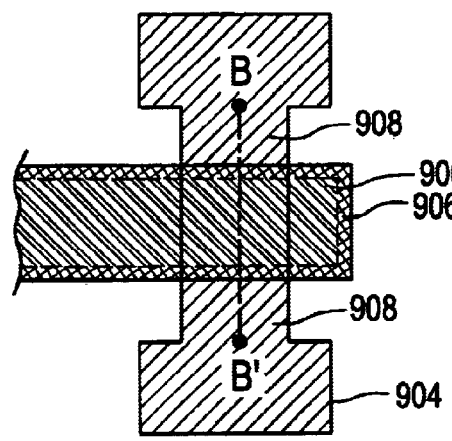
Figure 37D:
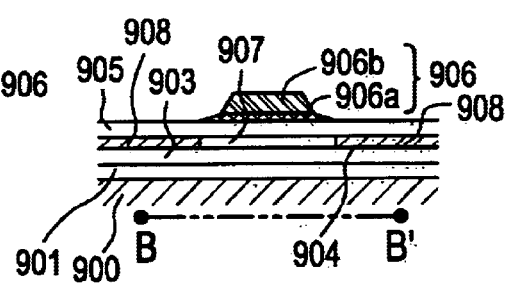

The concrete configurations of the TFT's employed in this embodiment are shown in FIGS. 37A to 37D, respectively. FIG. 37A is a top view of the TFT which includes two electrodes according to the present invention. FIG. 37B is a cross-sectional view taken along line. A–A' of FIG. 37A. FIG. 37C is a top view of the comparison TFT which includes only the second electrode. FIG. 37D is a cross-sectional view taken along line B–B' of FIG. 37C.

On the TFT shown in FIGS. 37A and 37B, a foundation film 901 which employs an SiNO film, is formed to have a thickness of 50 nm on a glass substrate 900. Tungsten (W) having a thickness of 100 nm is formed, as a first electrode 902, on the foundation film 901. A first insulating film 903, which functions as a gate insulating film, is formed on the foundation film 901 to cover the first electrode 902. The first insulating film 903 is formed out of an SiNO film having a thickness of 110 nm.

A semiconductor film 904 having a thickness of 54 nm is formed on the first insulating film 903. Next, a second insulating film 905 having a thickness of 115 nm is formed out of an SiNO film. A second electrode 906, which consists of two conductive films 906a and 906b, is formed on the second insulating film 905. In this embodiment, the second electrode 906 is formed by layering a TaN film having a thickness of 50 nm and a tungsten (W) film having a thickness of 370 nm. Further, the semiconductor film 904 is doped with impurities. The semiconductor film 904 includes a channel formation region 907 and impurity regions 908 between which the channel formation region 907 is interposed.

The TFT shown in FIGS. 37C and 37D differs from that shown in FIGS. 37A and 37B only in that the first electrode 902 is not provided.

Figure 34:
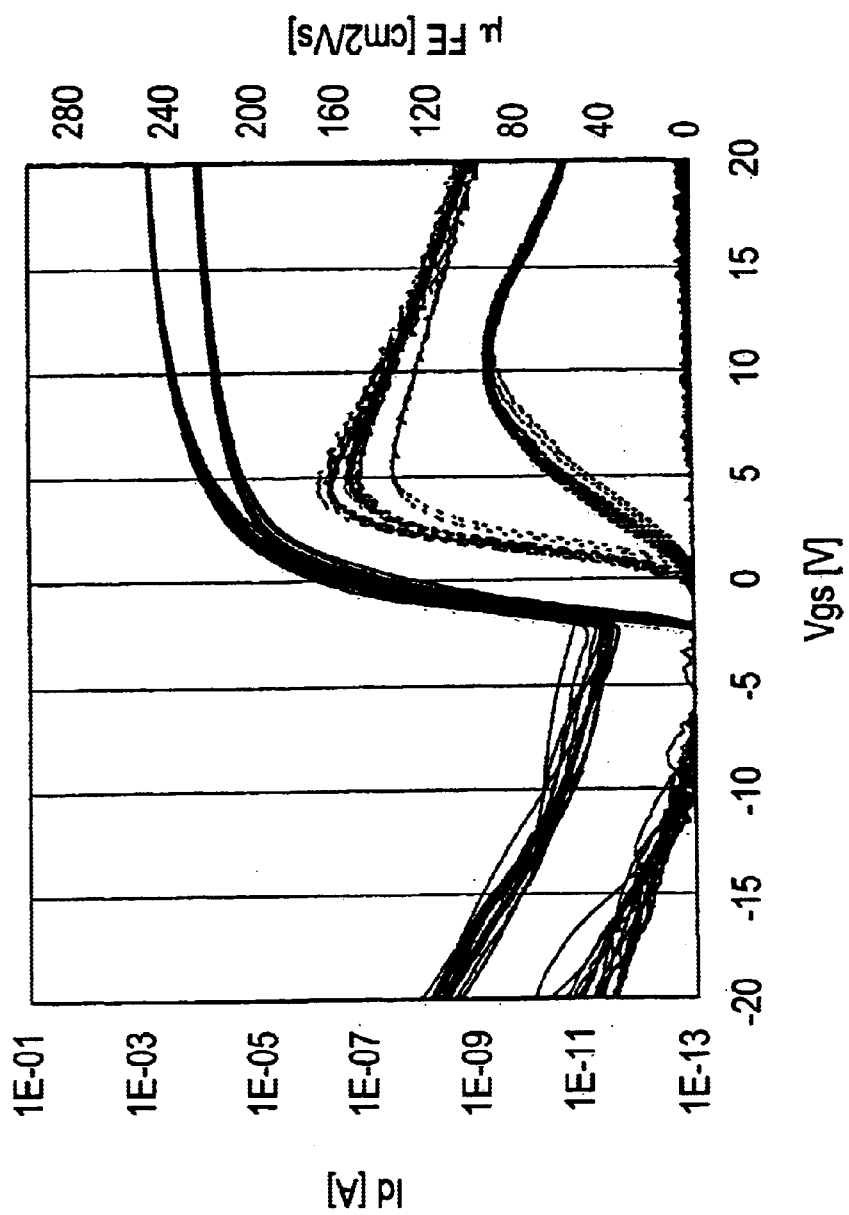
FIG. 34 is a graph showing the measured values of Id-Vgs characteristic of an ordinary TFT.
Figure 35:
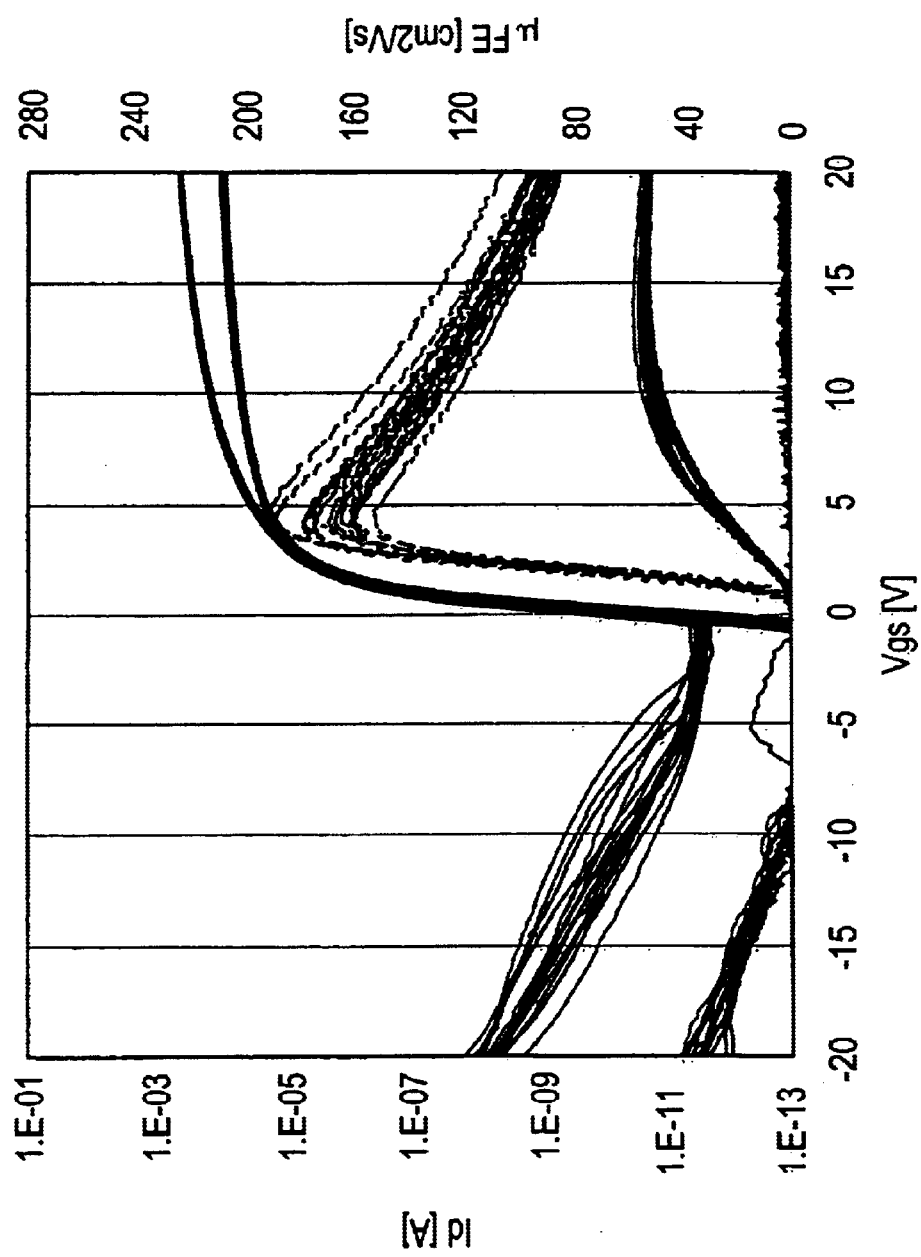
FIG. 35 is a graph showing the measured values of Id-Vgs characteristic of the TFT according to the present invention.
Figure 36:
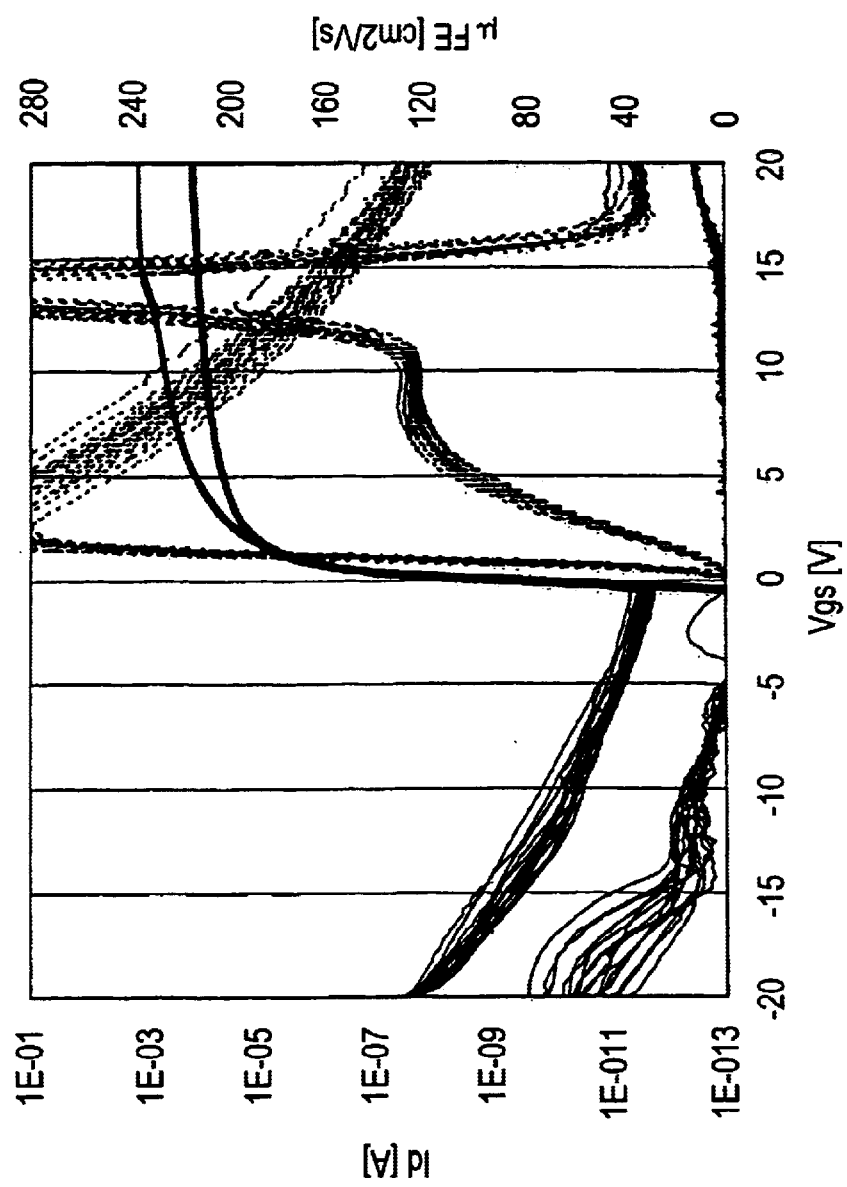
FIG. 36 is a graph showing the measured values of Id-Vgs characteristic of the TFT according to the present invention.

The measured values of drain current Id relative to the voltage difference (gate voltage Vgs) between the second electrode and the source region of the TFT shown in FIGS. 37C and 37D are shown in FIG. 34. The measured values of drain current Id relative to the voltage difference (gate voltage Vgs) between the second electrode and the source region of the TFT shown in FIGS. 37A and 37B when the potential of the first electrode 902 is dropped to GND, are shown in FIG. 35. In addition, the measured values of drain current Id relative to the voltage difference (gate voltage Vgs) between the second electrode and the source region of the TFT shown in FIGS. 37A and 37B when the first electrode 902 is electrically connected to the second electrode 906 are shown in FIG. 36. In each graph, a solid line indicates drain current Id and a broken line indicates mobility.

The comparison of FIGS. 34, 35 and 36 shows that the threshold of the TFT which includes the first voltage is close to 0 and the S value thereof is improved compared with the TFT which does not include the first electrode. Further, the comparison of FIGS. 35 and 36 shows that the ON current of the TFT when the first and second electrodes are electrically connected to each other is higher than the ON current of the TFT when the potential of the first electrode is dropped to the ground potential.

As described so far, according to the present invention, by applying the common voltage to the first electrode, it is possible to suppress threshold irregularity and to suppress OFF current compared with a TFT which includes-only one electrode.

Further, by applying the same voltage to the first and second electrodes, the formation of a depleted layer is accelerated substantially as in the case of making the semiconductor film of the TFT thin. It is, therefore, possible to lower the sub-threshold coefficient and also improve the field effect mobility of the TFT. Accordingly, compared with a TFT which includes only one electrode, the TFT can increase ON current. It is thereby possible to decrease driving voltage by using the TFT having this structure in the driving circuit. In addition, since ON current can be increased, the TFT can be made small in size (the channel width thereof can be particularly made small). It is thereby possible to improve the integration density of the TFT.

What is claimed is:

1. A semiconductor device employing a thin film transistor, the thin film transistor comprising:

a first electrode;

a first insulating film provided in contact with said first electrode;

a semiconductor film provided in contact with said first insulating film;

a channel formation region provided in said semiconductor film;

a second insulating film provided in contact with said semiconductor film; and a second electrode provided in contact with said second insulating film, wherein said first electrode is overlapped with said second electrode, with said channel formation region between said first and second electrodes, wherein irregularities of a surface of said first insulating film are not larger than 5 nm.

2. A device according to claim 1, wherein in case where said thin film transistor is an n channel type TFT, a constant voltage applied to said first electrode is lower than a threshold voltage of said thin film transistor.

3. A device according to claim 1, wherein in case where said thin film transistor is a p channel type TFT, a constant voltage applied to said first electrode is higher than a threshold voltage of said thin film transistor.

4. A device according to claim 1, wherein said first insulating film and said second insulating film are almost equal in dielectric constant, and a section of said first insulating film overlapped with said first electrode is almost equal in thickness to a section of said second insulating film overlapped with said second electrode.

5. A device according to claim 1, wherein when a thickness of said first insulating film in a section in which said channel formation region is overlapped with said first electrode is d1 and a thickness of said second insulating film in a section in which said channel formation region is overlapped with said second electrode is d2, then the thicknesses d1 and d2 satisfy $|d1-d2|/d1 \leq 0.1$ and $|d1-d2|/d2 \leq 0.1$.

6. A device according to claim 1, wherein when a thickness of said first insulating film in a section in which said channel formation region is overlapped with said first electrode is d1 and a thickness of said second insulating film in a section in which said channel formation region is overlapped with said second electrode is d2, then the thicknesses d1 and d2 satisfy $|d1-d2|/d1 \leq 0.05$ and $|d1-d2|/d2 \leq 0.05$.

7. A device according to claim 1, wherein said first insulating film is flattened by chemical-mechanical polishing.

8. A device according to claim 7, wherein a difference in height among irregularities on a surface of said flattened first insulating film is not more than 1 nm.

9. A device according to claim 7, wherein when a thickness of said flattened first insulating film in a section in which said channel formation region is overlapped with said first electrode is d1 and a thickness of said second insulating film in a section in which said channel formation region is overlapped with said second electrode is d2, then the thicknesses d1 and d2 satisfy $|d1-d2|/d1 \leq 0.1$ and $|d1-d2|/d2 \leq 0.1$.

10. A device according to claim 7, wherein when a thickness of said flattened first insulating film in a section in which said channel formation region is overlapped with said first electrode is d1 and a thickness of said second insulating film in a section in which said channel formation region is overlapped with said second electrode is d2, then the thicknesses d1 and d2 satisfy $|d1-d2|/d1 \leq 0.05$ and $|d1-d2|/d2 \leq 0.05$.

* * * * *